United States Patent
Hatano et al.

(10) Patent No.: US 12,200,358 B2
(45) Date of Patent: Jan. 14, 2025

(54) SOLID-STATE IMAGING DEVICE, METHOD FOR DRIVING THE SAME, AND ELECTRONIC DEVICE FOR IMPROVED AUTO-FOCUSING ACCURACY

(71) Applicant: SONY SEMICONDUCTOR SOLUTIONS CORPORATION, Kanagawa (JP)

(72) Inventors: Keisuke Hatano, Kanagawa (JP); Fumihiko Koga, Kanagawa (JP); Tetsuji Yamaguchi, Kanagawa (JP); Shinichiro Izawa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/531,208

(22) Filed: Dec. 6, 2023

(65) Prior Publication Data

US 2024/0107157 A1    Mar. 28, 2024

Related U.S. Application Data

(63) Continuation of application No. 18/182,735, filed on Mar. 13, 2023, now Pat. No. 11,882,359, which is a
(Continued)

(30) Foreign Application Priority Data

Sep. 10, 2014    (JP) .................. 2014-183885

(51) Int. Cl.
*H04N 23/663*        (2023.01)
*G02B 7/34*          (2021.01)
(Continued)

(52) U.S. Cl.
CPC ............. *H04N 23/663* (2023.01); *G02B 7/34* (2013.01); *H01L 27/14612* (2013.01);
(Continued)

(58) Field of Classification Search
CPC .. H04N 23/663; H04N 23/672; H04N 25/134; H04N 25/704; H04N 25/778;
(Continued)

(56) References Cited

U.S. PATENT DOCUMENTS

| | | |
|---|---|---|
| 5,965,875 A | 10/1999 | Merrill |
| 7,145,599 B2 | 12/2006 | Takeda |

(Continued)

FOREIGN PATENT DOCUMENTS

| | | |
|---|---|---|
| JP | 2002-082174 | 3/2002 |
| JP | 2005-268471 | 9/2005 |

(Continued)

OTHER PUBLICATIONS

International Search Report and Written Opinion for International (PCT) Patent Application No. PCT/JP2015/074134, dated Oct. 13, 2015, 13 pages.

(Continued)

*Primary Examiner* — Nicholas G Giles
(74) *Attorney, Agent, or Firm* — SHERIDAN ROSS P.C.

(57) ABSTRACT

The present disclosure relates to a solid-state imaging device, a method for driving the solid-state imaging device, and an electronic device capable of improving auto-focusing accuracy by using a phase difference signal obtained by using a photoelectric conversion film. The solid-state imaging device includes a pixel including a photoelectric conversion portion having a structure where a photoelectric conversion film is interposed by an upper electrode on the photoelectric conversion film and a lower electrode under the photoelectric conversion film. The upper electrode is divided into a first upper electrode and a second upper electrode. The present disclosure can be applied to, for example, a solid-state imaging device or the like.

20 Claims, 34 Drawing Sheets

Related U.S. Application Data continuation of application No. 17/370,482, filed on Jul. 8, 2021, now Pat. No. 11,632,494, which is a continuation of application No. 16/800,896, filed on Feb. 25, 2020, now Pat. No. 11,223,758, which is a continuation of application No. 16/201,583, filed on Nov. 27, 2018, now Pat. No. 10,616,515, which is a continuation of application No. 15/508,181, filed as application No. PCT/JP2015/074134 on Aug. 27, 2015, now Pat. No. 10,178,332.

(51) Int. Cl.

| | | |
|---|---|---|
| *H01L 27/146* | (2006.01) | |
| *H04N 23/67* | (2023.01) | |
| *H04N 25/13* | (2023.01) | |
| *H04N 25/704* | (2023.01) | |
| *H04N 25/778* | (2023.01) | |
| *H10K 39/00* | (2023.01) | |
| *H10K 39/32* | (2023.01) | |

(52) U.S. Cl.
CPC .. *H01L 27/14621* (2013.01); *H01L 27/14623* (2013.01); *H01L 27/14627* (2013.01); *H01L 27/14636* (2013.01); *H01L 27/1464* (2013.01); *H01L 27/14645* (2013.01); *H04N 23/672* (2023.01); *H04N 25/134* (2023.01); *H04N 25/704* (2023.01); *H04N 25/778* (2023.01); *H10K 39/32* (2023.02); *H10K 39/00* (2023.02)

(58) Field of Classification Search
CPC ............... G02B 7/34; H01L 27/14623; H01L 27/14627; H01L 27/14636; H01L 27/1464; H01L 27/14645; H01L 27/14; H01L 27/146
See application file for complete search history.

(56) References Cited

U.S. PATENT DOCUMENTS

| | | |
|---|---|---|
| 7,215,368 B2 | 5/2007 | Inoue |
| 7,629,997 B2 | 12/2009 | Inuiya |
| 8,294,797 B2 | 10/2012 | Choe et al. |
| 8,436,308 B2 | 5/2013 | Choe et al. |
| 8,896,732 B2 | 11/2014 | Sa et al. |
| 9,826,183 B2 | 11/2017 | Murata |
| 10,178,332 B2 | 1/2019 | Hatano et al. |
| 10,616,515 B2 | 4/2020 | Hatano et al. |
| 11,223,758 B2 | 1/2022 | Hatano et al. |
| 11,632,494 B2 | 4/2023 | Hatano et al. |
| 2002/0171881 A1 | 11/2002 | Merrill et al. |
| 2003/0193586 A1 | 10/2003 | Hayakawa |
| 2003/0193590 A1 | 10/2003 | Hirai |
| 2004/0100570 A1 | 5/2004 | Shizukuishi |
| 2004/0125222 A1 | 7/2004 | Bradski et al. |
| 2011/0109776 A1* | 5/2011 | Kawai ................... H04N 25/76 348/294 |
| 2013/0009263 A1 | 1/2013 | Hatano et al. |
| 2023/0217103 A1 | 7/2023 | Hatano et al. |

FOREIGN PATENT DOCUMENTS

| | | |
|---|---|---|
| JP | 2011-103335 | 5/2011 |
| JP | 2011-109514 | 6/2011 |
| JP | 2012-084816 | 4/2012 |
| JP | 2013-045907 | 3/2013 |
| JP | 2013-145292 | 7/2013 |
| WO | WO 2014/097899 | 6/2014 |
| WO | WO 2014/118868 | 8/2014 |

OTHER PUBLICATIONS

Official Action for U.S. Appl. No. 15/508,181, dated Mar. 21, 2018, 15 pages.
Notice of Allowance for U.S. Appl. No. 15/508,181, dated Aug. 28, 2018, 8 pages.
Official Action for U.S. Appl. No. 16/201,583, dated Jul. 17, 2019, 16 pages.
Notice of Allowance for U.S. Appl. No. 16/201,583, dated Nov. 25, 2019, 8 pages.
Official Action for U.S. Appl. No. 16/800,896, dated Apr. 20, 2021, 17 pages.
Notice of Allowance for U.S. Appl. No. 16/800,896, dated Sep. 2, 2021, 9 pages.
Official Action for U.S. Appl. No. 17/370,482, dated Aug. 17, 2022, 10 pages.
Notice of Allowance for U.S. Appl. No. 17/370,482, dated Dec. 6, 2022, 8 pages.
Official Action for U.S. Appl. No. 18/182,735, dated Jun. 28, 2023, 14 pages.
Notice of Allowance for U.S. Appl. No. 18/182,735, dated Sep. 14, 2023, 9 pages.

* cited by examiner

SOLID-STATE IMAGING DEVICE, METHOD FOR DRIVING THE SAME, AND ELECTRONIC DEVICE FOR IMPROVED AUTO-FOCUSING ACCURACY

CROSS-REFERENCE TO RELATED APPLICATIONS

This application is a continuation of U.S. patent application Ser. No. 18/182,735, filed Mar. 13, 2023, which is a continuation of U.S. patent application Ser. No. 17/370,482, filed Jul. 8, 2021, now U.S. Pat. No. 11,632,494, which is a continuation of U.S. patent application Ser. No. 16/800,896, filed Feb. 25, 2020, now U.S. Pat. No. 11,223,758, which is a continuation of U.S. patent application Ser. No. 16/201,583, filed Nov. 27, 2018, now U.S. Pat. No. 10,616,515, which is a continuation of U.S. patent application Ser. No. 15/508,181, filed Mar. 2, 2017, now U.S. Pat. No. 10,178,332, which claims the benefit of PCT Application No. PCT/JP2015/074134 having an international filing date of 27 Aug. 2015, which designated the United States, which PCT application claimed the benefit of Japanese Patent Application No. 2014-183885 filed 10 Sep. 2014, the disclosures of which are incorporated herein by reference in their entirety.

TECHNICAL FIELD

The present disclosure relates to a solid-state imaging device, a method for driving the solid-state imaging device, and an electronic device, and more particularly, to a solid-state imaging device, a method for driving the solid-state imaging device, and an electronic device capable of improving auto-focusing accuracy by using a phase difference signal obtained by using a photoelectric conversion film.

BACKGROUND ART

As a method of performing auto-focusing in an imaging device such as a digital camera, there is known a split-pupil phase difference detection method using a focus detection pixel of which sensitivity is asymmetry with respect to an incident angle of light. In addition, as a split-pupil phase difference detection method implemented by a solid-state imaging device, there is a technique disclosed in, for example, Patent Document 1. Patent Document 1 discloses a structure provided with a photodiode which acquires a signal for image generation by using a photoelectric conversion film provided above a silicon substrate and acquires a signal for phase difference detection in the silicon substrate.

CITATION LIST

Patent Document

Patent Document 1: Japanese Patent Application Laid-Open No. 2011-103335

SUMMARY OF THE INVENTION

Problems to be Solved by the Invention

However, in such a structure, since light incident on the photodiode is light which is not absorbed by the photoelectric conversion film but passes through the photoelectric conversion film, the intensity of the incident light is weak, and thus, sensitivity of light reception is low. For this reason, it is difficult to obtain high auto-focusing accuracy.

However, in such a structure, since light incident on the photodiode is light which is not absorbed by the photoelectric conversion film but passes through the photoelectric conversion film, the intensity of the incident light is weak, and thus, sensitivity of light reception is low. For this reason, it is difficult to obtain high auto-focusing accuracy.

The present disclosure is to improve auto-focusing accuracy by using a phase difference signal obtained by using a photoelectric conversion film.

A solid-state imaging device of a first aspect of the present disclosure includes a pixel including a photoelectric conversion portion having a structure where a photoelectric conversion film is interposed by an upper electrode on the photoelectric conversion film and a lower electrode under the photoelectric conversion film, wherein the upper electrode is divided into a first upper electrode and a second upper electrode.

A method for driving a solid-state imaging device of a second aspect of the present disclosure includes a pixel including a photoelectric conversion portion having a structure where a photoelectric conversion film is interposed by an upper electrode on the photoelectric conversion film and a lower electrode under the photoelectric conversion film, the upper electrode being divided into a first upper electrode and a second upper electrode, and the solid-state imaging device applies different voltages to the first upper electrode and the second upper electrode.

An electronic device of a third aspect of the present disclosure includes a solid-state imaging device including a pixel including a photoelectric conversion portion having a structure where a photoelectric conversion film is interposed by an upper electrode on the photoelectric conversion film and a lower electrode under the photoelectric conversion film, the upper electrode being divided into a first upper electrode and a second upper electrode.

Solutions to Problems

In a first to third aspects of the present disclosure, in a pixel including a photoelectric conversion portion having a structure where a photoelectric conversion film is interposed by an upper electrode on the photoelectric conversion film and a lower electrode under the photoelectric conversion film, the upper electrode is divided into a first upper electrode and a second upper electrode.

In a second aspect of the present disclosure, in a solid-state imaging device including a pixel including a photoelectric conversion portion having a structure where a photoelectric conversion film is interposed by an upper electrode on the photoelectric conversion film and a lower electrode under the photoelectric conversion film, the upper electrode being divided into a first upper electrode and a second upper electrode, different voltages are applied to the first upper electrode and the second upper electrode.

The solid-state imaging device and the electronic device may be independent devices or may be a module which is to be incorporated into other devices.

Effects of the Invention

According to the first to third aspects of the present disclosure, it is possible to improve auto-focusing accuracy by using a phase difference signal obtained by using a photoelectric conversion film.

In addition, the effects disclosed herein are not necessarily limited, but any one of the effects disclosed in the present disclosure may be obtained.

MODE FOR CARRYING OUT THE INVENTION

Hereinafter, modes (hereinafter, referred to as embodiments) for carrying out the present disclosure will be described. In addition, the description will be made in the following order.

1. First Embodiment of Solid-State Imaging Device
2. First Configuration Example of Pixel (configuration example where upper electrodes of phase difference pixels are divided)
3. Second Configuration Example of Pixel (configuration example where adjacent upper electrodes of phase difference pixels are continuous with each other)
4. Third Configuration Example of Pixel (configuration example where upper electrodes of normal pixels are also divided)
5. Fourth Configuration Example of Pixel (configuration example where lower electrodes of phase difference pixels are also divided)
6. Fifth Configuration Example of Pixel (upper electrodes and lower electrodes of entire pixels are divided)
7. Sixth Configuration Example of Pixel (configuration example where pixels have color filters)
8. Example of Application to Electronic Device
9. Second Embodiment of Solid-State Imaging Device
10. First Configuration Example of Pixel (configuration example where lower electrode is formed in one-side half)

11. Second Configuration Example of Pixel (configuration example where upper electrode and photoelectric conversion film are also formed in one-side half)
12. Third Configuration Example of Pixel (configuration example where unnecessary charges of photoelectric conversion portion for green are discharged)
13. Fourth Configuration Example of Pixel (configuration example where height of photoelectric conversion portion for green is changed)
14. Fifth Configuration Example of Pixel (configuration example where two photoelectric conversion portions are formed)
15. Arrangement Example of Phase Difference Pixel
16. Focus Control Process
17. Substrate Configuration Example of Solid-State Imaging Device 1. First Embodiment of Solid-State Imaging Device FIG. 1 is a block diagram illustrating a first embodiment of a solid-state imaging device according to the present disclosure.

Figure 1:
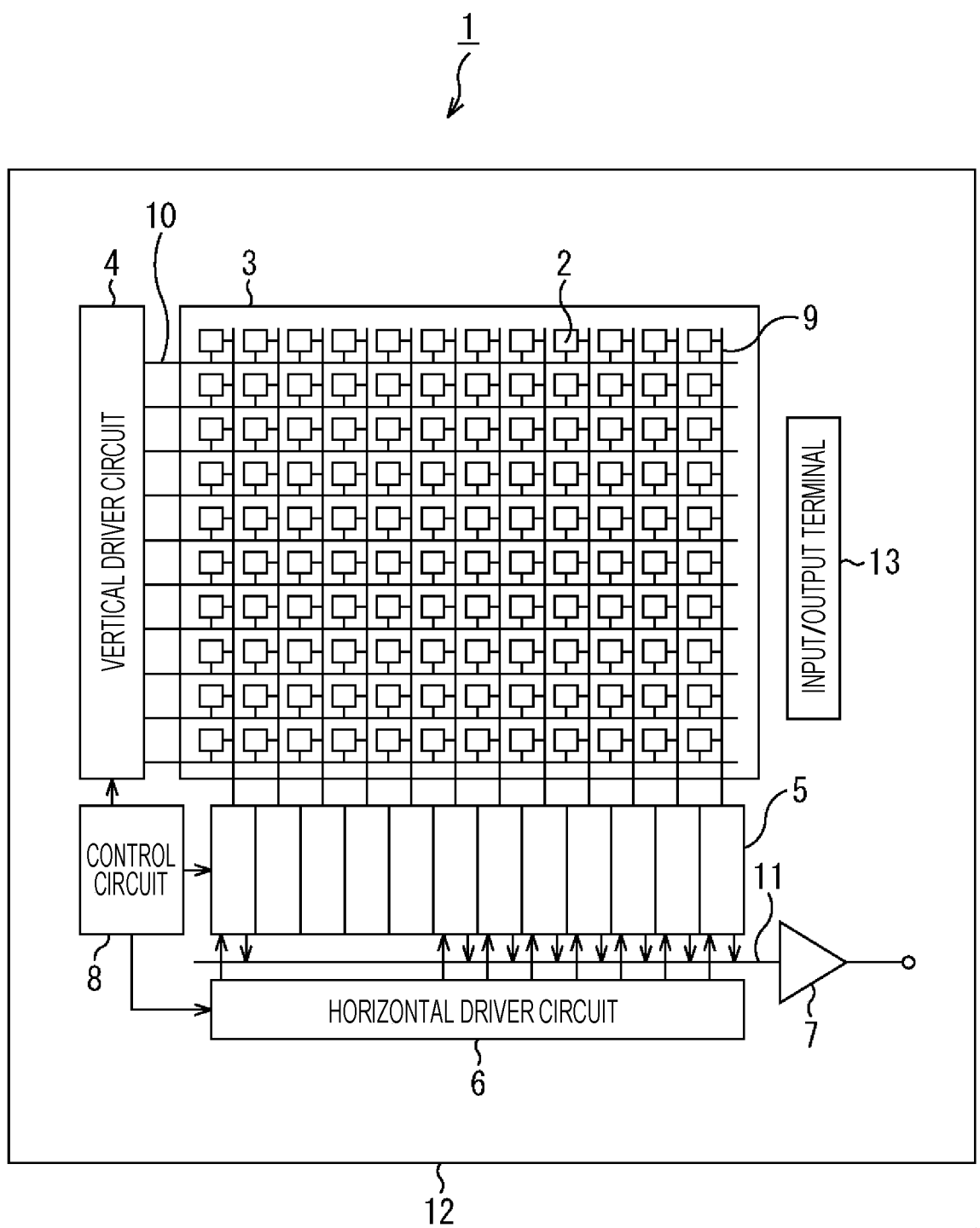
FIG. 1 is a block diagram illustrating a first embodiment of a solid-state imaging device according to the present disclosure.

A solid-state imaging device 1 of FIG. 1 is configured to include a pixel array portion 3 where pixels 2 are two-dimensionally arranged in a matrix shape on a semiconductor substrate 12 using a semiconductor such as silicon (Si) and a peripheral circuit portion in the periphery of the pixel array portion 3. The peripheral circuit portion includes a vertical driver circuit 4, a column signal processing circuit 5, a horizontal driver circuit 6, an output circuit 7, a control circuit 8, and the like.

The pixels 2 generate pixel signals according to a light amount of incident light and output the pixel signals. As described later with reference to FIG. 2 and the like, the pixels 2 include normal pixels 2X generating a signal for image generation and phase difference pixels 2P generating a signal for focus detection, and at least a portion of the pixels 2 in the pixel array portion 3 become the phase difference pixels 2P. In addition, hereinafter, the signal for image generation output from the normal pixel 2X is referred to as an image signal, and the signal for focus detection output from the phase difference pixel 2P is referred to as a phase difference signal.

The pixel 2 is configured to include a photoelectric conversion portion using a photodiode or a photoelectric conversion film and a plurality of pixel transistors (so-called MOS transistors). The plurality of pixel transistors are configured with, for example, four MOS transistors of a transfer transistor, a selection transistor, a reset transistor, and an amplification transistor.

In addition, the pixel 2 may also be configured with a shared pixel structure. The shared pixel structure is configured with a plurality of photoelectric conversion portions, a plurality of transfer transistors, one shared floating diffusion region, and each shared one of other pixel transistors. Namely, in the shared pixel structure, the photoelectric conversion portions and the transfer transistors constituting a plurality of unit pixels are configured to share each one of other pixel transistors.

The control circuit 8 receives an input clock and data instructing an operation mode or the like and outputs data such as internal information of the solid-state imaging device 1. Namely, the control circuit 8 generates a clock signal or a control signal used as a reference of operations of the vertical driver circuit 4, the column signal processing circuit 5, the horizontal driver circuit 6, and the like on the basis of a vertical synchronization signal, a horizontal synchronization signal, and a master clock. The control circuit 8 then outputs the generated clock signal or control signal to the vertical driver circuit 4, the column signal processing circuit 5, the horizontal driver circuit 6, and the like.

The vertical driver circuit 4 is configured with, for example, shift registers to select a pixel driving wire line 10, supply a pulse for driving the pixels 2 to the selected pixel driving wire line 10, and drive the pixels 2 in unit of a row. Namely, the vertical driver circuit 4 selectively scans each pixel 2 of the pixel array portion 3 in unit of a row sequentially in the vertical direction and supplies the pixel signal based on signal charges generated according to a light reception amount of the photoelectric conversion portion of each pixel 2 through a vertical signal line 9 to the column signal processing circuit 5.

The column signal processing circuit 5 is arranged for every column of the pixels 2 and performs a signal process such as noise removal for every pixel column on the signals output from the pixels 2 of one row. For example, the column signal processing circuit 5 performs signal processes such as correlated double sampling (CDS) for removing fixed pattern noise specific to the pixel and AD conversion.

The horizontal driver circuit 6 is configured with, for example, shift registers and sequentially outputs horizontal scan pulses to sequentially select each column signal processing circuit 5 to allow each column signal processing circuit 5 to output the pixel signal to a horizontal signal line 11.

The output circuit 7 performs a signal process on the signals sequentially supplied through the horizontal signal line 11 from each column signal processing circuit 5 and outputs the signals. In some cases, the output circuit 7 may perform, for example, only buffering, or in other cases, the output circuit may perform various digital signal processes such as black level adjustment and column variation correction. An input/output terminal 13 exchanges signals with the outsides.

The solid-state imaging device 1 having the above-described configuration is a CMOS image sensor referred to as a column AD method where column signal processing circuits 5 performing a CDS process and an AD conversion process are arranged for every pixel column.

2. First Configuration Example of Pixel
2.1 Cross-Sectional Structure Diagram of Pixel A first configuration example of the pixel 2 of the solid-state imaging device 1 according to the first embodiment will be described with reference to FIG. 2.

Figure 2:
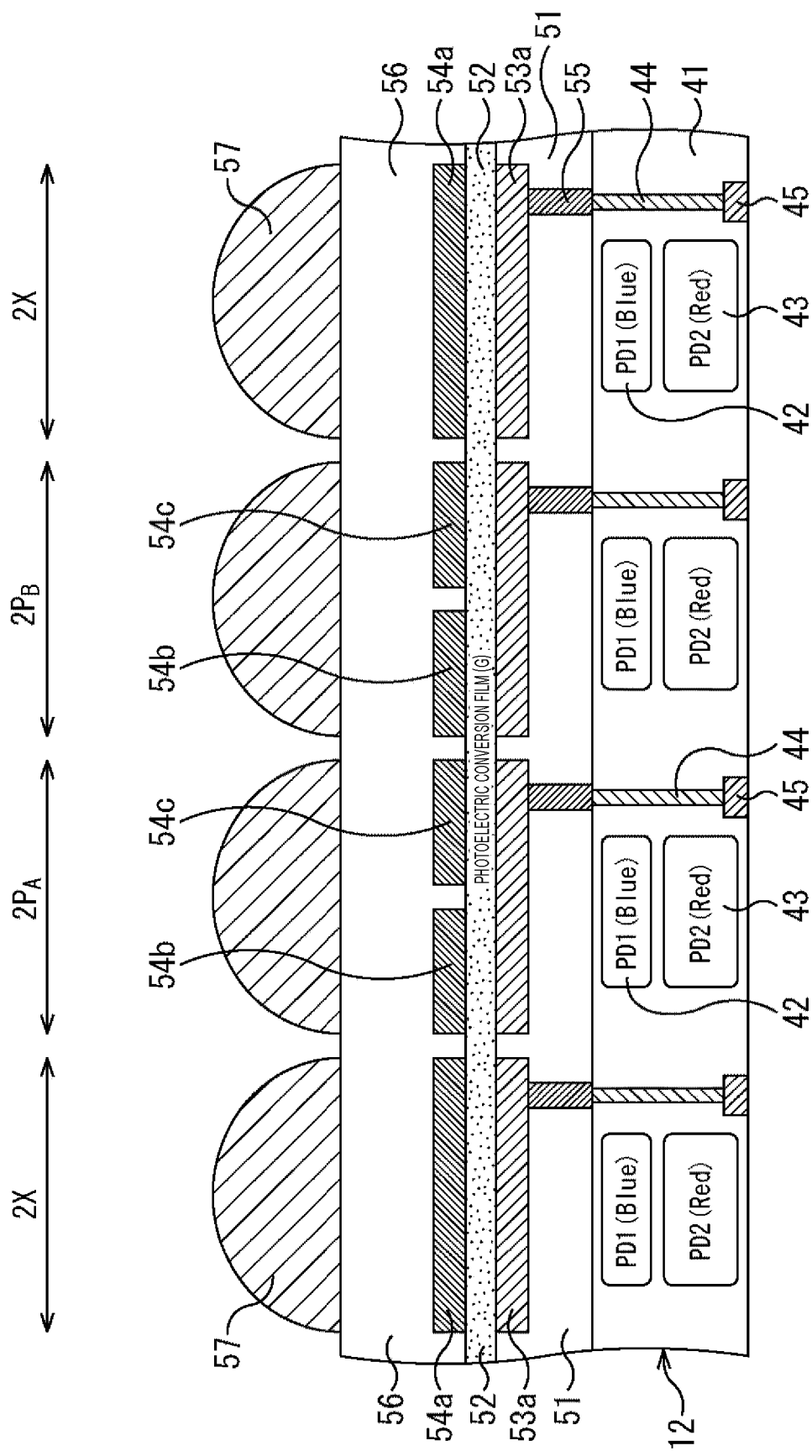
FIG. 2 is a cross-sectional structure diagram illustrating a first configuration example of a pixel in the first embodiment.

FIG. 2 illustrates a cross-sectional structure of four pixels 2 including two normal pixels 2X and two phase difference pixels 2P.

The normal pixel 2X is a pixel which can output only an image signal. On the other hand, the phase difference pixel 2P is a pixel which can output a phase difference signal for focus detection as well as the image signal. In addition, since the phase difference pixels 2P are arranged as a pair of pixels comparing phase difference in the pixel array portion 3, in FIG. 2, the pair of pixels is illustrated as phase difference pixels 2PA and 2PB.

In addition, in FIG. 2, for the convenience, in the order from the left side, the normal pixel 2X, the phase difference pixel 2PA, the phase difference pixel 2PB, and the normal pixel 2X are arranged to be aligned in this order. However, the arrangement of the pixels 2 in the pixel array portion 3 may be arbitrarily determined, and the arrangement is not limited to this example.

In the description of FIG. 2, first, the pixel structure of the normal pixel 2X will be described, and after that, with respect to the phase difference pixel 2PA and the phase difference pixel 2PB, only the portions different from those of the normal pixel 2X will be described.

The pixel structure of the normal pixel 2X is described.

By stacking second conductive type (for example, N type) semiconductor regions 42 and 43 in the depth direction in a first conductive type (for example, p type) semiconductor region 41 of the semiconductor substrate 12, photodiodes PD1 and PD2 are formed in the depth direction by PN junction. The photodiode PD1 having the semiconductor region 42 as a charge storage region is a photoelectric conversion portion which receives and photoelectrically converts blue light and, and the photodiode PD2 having the semiconductor region 43 as a charge storage region is a photoelectric conversion portion which receives and photoelectrically converts red light.

In the front surface side (lower side in the figure) of the semiconductor substrate 12, a plurality of pixel transistors performing reading or the like of charges stored in the photodiodes PD1 and PD2 and a multi-layered wire line layer including a plurality of wire line layers and interlayer insulating films are formed. However, these components are omitted in illustration of FIG. 2.

In the semiconductor substrate 12, conductive plugs 44 for extracting charges photoelectrically converted by the later-described photoelectric conversion film 52 to the substrate front surface side (lower side in the figure) are formed to penetrate the semiconductor substrate 12 (semiconductor region 41 thereof). In addition, although not illustrated, outer circumferences of the conductive plug 44 are insulated by an insulating film of SiO2, SiN, or the like.

The conductive plug 44 is connected to a charge retaining portion 45 formed by the second conductive type (for example, N type) semiconductor region in the semiconductor region 41. The charge retaining portion 45 temporarily retains the charges photoelectrically converted by the photoelectric conversion film 52 until the charges are read.

On the interface of the back surface side (upper side in the figure) of the semiconductor substrate 12, for example, a transparent insulating film 51 configured with two-layered or three-layered film of a hafnium oxide (HfO2) film or a silicon oxide film is formed.

Above the transparent insulating film 51, the photoelectric conversion film 52 is arranged in a form to be interposed by a lower electrode 53a in the lower side thereof and an upper electrode 54a in the upper side thereof. The photoelectric conversion film 52, the lower electrode 53a, and the upper electrode 54a constitute a photoelectric conversion portion. The photoelectric conversion film 52 is a film photoelectrically converting green wavelength light and is formed with, for example, an organic photoelectric conversion material including a rhodamine based dye, a melacyanine based dye, quinacridone, and the like. The lower electrode 53a and the upper electrode 54a are formed with, for example, a transparent electrode film such as an indium tin oxide (ITO) film or an indium zinc oxide film.

In addition, in the case of having the photoelectric conversion film 52 as a film photoelectrically converting red wavelength light, for example, an organic photoelectric conversion material including a phthalocyanine based dye may be used. In addition, in the case of having the photoelectric conversion film 52 as a film photoelectrically converting blue wavelength light, an organic photoelectric conversion material including a coumarin based dye, tris-8-hydrioxyquinoline Al (Alq3), a melacyanine based dye, and the like may be used.

Both of the lower electrode 53a and the upper electrode 54a in the normal pixel 2X are formed in unit of a pixel. The lower electrode 53a is connected to the conductive plug 44 of the semiconductor substrate 12 by a metal wire line 55 penetrating the transparent insulating film 51. The metal wire line 55 is formed with, for example, a material such as tungsten (W), aluminum (Al), or copper (Cu).

On the upper electrode 54a, a high refractive index layer 56 is formed by using an inorganic film such as a silicon nitride film (SiN), a silicon oxynitride film (SiON), and a silicon carbide (SiC) film. In addition, on the high refractive index layer 56, on-chip lenses 57 are formed. As a material of the on-chip lens 57, for example, a silicon nitride film (SiN) or a resin based material of a styrene based resin, an acrylic resin, a styrene-acrylic copolymer resin, a siloxane based resin, or the like is used. In the pixel structure, since the distance between the photoelectric conversion film 52 and the on-chip lens 57 becomes small, the phase difference pixels 2PA and 2PB are hard to have dependency on the light incident angle. Therefore, in the high refractive index layer 56, the refraction angle is increased, and thus, there is an effect of increasing light collection efficiency. The high refractive index layer 56 and the on-chip lens 57 may be formed with the same material.

The normal pixels 2X have the configuration described heretofore.

Therefore, the solid-state imaging device 1 where the above-described normal pixels 2X are two-dimensionally arranged is a back-illuminated type CMOS solid-state imaging device where light is incident from the back surface side opposite to the front surface side of the semiconductor substrate 12 where the pixel transistors are formed.

In addition, the solid-state imaging device 1 is a vertical spectroscopic solid-state imaging device where green light is photoelectrically converted by the photoelectric conversion film 52 formed outside the semiconductor substrate (silicon layer) 12 and blue light and red light are photoelectrically converted by the photodiodes PD1 and PD2 in the semiconductor substrate 12.

Next, the pixel structure of the phase difference pixel 2P (2PA and 2PB) will be described. In addition, in the description of the pixel structure of the phase difference pixel 2P, only the portions different from those of the normal pixel 2X will be described.

The phase difference pixel 2P is different from the normal pixel 2X in terms that the upper electrode 54a is formed in unit of pixel in the normal pixel 2X and two divided upper electrodes of the first upper electrode 54b and the second upper electrode 54c are formed in the phase difference pixel. The other structures of the phase difference pixel 2P are similar to those of the normal pixel 2X.

In addition, hereinafter, if there is no need to distinguish the upper electrode 54a, the first upper electrode 54b, and the second upper electrode 54c, each of the upper electrodes is simply referred to as an upper electrode 54.

Figure 3:
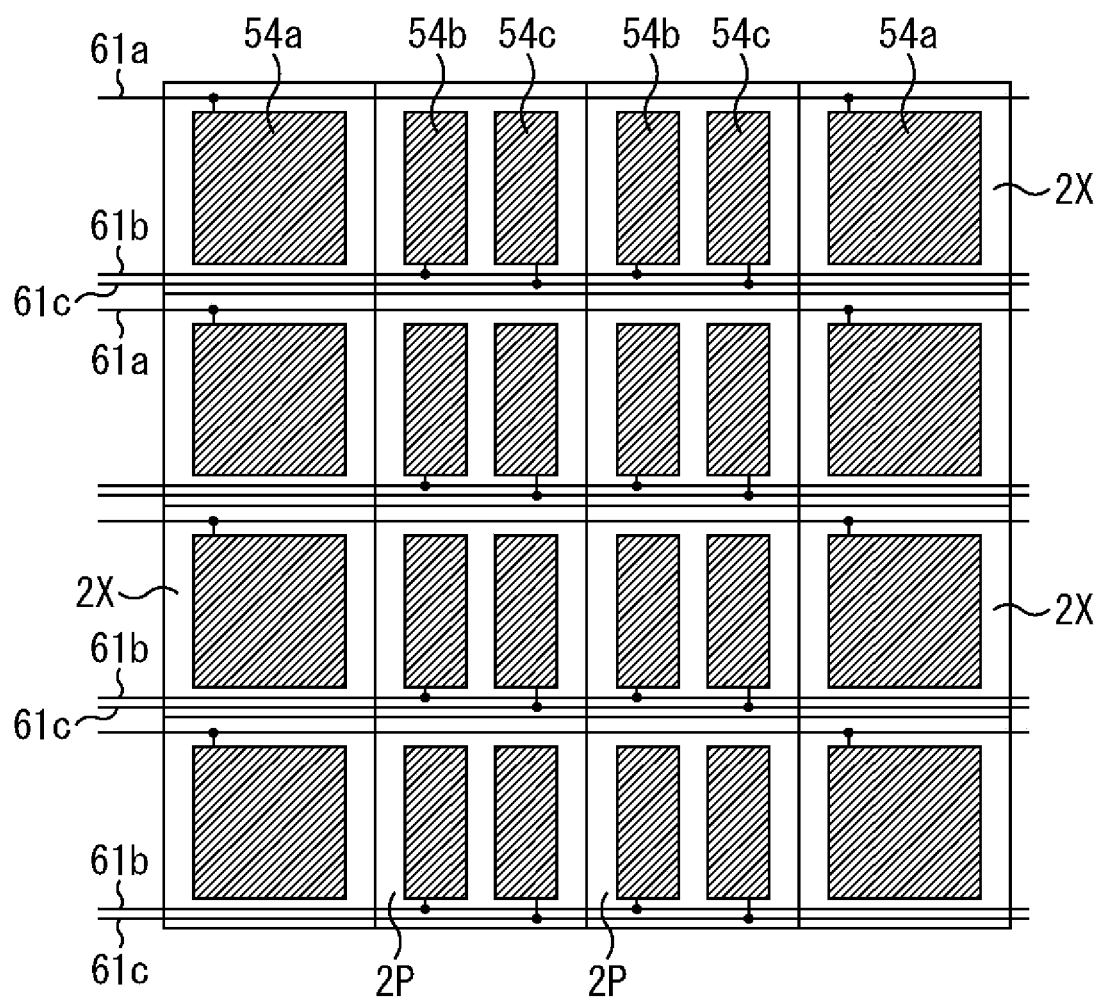
FIG. 3 is a plan view illustrating a planar shape of an upper electrode.

FIG. 3 is a plan view illustrating a planar shape of the upper electrode 54.

As illustrated in FIG. 3, the upper electrode 54a of the normal pixel 2X is formed to be one rectangular region in the pixel, and the upper electrodes in the phase difference pixel 2P are formed to be two upper electrodes of the first upper electrode 54b and the second upper electrode 54c divided in the horizontal direction (left-right direction of the paper).

As illustrated in FIG. 3, the upper electrode 54a, the first upper electrode 54b, and the second upper electrode 54c are connected with respective control wire lines 61 for applying predetermined bias voltages. Specifically, the upper electrode 54a is connected with a control wire line 61a for applying a predetermined bias voltage, the first upper electrode 54b is connected with a control wire line 61b for applying a predetermined bias voltage, and the second upper electrode 54c is connected with a control wire line 61c for applying a predetermined bias voltage. Therefore, since the first upper electrode 54b and the second upper electrode 54c are each provided with the control wire line 61, the control wire line 61 can apply different bias voltages to the first upper electrode 54b and the second upper electrode 54c in the same pixel.

The wire line positions of the control wire lines 61 and the contact positions between the control wire lines 61 and the upper electrodes 54 are defined so as not to prevent photoelectric conversion of the photoelectric conversion film 52 if possible, in other words, so as not to prevent light from being incident on the photoelectric conversion film 52.

Figure 4:
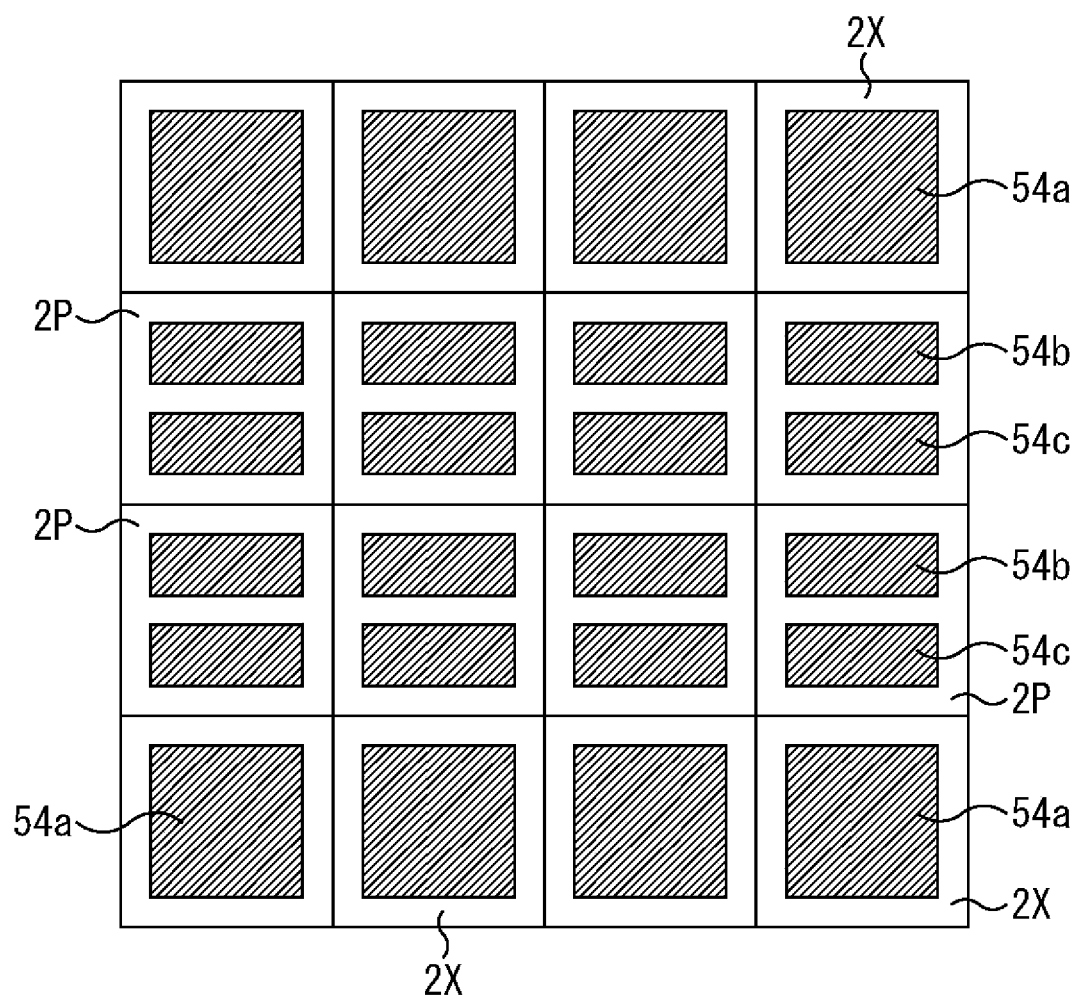
FIG. 4 is a plan view illustrating another planar shape of the upper electrode.

In addition, in the example of FIG. 3, in the phase difference pixel 2P, the first upper electrode 54b and the second upper electrode 54c are formed as two upper electrodes divided in the horizontal direction (left-right direction of the paper). However, as illustrated in FIG. 4, the first upper electrode and the second upper electrode may be formed as two upper electrodes divided in the vertical direction (up-down direction of the paper). In addition, as illustrated in FIG. 5, the first upper electrode and the second upper electrode may be formed as two upper electrodes divided in the diagonal direction (oblique direction of the paper).

Although the upper electrodes 54a of the normal pixels 2X are formed to be separated for every pixel, there is no need to separate the upper electrodes for every pixel, but the upper electrodes may be formed to be continuous with those of the adjacent normal pixels 2X. Since the photoelectric conversion region of the photoelectric conversion film 52 becomes a region interposed by the upper electrode 54a and the lower electrode 53a and the lower electrodes 53a are separated in unit of a pixel, there is no problem even in a case where the upper electrodes are formed to be continuous with those of the adjacent normal pixels 2X.

Figure 5:
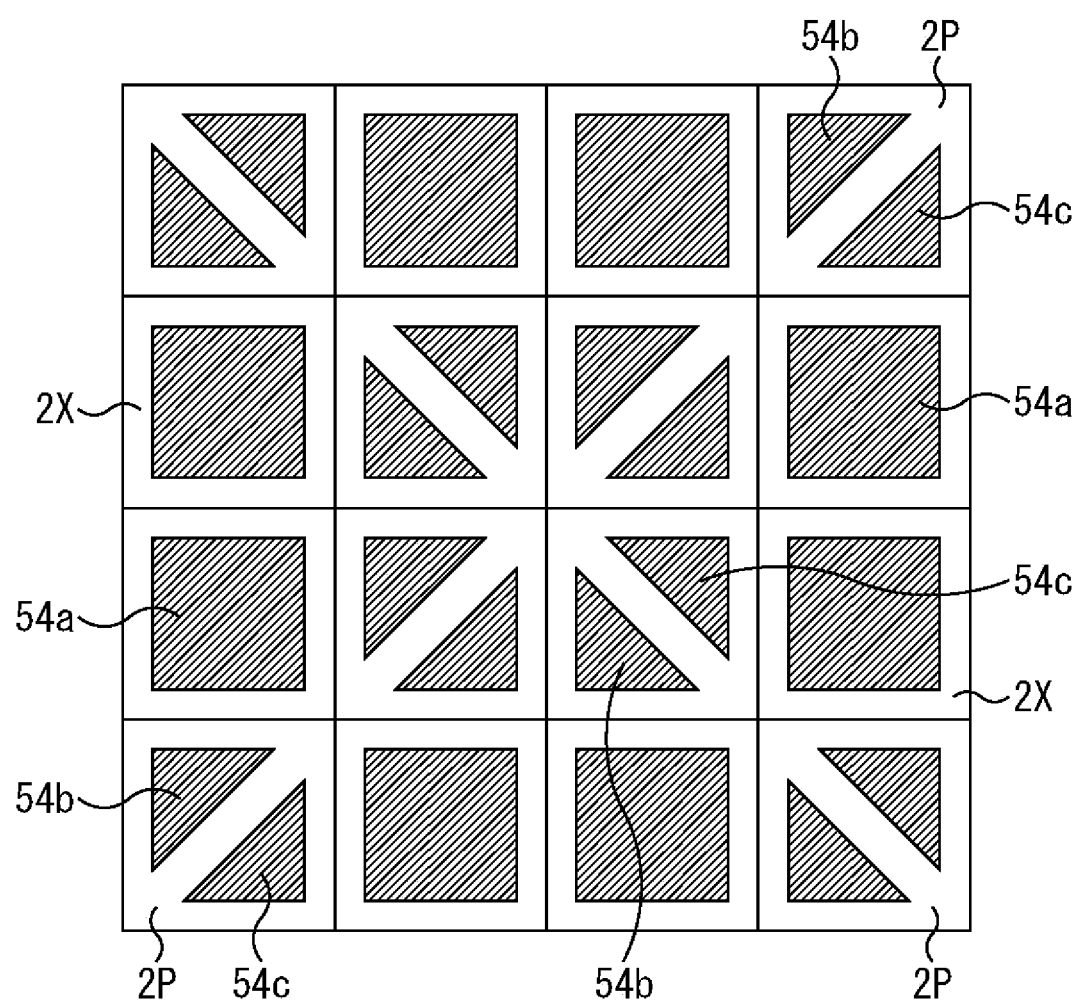
FIG. 5 is a plan view illustrating still another planar shape of the upper electrode.

In FIGS. 4 and 5, the control wire line 61 is omitted. However, the control wire line 61 may be arranged so that the upper electrode 54a, the first upper electrode 54b, and the second upper electrode 54c can be independently controlled.

In addition, in FIGS. 3 to 5, the phase difference pixels 2P including the first upper electrode 54b and the second upper electrode 54c are arranged to be aligned in a certain direction such as the vertical direction, the horizontal direction, or the diagonal direction. However, the phase difference pixels 2P may be arranged at random inside the pixel array portion 3. In addition, inside the pixel array portion 3, the phase difference pixels 2P where the first upper electrode 54b and the second upper electrode 54c are divided in the horizontal direction, the phase difference pixels 2P where the first upper electrode 54b and the second upper electrode 54c are divided in the vertical direction, and the phase difference pixels 2P where the first upper electrode 54b and the second upper electrode 54c are divided in the diagonal direction may be arranged to be mixed.

Namely, in the present disclosure, the arrangement of the phase difference pixels 2P and the arrangement and shape of the first upper electrode 54b and the second upper electrode 54c inside the phase difference pixel 2P are not limited, and inside the phase difference pixel 2P, the region of the first upper electrode 54b and the region of the second upper electrode 54c are asymmetric with respect to the optical axis of the incident light, and the first upper electrode 54b of the phase difference pixel 2PA and the second upper electrode 54c of the phase difference pixel 2PB constituting a pair of pixels may be arranged to be symmetric with each other.

In the signal obtained from the region of the first upper electrode 54b of the phase difference pixel 2PA and the signal obtained from the region of the second upper electrode 54c of the phase difference pixel 2PB, due to the difference of the formation positions of the upper electrodes 54, a deviation of the image occurs. A defocus amount is calculated by calculating a phase shift amount from the deviation of the image, and the image forming lens is adjusted (moved), so that it is possible to achieve auto-focusing.

In addition, in a case where the first upper electrode 54b and the second upper electrode 54c in one phase difference pixel 2P are arranged to be symmetric with each other, one set of phase difference signals can be acquired from only one phase difference pixel 2P.

In addition, in the pixel structure illustrated in FIG. 2, the photoelectric conversion film 52 uses the G signal output from the phase difference pixel 2P as the signal for focus detection in order to photoelectrically convert the green light, and it is possible to arbitrarily select which color light to be photoelectrically converted by the photoelectric conversion film 52. Namely, in the vertical spectroscopic solid-state imaging device, it is possible to appropriately determine which color light to be photoelectrically converted by the photoelectric conversion film 52 formed outside the semiconductor substrate 12 and which color light to be photoelectrically converted by the photodiodes PD1 and PD2 in the semiconductor substrate 12.

2.2 First Driving Method in Phase Difference Signal Acquisition Period

Next, a first driving method of acquiring the phase difference signal in the pixel 2 according to the first configuration example will be described with reference to FIG. 6.

Figure 6:
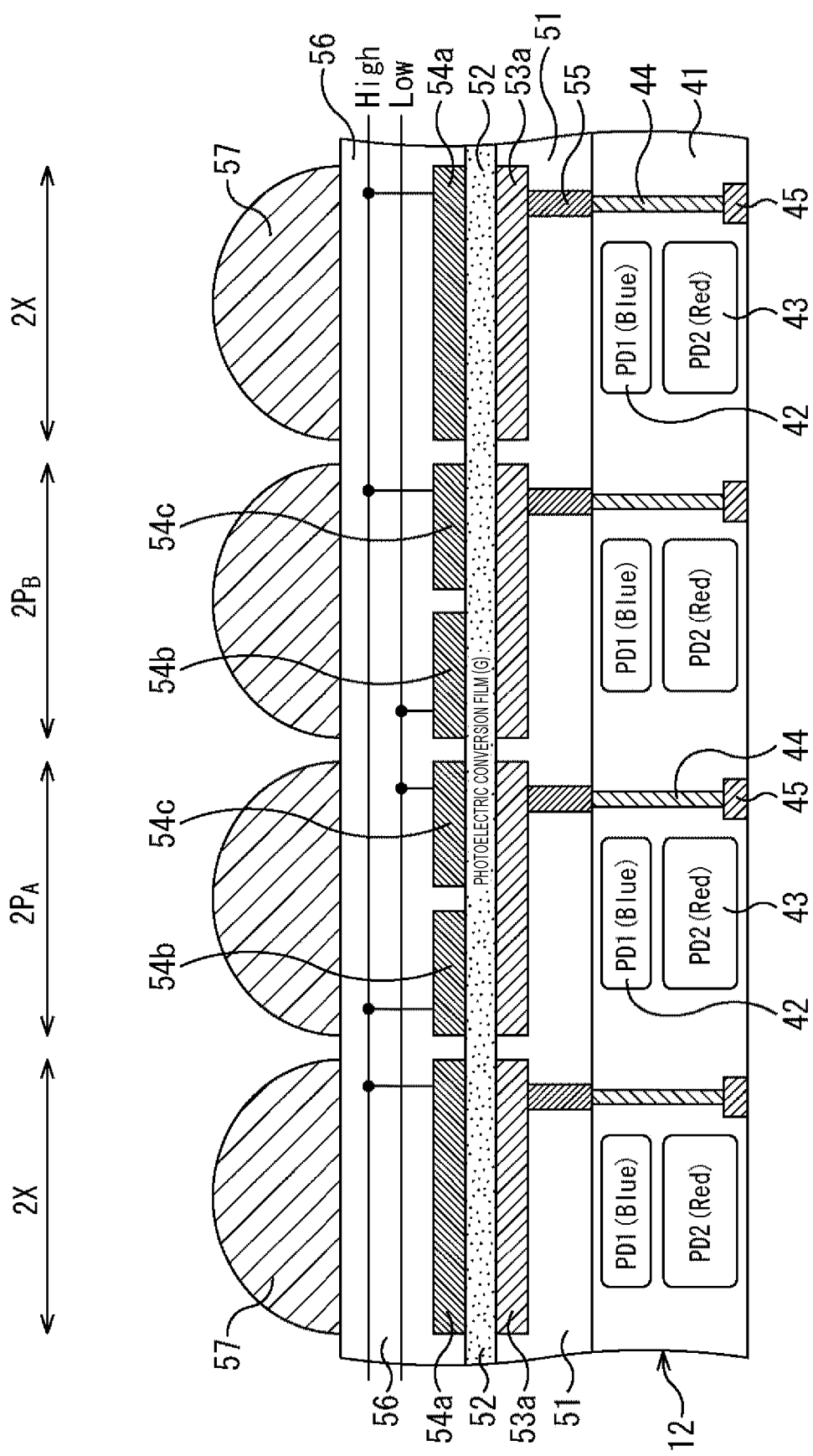
FIG. 6 is a diagram describing a first driving method of acquiring a phase difference signal in the first configuration example.

FIG. 6 is a diagram illustrating a method of setting a bias voltage to the upper electrode 54 of each pixel 2 in the case of acquiring the phase difference signal.

In the case of acquiring the phase difference signal, as illustrated in FIG. 6, in the phase difference pixel 2PA of the phase difference pixels 2PA and 2PB constituting a pair of pixels, a high bias voltage is applied to the first upper electrode 54b, and a low bias voltage is applied to the second upper electrode 54c.

On the other hand, in the phase difference pixel 2PB of the phase difference pixels 2PA and 2PB constituting a pair of pixels, a low bias voltage is applied to the first upper electrode 54b, and a high bias voltage is applied to the second upper electrode 54c.

In a case where a high bias voltage is applied to the upper electrode 54, charges are generated according to the light incident on the region (photoelectric conversion region) of the photoelectric conversion film 52 interposed by the upper electrode 54 and the lower electrode 53a. On the other hand, in a case where a low bias voltage is applied to the upper electrode 54, although light is incident on the photoelectric conversion film 52, no charge is generated.

Therefore, in the phase difference pixel 2PA, a signal (hereinafter, referred to as a left opening signal) obtained by photoelectric conversion in the left-half photoelectric conversion region in the pixel can be acquired, and in the phase difference pixel 2PB, a signal (hereinafter, referred to as a right opening signal) obtained by photoelectric conversion in the right-half photoelectric conversion region in the pixel can be acquired. Namely, in the phase difference pixels 2PA and 2PB constituting a pair of pixels, since one set of phase difference signals of the photoelectric conversion regions having a position relationship of being symmetric with respect to the optical axis can be acquired, the defocus amount is calculated by detecting the phase difference of the two signals, and the image forming lens is adjusted (moved), so that it is possible to achieve auto-focusing.

In addition, in the example of FIG. 6, a high bias voltage is also applied to the upper electrode 54a of the normal pixel 2X, and thus, the signal can be acquired from the normal pixel 2X, but the signal of the normal pixel 2X is not used. Therefore, in the case of acquiring the phase difference signal, a low bias voltage may be applied to the upper electrode 54a of the normal pixel 2X.

2.3 Driving Method in Image Signal Acquisition Period

Next, a driving method of acquiring the image signal in the pixel 2 according to the first configuration example will be described with reference to FIG. 7.

Figure 7:
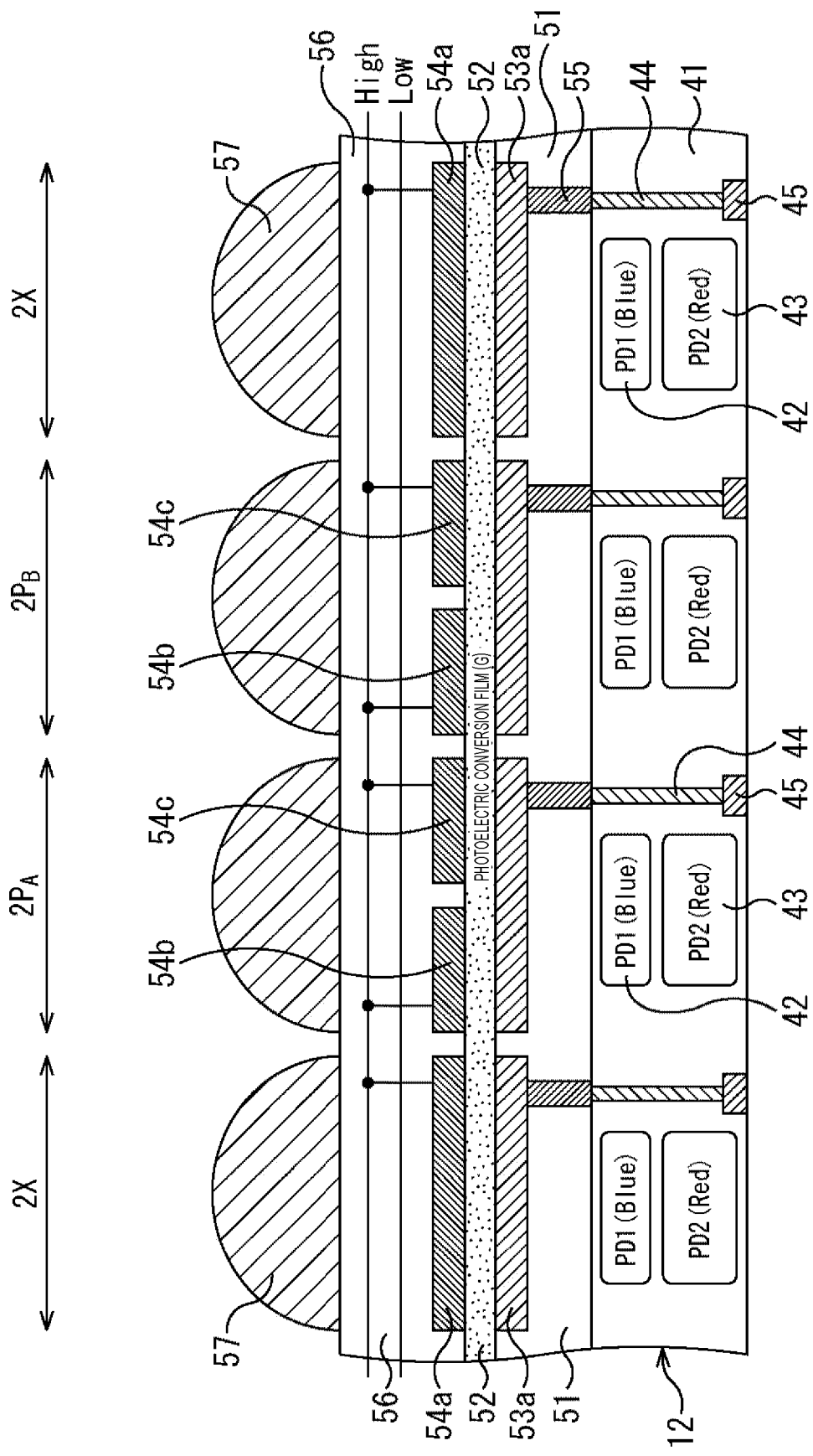
FIG. 7 is a diagram describing a driving method of acquiring an image signal in the first configuration example.

FIG. 7 is a diagram illustrating a method of setting a bias voltage to the upper electrode 54 of each pixel 2 in the case of acquiring the image signal.

In the case of acquiring the image signal, as illustrated in FIG. 7, in any one of the phase difference pixels 2PA and 2PB constituting a pair of pixels, a high bias voltage is applied to the first upper electrode 54b and the second upper electrode 54c. In addition, a high bias voltage is also applied to the upper electrode 54a of the normal pixel 2X.

The total area of the first upper electrode 54b and the second upper electrode 54c in the phase difference pixel 2P is almost equal to the area of the upper electrode 54a of the normal pixel 2X, and a similar signal to that of the normal pixel 2X can also be output from the phase difference pixel 2P.

By doing so, in the entire pixels of the phase difference pixel 2P and the normal pixel 2X in the pixel array portion 3, the image signal can be generated and output.

The control of the bias voltage to each upper electrode 54 of the phase difference pixel 2P and the normal pixel 2X is performed by, for example, the vertical driver circuit 4. The timing of acquiring the phase difference signal can be determined arbitrarily. For example, contrary to the acquisition of the image signal in several frames, the phase difference signal may be acquired with a rate of one time, and the acquisition of the image signal and the acquisition of the phase difference signal may be alternately performed.

As described above, according to the first configuration example of the pixel 2 in the solid-state imaging device 1, in the phase difference signal acquisition period, in the phase difference pixels 2PA and 2PB constituting a pair of pixels, a bias voltage is applied to the upper electrodes 54 so that one set of phase difference signals including the left opening signal corresponding to the first upper electrode 54b and the right opening signal corresponding to the second upper electrode 54c is obtained.

In addition, in the image signal acquisition period, a bias voltage is applied to the upper electrodes 54 so that the image signal is obtained in the entire pixels of the phase difference pixel 2P and the normal pixel 2X in the pixel array portion 3.

Therefore, the phase difference can be detected at a high sensitivity by using the photoelectric conversion film 52 (photoelectric conversion portion) provided outside the semiconductor substrate 12, it is possible to improve auto-focusing accuracy. In addition, it is possible to obtain the phase difference signal by only controlling the bias voltage applied to the upper electrode 54, and in the case of acquiring an image signal, an image signal similar to a normal pixel 2X can be generated from the phase difference pixel 2P. In other words, the phase difference pixel 2P does not become a defective pixel, and an image signal can also be acquired from the phase difference pixel 2P.

In addition, in the above-described driving in the phase difference signal acquisition period, in one phase difference pixel 2P, a high bias voltage is applied to one of the first upper electrode 54b and the second upper electrode 54c, and a low bias voltage is applied to the other upper electrode. In this case, when the potential of the lower electrode 53a is changed by the charges output from the photoelectric conversion film 52 corresponding to the upper electrode 54 (one of the first upper electrode 54b and the second upper electrode 54c) of the side where the high bias voltage is applied, a potential difference between the upper electrode 54 (the other of the first upper electrode 54b and the second upper electrode 54c) of the side where the low bias voltage is applied and the lower electrode 53a is increased, and thus, there may be a problem in that leak current flows to the region of the side where the low bias voltage is applied.

Since the current amount of the leak current is very small, the leak current does not influence the image. However, in order to suppress the leak current as much as possible, the potential of the upper electrode 54 of the side where the low bias voltage is applied may be changed according to the change in the potential of the lower electrode 53a of the side where the charges are stored. Namely, the potential of the upper electrode 54 of the side where the low bias voltage is applied may be changed so that the potential difference between the upper electrode 54 of the side where the low bias voltage is applied and the lower electrode 53a is constant. In order to implement this control, added is a voltage control circuit which monitors the potential of the charge retaining portion 45 and changes the voltage applied to the upper electrode 54 of the side where the low bias voltage is applied according to the potential of the charge retaining portion 45.

2.4 Second Driving Method in Phase Difference Signal Acquisition Period

Next, a second driving method of acquiring the phase difference signal in the pixel 2 according to the first configuration example will be described with reference to FIGS. 8 and 9.

Figure 8:
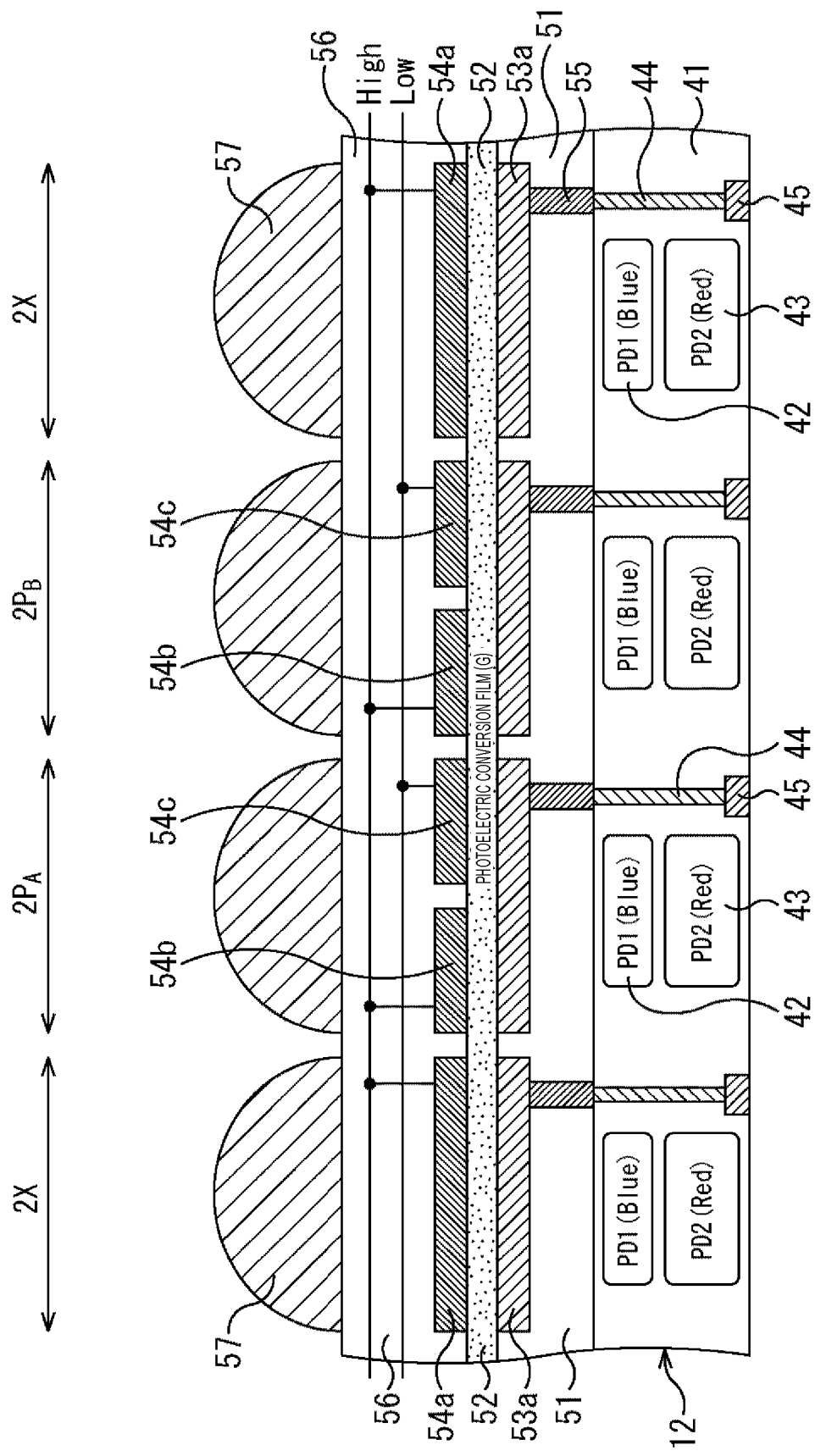
FIG. 8 is a diagram describing a second driving method of acquiring a phase difference signal in the first configuration example.
Figure 9:
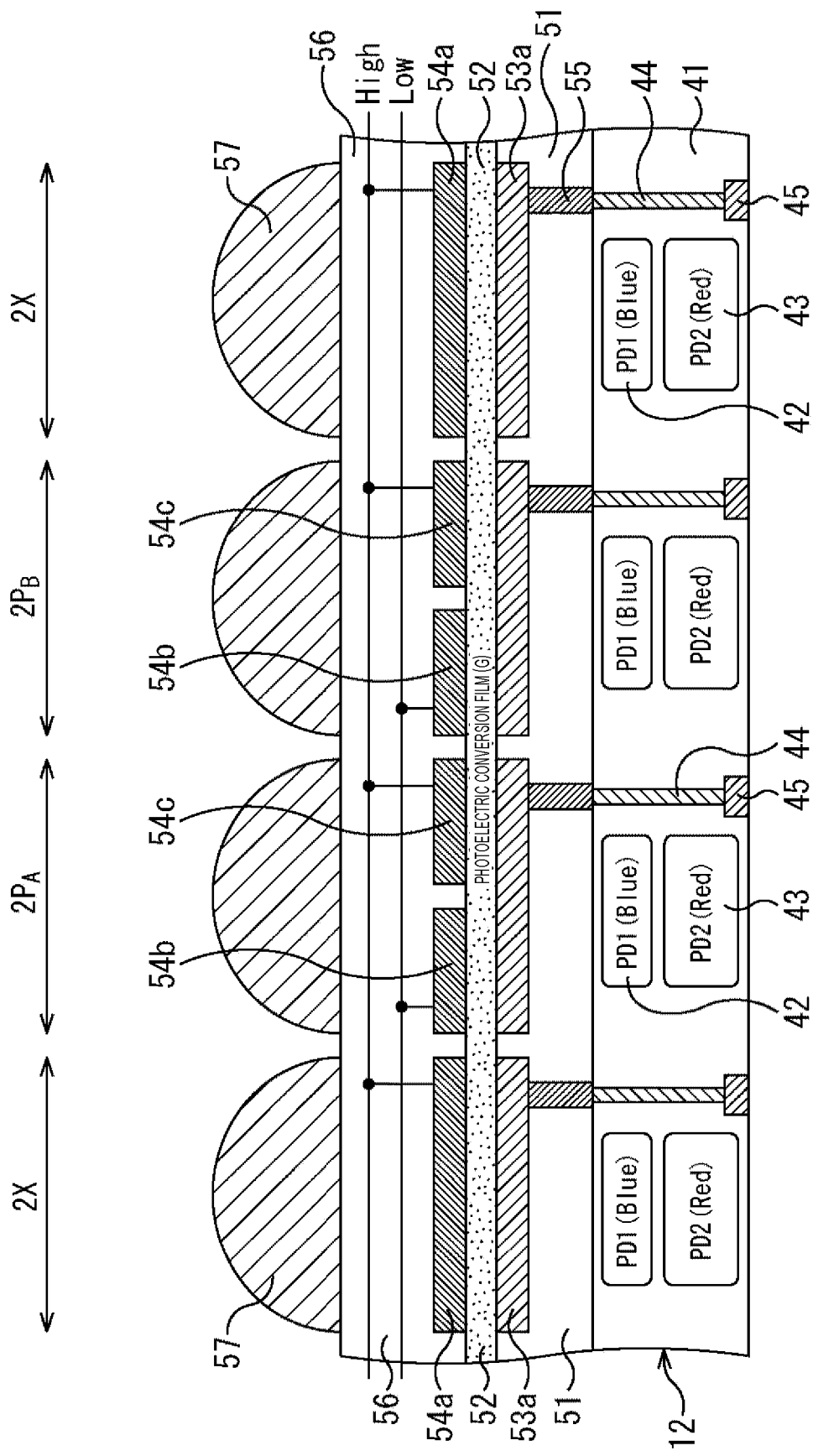
FIG. 9 is a diagram describing a second driving method of acquiring a phase difference signal in the first configuration example.

FIGS. 8 and 9 are diagrams illustrating a method of setting a bias voltage to the upper electrode 54 of each pixel 2 in the case of acquiring the phase difference signal.

The above-described first driving method is a driving method where, in each of the phase difference pixels 2PA and 2PB constituting a pair of pixels, only one side of the divided photoelectric conversion regions is used. Namely, in the phase difference pixel 2PA, only the left-half photoelectric conversion region corresponding to the first upper electrode 54b is used, and in the phase difference pixel 2PB, only the right-half photoelectric conversion region corresponding to the second upper electrode 54c is used.

On the contrary, in the second driving method, the reading of the phase difference signal is performed two times, and in each of the phase difference pixels 2PA and 2PB, both of the divided photoelectric conversion regions are used.

For example, in the first read operation for the phase difference signal, as illustrated in FIG. 8, in each of the phase difference pixels 2PA and 2PB, a high bias voltage is applied to the first upper electrode 54b, and a low bias voltage is applied to the second upper electrode 54c. By doing so, in the first read operation for the phase difference signal, the left opening signal is acquired from each of the phase difference pixels 2PA and 2PB.

In addition, in the second read operation for the phase difference signal, as illustrated in FIG. 9, in each of the phase difference pixels 2PA and 2PB, a low bias voltage is applied to the first upper electrode 54b, and a high bias voltage is applied to the second upper electrode 54c. By doing so, in the second read operation for the phase difference signal, the right opening signal is acquired from each of the phase difference pixels 2PA and 2PB.

In addition, as a matter of course, as another order of acquisition, in the first read operation for the phase difference signal, the right opening signal may be acquired from each of the phase difference pixels 2PA and 2PB, and in the second read operation for the phase difference signal, the left opening signal may be acquired from each of the phase difference pixels 2PA and 2PB. Namely, the order of acquisition of the right opening signal and the left opening signal is arbitrary.

By the driving described above, in each of the phase difference pixels 2PA and 2PB, one set of phase difference signals of the photoelectric conversion regions having a position relationship of being symmetric with respect to the optical axis can be acquired. As a result, in the second driving method, since the number of pixels used for the phase difference direction can be increased in comparison with the first driving method, it is possible to perform auto-focusing at a higher accuracy.

3. Second Configuration Example of Pixel 3.1 Cross-Sectional Structure Diagram of Pixel Next, a second configuration example of the pixel 2 of the solid-state imaging device 1 according to the first embodiment will be described with reference to FIG. 10.

Figure 10:
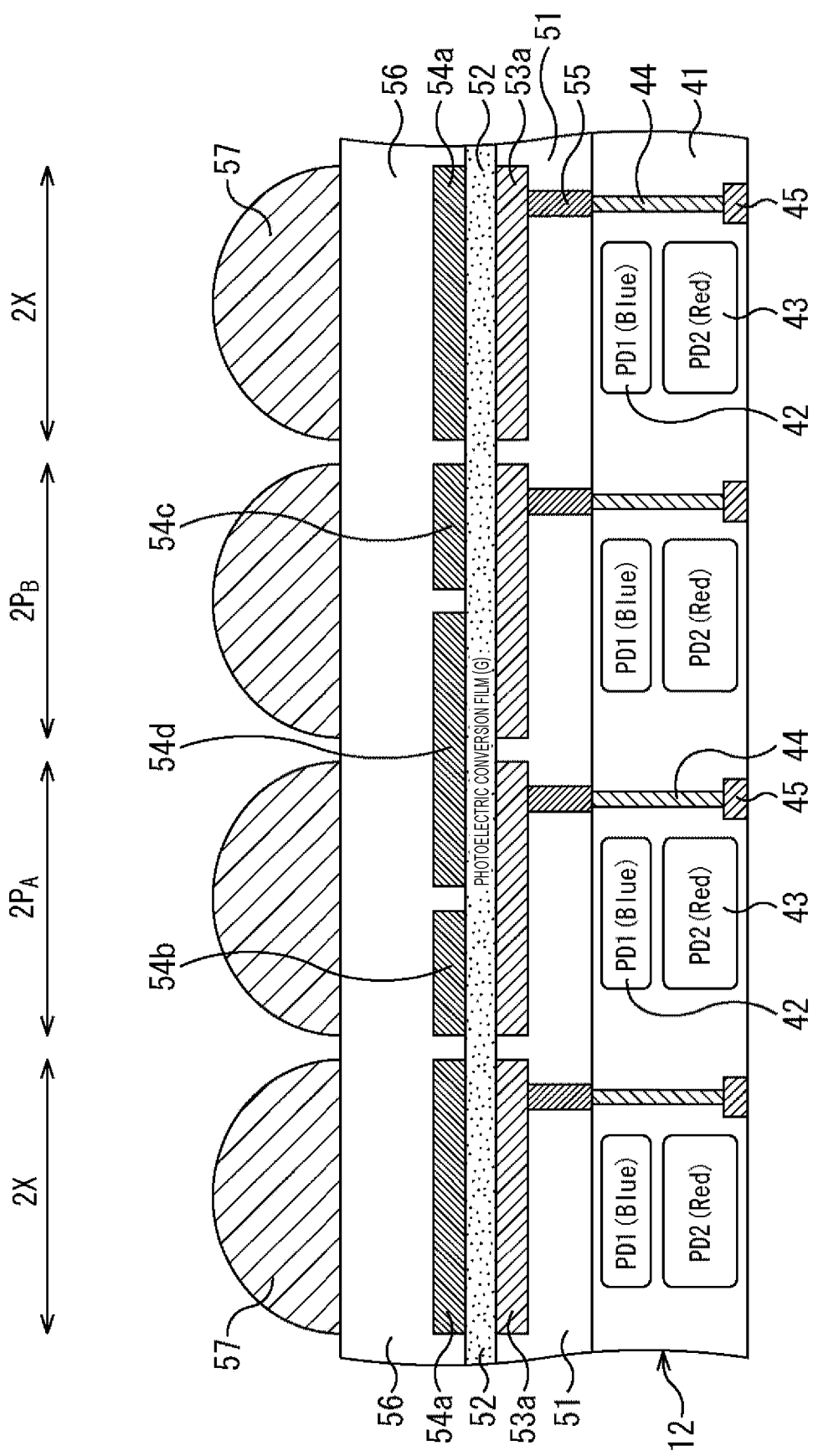
FIG. 10 is a cross-sectional structure diagram illustrating a second configuration example of a pixel in the first embodiment.

FIG. 10 illustrates a cross-sectional structure of the pixel 2 in the second configuration example.

In addition, in FIG. 10, portions corresponding to those of the above-described first configuration example are denoted by the same reference numerals, and the description thereof is appropriately omitted.

In comparison of the pixel structure of the second configuration example with the pixel structure of the first configuration example illustrated in FIG. 2, the second upper electrode 54c of the phase difference pixel 2PA and the first upper electrode 54b of the phase difference pixel 2PB in the first configuration example are replaced by a third upper electrode 54d. The third upper electrode 54d is formed as one region so as to extend over the phase difference pixel 2PA and the phase difference pixel 2PB.

Therefore, in the pixel structure of the first configuration example illustrated in FIG. 2, the phase difference pixel 2PA and the phase difference pixel 2PB are not necessarily adjacent to each other. However, in the pixel structure of the second configuration example, the phase difference pixel 2PA and the phase difference pixel 2PB need to be adjacent to each other inside the pixel array portion 3.

The other structures excluding the third upper electrode 54d in the second configuration example are similar to those of the pixel structure in the first configuration example.

3.2 Driving Method in Phase Difference Signal Acquisition Period

Next, a driving method of acquiring the phase difference signal in the pixel 2 according to the second configuration example will be described with reference to FIG. 11.

Figure 11:
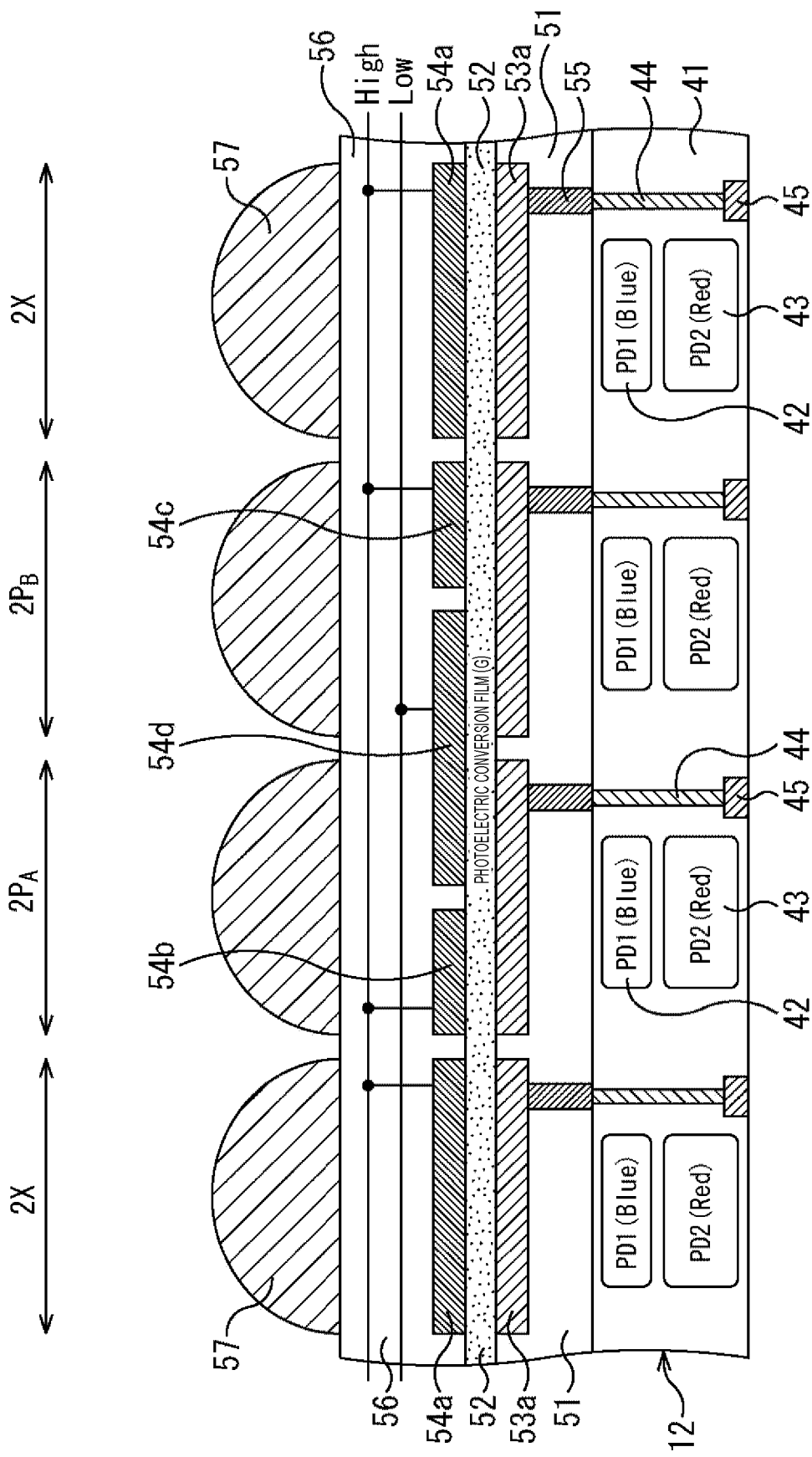
FIG. 11 is a diagram describing a driving method of acquiring a phase difference signal in the second configuration example.

FIG. 11 is a diagram illustrating a method of setting a bias voltage to the upper electrode 54 of each pixel 2 in the case of acquiring the phase difference signal.

In the case of acquiring the phase difference signal, as illustrated in FIG. 11, a high bias voltage is applied to the first upper electrode 54b of the phase difference pixel 2PA and the second upper electrode 54c of the phase difference pixel 2PB. In addition, a low bias voltage is applied to the third upper electrode 54d.

By doing so, in the phase difference pixel 2PA, the left opening signal can be acquired, and in the phase difference pixel 2PB, the right opening signal can be acquired. Namely, since the signals of the symmetric photoelectric conversion regions in the phase difference pixels 2PA and 2PB constituting a pair of pixels can be acquired, in the phase difference pixels 2PA and 2PB constituting a pair of pixels, one set of phase difference signals of the photoelectric conversion regions having a position relationship of being symmetric with respect to the optical axis can be acquired, so that it is possible to achieve auto-focusing.

According to the driving method, although a similar phase difference signal to that of the first driving method of the first configuration example can be obtained, since the two upper electrodes 54 where the low bias voltage is applied, that is, the second upper electrode 54c of the phase difference pixel 2PA and the first upper electrode 54b of the phase difference pixel 2PB in the first configuration example are replaced by one third upper electrode 54d in the second configuration example, the number of control wire lines 61 supplying the bias voltages may be smaller than that of the first configuration example. Therefore, according to the second configuration example, the number of control wire lines 61 can be reduced in comparison with the first configuration example, so that wiring layout can be easily performed.

In addition, in the case of acquiring the image signal in the second configuration example, a high bias voltage is applied to the upper electrodes 54 of the entire pixels in the pixel array portion 3. By doing so, in the entire pixels of the phase difference pixel 2P and the normal pixel 2X in the pixel array portion 3, the image signal can be generated and output.

4. Third Configuration Example of Pixel 4.1 Cross-Sectional Structure Diagram of Pixel Next, a third configuration example of the pixel 2 of the solid-state imaging device 1 according to the first embodiment will be described with reference to FIG. 12.

Figure 12:
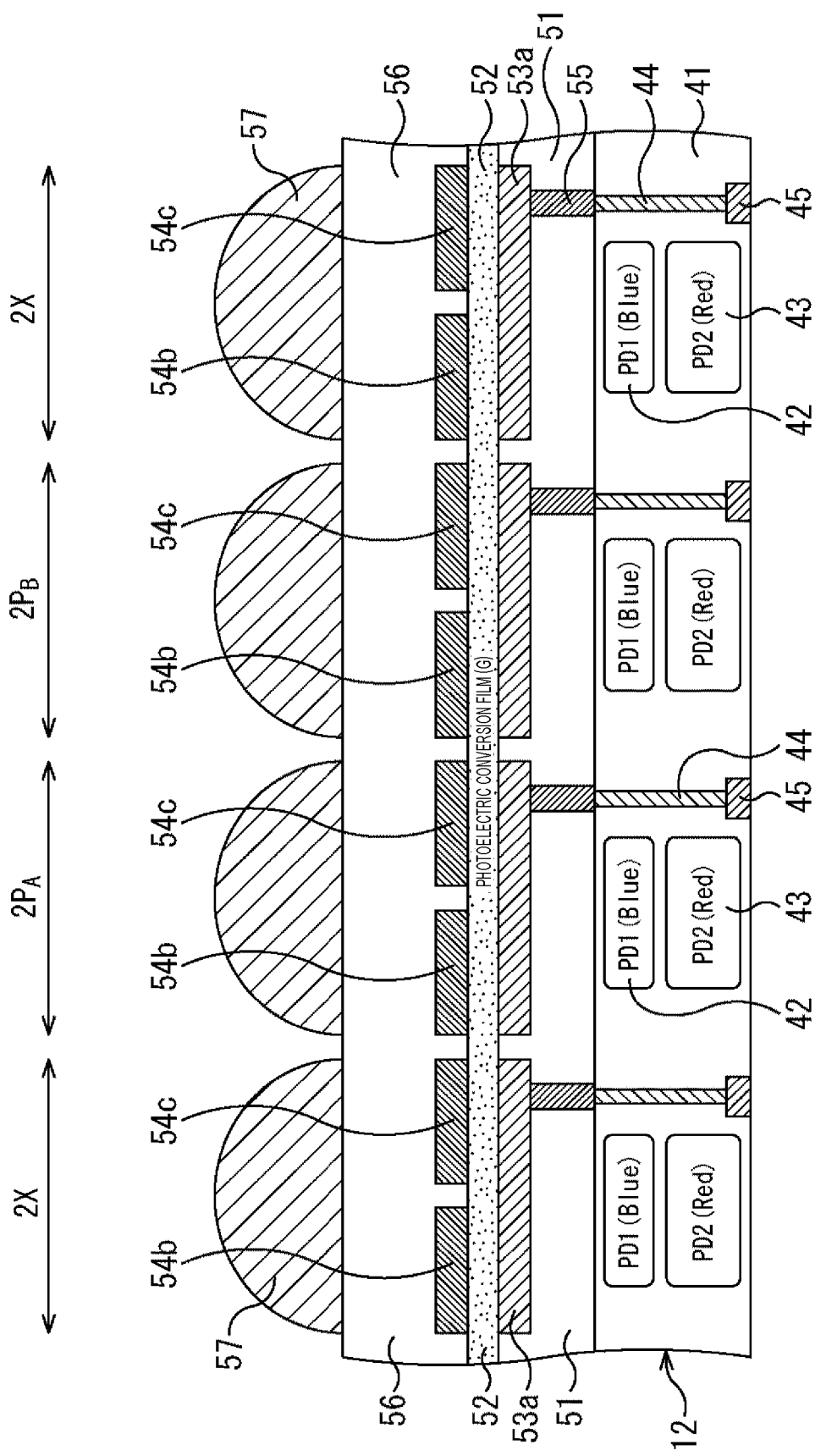
FIG. 12 is a cross-sectional structure diagram illustrating a third configuration example of a pixel in the first embodiment.

FIG. 12 illustrates a cross-sectional structure of the pixel 2 in the third configuration example.

In the description of FIG. 12 and thereafter, portions corresponding to those of the above-described embodiments are denoted by the same reference numerals, and the description thereof is appropriately omitted.

In comparison of the pixel structure of the third configuration example with the pixel structure of the first configuration example illustrated in FIG. 2, in the third configuration example, in the normal pixel 2X, similarly to the phase difference pixel 2P, the upper electrode 54 is formed to be divided into two regions of a first upper electrode 54b and a second upper electrode 54c.

The other structures excluding the upper electrode 54 in the third configuration example are similar to those of the pixel structure in the first configuration example.

In this manner, the upper electrodes 54 of the entire pixels in the pixel array portion 3 are formed to be divided, and thus, the continuity of pixel patterns is increased, so that it is possible to increase the uniformity in the processing steps for the formation of the upper electrodes 54.

4.2 Driving Method in Phase Difference Signal Acquisition Period

Next, a driving method of acquiring the phase difference signal in the pixel 2 according to the third configuration example will be described with reference to FIG. 13.

Figure 13:
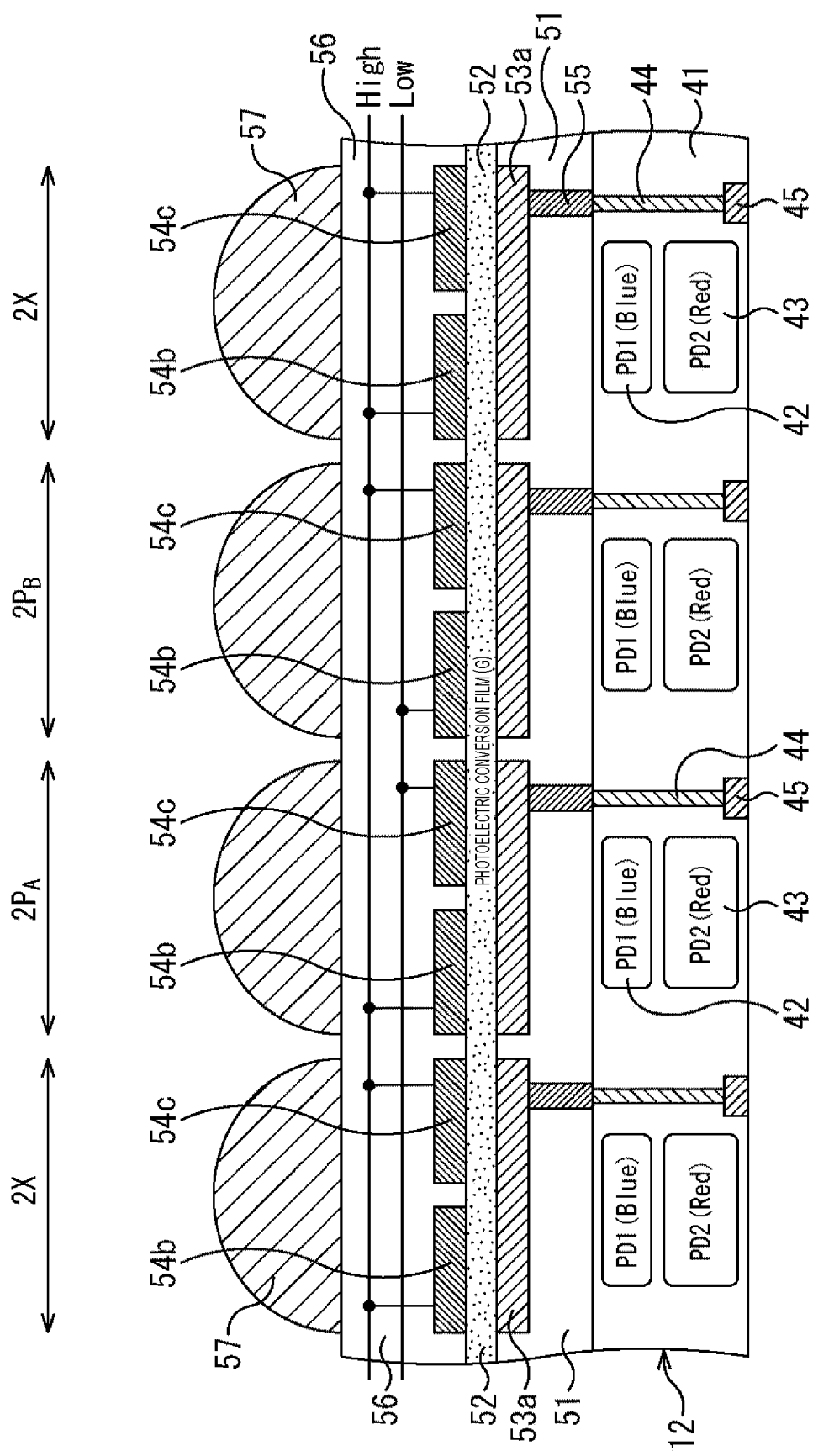
FIG. 13 is a diagram describing a driving method of acquiring a phase difference signal in the third configuration example.

FIG. 13 is a diagram illustrating a method of setting a bias voltage to the upper electrode 54 of each pixel 2 in the case of acquiring the phase difference signal.

In the case of acquiring the phase difference signal, as illustrated in FIG. 13, in the phase difference pixel 2PA of the phase difference pixels 2PA and 2PB constituting a pair of pixels, a high bias voltage is applied to the first upper electrode 54b, and a low bias voltage is applied to the second upper electrode 54c.

On the other hand, in the phase difference pixel 2PB of the phase difference pixels 2PA and 2PB constituting a pair of pixels, a low bias voltage is applied to the first upper electrode 54b, and a high bias voltage is applied to the second upper electrode 54c.

A high bias voltage is applied to the first upper electrode 54b and the second upper electrode 54c in the normal pixel 2X. However, in the case of acquiring the phase difference signal, since the signal of the normal pixel 2X is not used, a low bias voltage may be applied to the first upper electrode 54b and the second upper electrode 54c in the normal pixel 2X.

By doing so, in the phase difference pixel 2PA, the left opening signal can be acquired, and in the phase difference pixel 2PB, the right opening signal can be acquired. Therefore, in the phase difference pixels 2PA and 2PB constituting a pair of pixels, one set of phase difference signals of the photoelectric conversion regions having a position relationship of being symmetric with respect to the optical axis can be acquired, so that it is possible to achieve auto-focusing.

In addition, although the driving method described in FIG. 13 is the same as the first driving method of acquiring the phase difference signal descried with reference to FIG. 6 in the pixel 2 according to the first configuration example, even in the third configuration example, the second driving method of acquiring the phase difference signal described with reference to FIGS. 8 and 9 may also be used.

4.3 Driving Method in Image Signal Acquisition Period

Next, a driving method of acquiring the image signal in the pixel 2 according to the third configuration example will be described with reference to FIG. 14.

Figure 14:
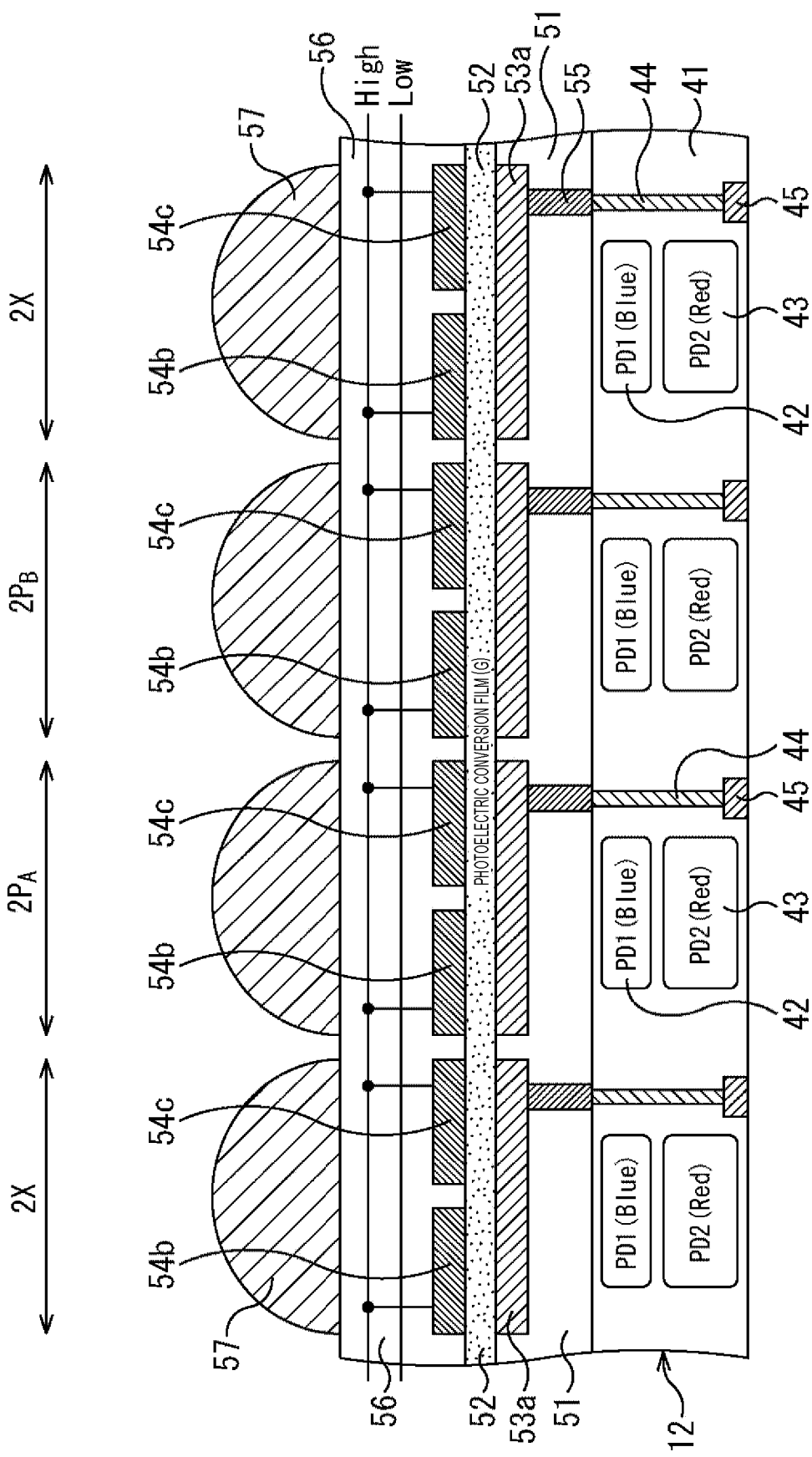
FIG. 14 is a diagram describing a driving method of acquiring an image signal in the third configuration example.

FIG. 14 is a diagram illustrating a method of setting a bias voltage to the upper electrode 54 of each pixel 2 in the case of acquiring the image signal.

In the case of acquiring the image signal, as illustrated in FIG. 14, a high bias voltage is applied to the upper electrodes 54 of the entire pixels in the pixel array portion 3. By doing so, in the entire pixels of the phase difference pixel 2P and the normal pixel 2X in the pixel array portion 3, the image signal can be generated and output.

In the third configuration example, the phase difference pixel 2P and the normal pixel 2X have the same pixel structure. Therefore, in the description of FIG. 13, for the convenience, the phase difference pixel 2P and the normal pixel 2X are described separately, but the phase difference signal can be acquired by using any pixel 2 inside the pixel array portion 3 as the phase difference pixel 2P. In other words, among the entire pixels in the pixel array portion 3, like the phase difference pixels 2PA and 2PB of FIG. 13, the pixels 2 which control the bias voltage become the phase difference pixels 2P.

Therefore, according to the third configuration example, it is possible to acquire the phase difference signal from an arbitrary pixel 2. In addition, since the number of pixels used for phase difference detection can be increased, it is possible to perform auto-focusing at a higher accuracy.

5. Fourth Configuration Example of Pixel 5.1 Cross-Sectional Structure Diagram of Pixel Next, a fourth configuration example of the pixel 2 of the solid-state imaging device 1 according to the first embodiment will be described with reference to FIG. 15.

Figure 15:
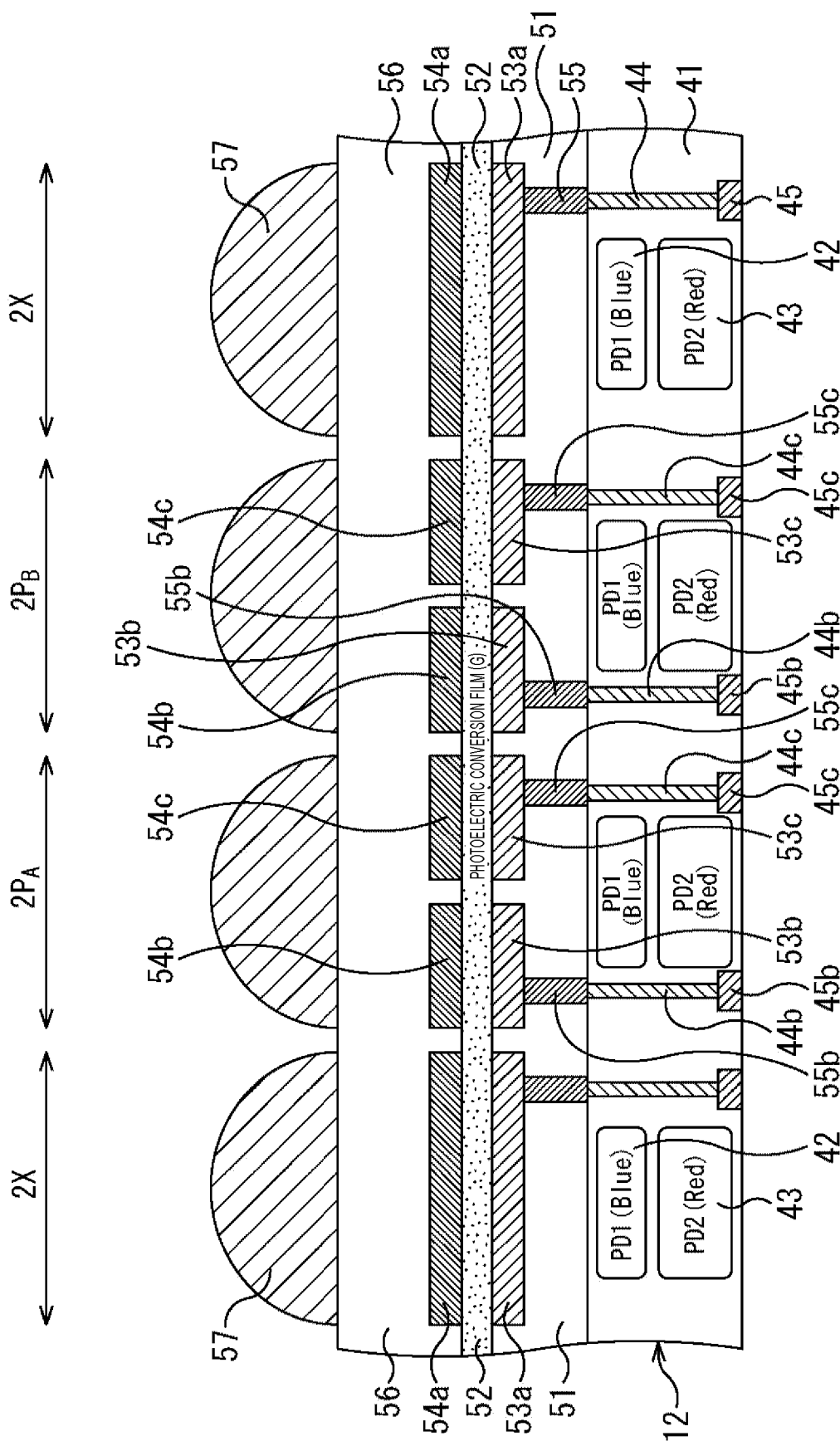
FIG. 15 is a cross-sectional structure diagram illustrating a fourth configuration example of a pixel in the first embodiment.

FIG. 15 illustrates a cross-sectional structure of the pixel 2 in the fourth configuration example.

In comparison of the pixel structure of the fourth configuration example with the pixel structure of the first configuration example illustrated in FIG. 2, in the fourth configuration example, each of the lower electrodes 53a of the phase difference pixels 2PA and 2PB in the first configuration example is divided into two regions corresponding to the first upper electrode 54b and the second upper electrode 54c to be replaced by a first lower electrode 53b and a second lower electrode 53c. In addition, hereinafter, if there is no need to distinguish the lower electrode 53a, the first lower electrode 53b, and the second lower electrode 53c, each of the lower electrodes is simply referred to as a lower electrode 53.

In addition, the lower electrode 53a is divided into two regions of the first lower electrode 53b and the second lower electrode 53c, and accordingly, the metal wire line 55, the conductive plug 44, and the charge retaining portion 45 are also formed so as to correspond to each of the first lower electrode 53b and the second lower electrode 53c. Namely, the first lower electrode 53b is provided with a metal wire line 55b, a conductive plug 44b, and a charge retaining portion 45b, and the second lower electrode 53c is provided with a metal wire line 55c, a conductive plug 44c, and a charge retaining portion 45c.

5.2 Driving Method in Phase Difference Signal Acquisition Period

Next, a driving method of acquiring the phase difference signal in the pixel 2 according to the fourth configuration example will be described with reference to FIG. 16.

Figure 16:
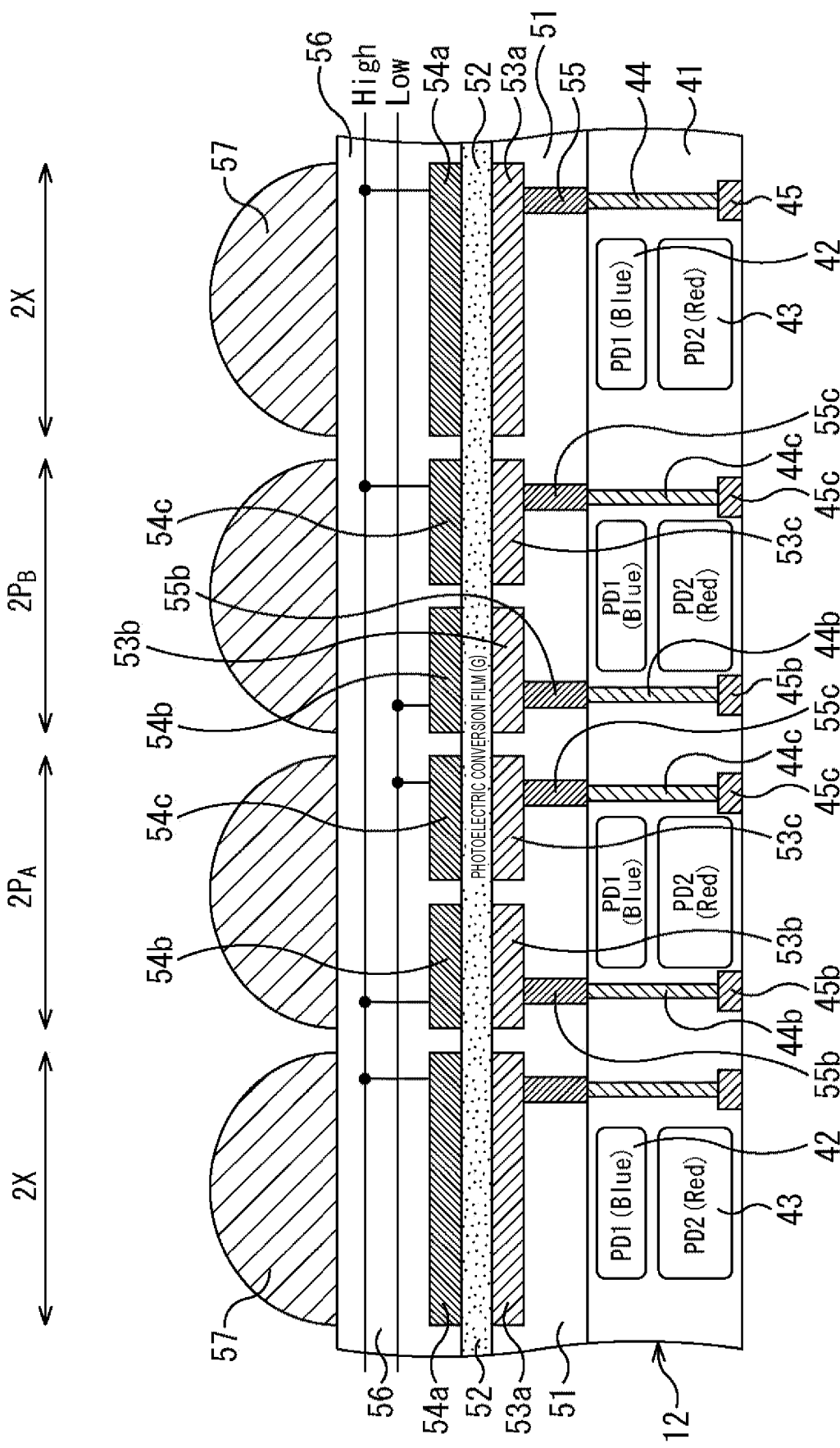
FIG. 16 is a diagram describing a driving method of acquiring a phase difference signal in the fourth configuration example.

FIG. 16 is a diagram illustrating a method of setting a bias voltage to the upper electrode 54 of each pixel 2 in the case of acquiring the phase difference signal.

In the case of acquiring the phase difference signal, as illustrated in FIG. 16, in the phase difference pixel 2PA of the phase difference pixels 2PA and 2PB constituting a pair of pixels, a high bias voltage is applied to the first upper electrode 54b, and a low bias voltage is applied to the second upper electrode 54c.

On the other hand, in the phase difference pixel 2PB of the phase difference pixels 2PA and 2PB constituting a pair of pixels, a low bias voltage is applied to the first upper electrode 54b, and a high bias voltage is applied to the second upper electrode 54c.

A high bias voltage is also applied to the upper electrode 54a of the normal pixel 2X. However, in the case of acquiring the phase difference signal, since the signal of the normal pixel 2X is not used, a low bias voltage may be applied to the upper electrode 54a of the normal pixel 2X.

By doing so, in the phase difference pixel 2PA, the left opening signal can be acquired, and in the phase difference pixel 2PB, the right opening signal can be acquired. Therefore, in the phase difference pixels 2PA and 2PB constituting a pair of pixels, one set of phase difference signals of the photoelectric conversion regions having a position relationship of being symmetric with respect to the optical axis can be acquired, so that it is possible to achieve auto-focusing.

In addition, although the driving method described in FIG. 16 is the same as the first driving method of acquiring the phase difference signal described with reference to FIG. 6 in the pixel 2 according to the first configuration example, even in the fourth configuration example, the second driving method of acquiring the phase difference signal described with reference to FIGS. 8 and 9 may also be used.

According to the pixel structure of the fourth configuration example, the lower electrode 54 is divided into a first lower electrode 53b and a second lower electrode 53c corresponding to the first upper electrode 54b and the second upper electrode 54c. By doing so, in the phase difference signal acquisition period, when different bias voltages are applied to the first upper electrode 54b and the second upper electrode 54c in the phase difference pixel 2P, it is possible to completely suppress the leak current flowing between the upper electrode 54 and the lower electrode 53 of the side where the low bias voltage is applied.

5.3 Driving Method in Image Signal Acquisition Period

Next, a driving method of acquiring the image signal in the pixel 2 according to the fourth configuration example will be described with reference to FIG. 17.

Figure 17:
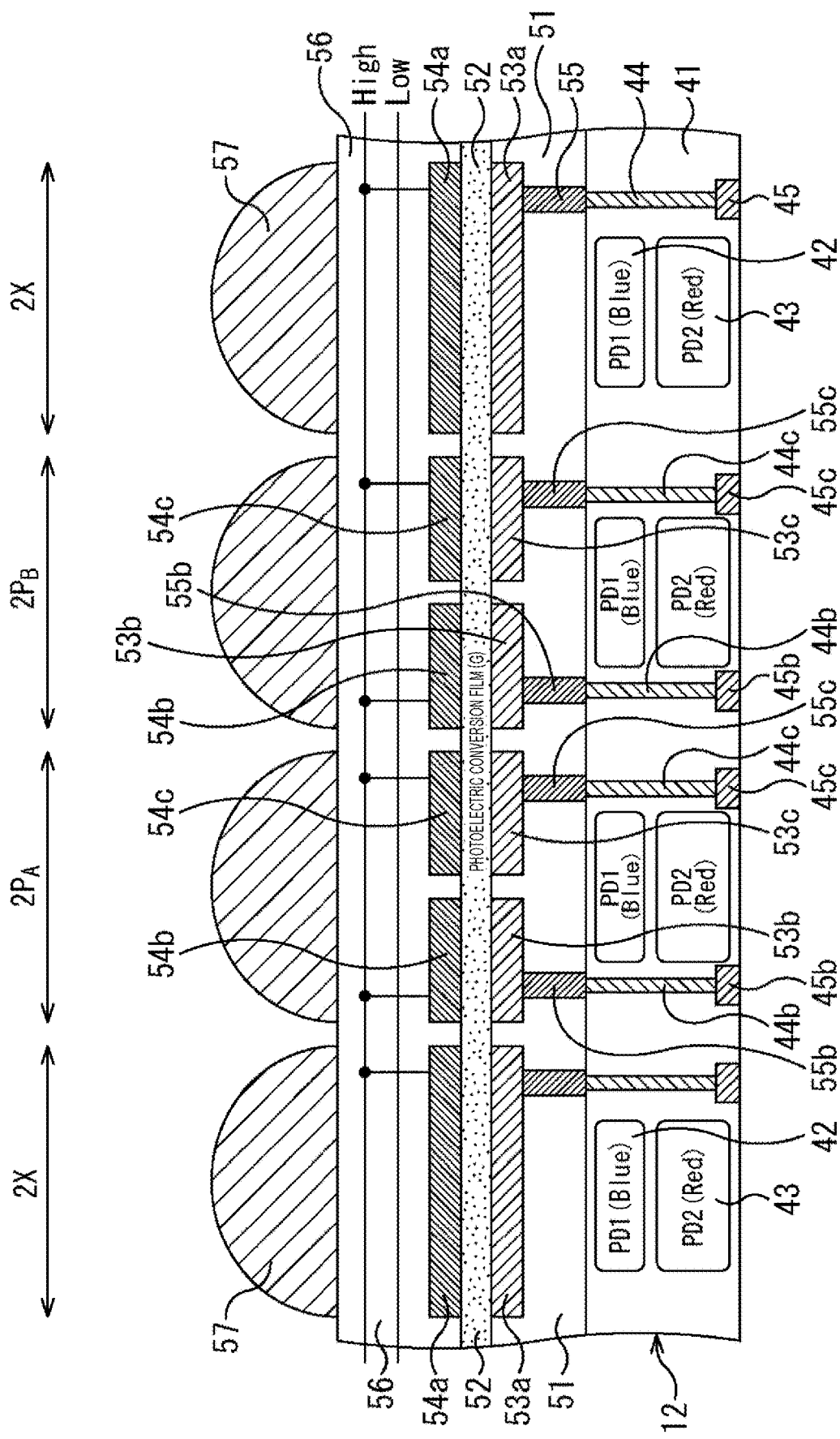
FIG. 17 is a diagram describing a driving method of acquiring an image signal in the fourth configuration example.

FIG. 17 is a diagram illustrating a method of setting a bias voltage to the upper electrode 54 of each pixel 2 in the case of acquiring the image signal.

In the case of acquiring the image signal, as illustrated in FIG. 17, a high bias voltage is applied to the upper electrodes 54 of the entire pixels in the pixel array portion 3.

The image signal which is to be acquired from the phase difference pixel 2P corresponds to the signal obtained by the two divided photoelectric conversion regions inside the pixel, namely, the signal obtained by adding (combining) the right opening signal and the left opening signal. The addition process may be performed in the phase difference pixel 2P or may be performed in the column signal processing circuit 5, the output circuit 7, or the like as a subsequent stage of the pixel array portion 3.

Circuit Diagram of Phase Difference Pixel

Figure 18:
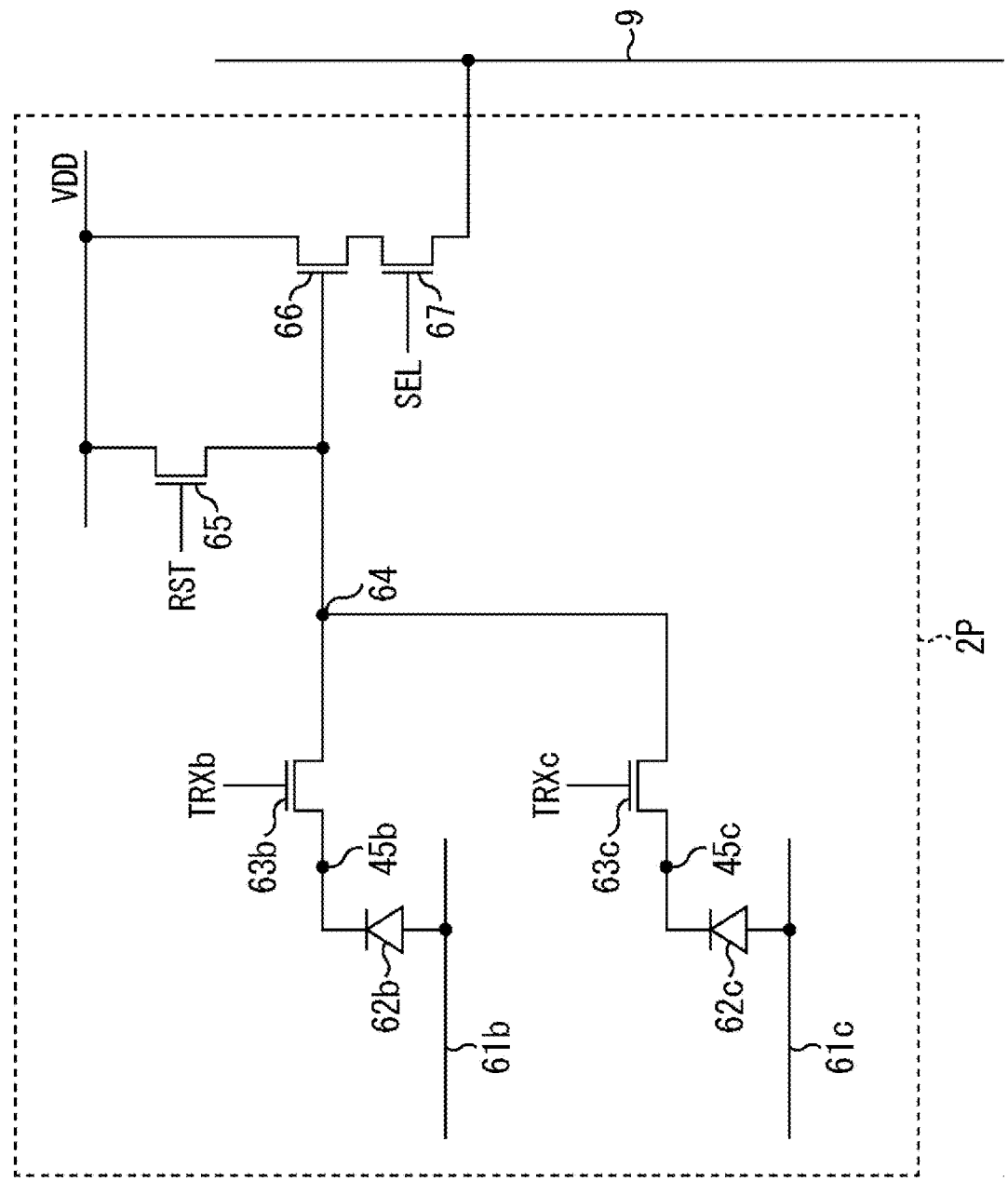
FIG. 18 is a circuit diagram of a phase difference pixel in the case of performing an addition process in the phase difference pixel.

FIG. 18 illustrates a circuit diagram of the phase difference pixel 2P in the case of performing the addition process in the phase difference pixel 2P. However, FIG. 18 is merely a circuit diagram of the portion which outputs the charges (signal charges) generated in the photoelectric conversion film 52, and a circuit diagram of the portion which outputs the charges (signal charges) generated in the photodiodes PD1 and PD2 is omitted.

In the FIG. 18, the photoelectric conversion film 52 interposed by the first lower electrode 53b and the first upper electrode 54b is a photoelectric conversion portion 62b, and the photoelectric conversion film 52 interposed by the first lower electrode 53c and the first upper electrode 54c is a photoelectric conversion portion 62c.

The charges generated in the photoelectric conversion portion 62b are retained in the charge retaining portion 45b, and the charges generated in the photoelectric conversion portion 62c are retained in the charge retaining portion 45c.

The charge retaining portion 45b is connected through a MOS transistor 63b as a switch element to the charge combining portion (charge storage unit) 64, and the charge retaining portion 45c is also connected through a MOS transistor 63c to the charge combining portion 64. The MOS transistor 63b is turned on or off by the control signal TRXb, and the MOS transistor 63c is turned on or off by the control signal TRXc.

In a case where the phase difference pixel 2P outputs the phase difference signal, the MOS transistor 63b and the MOS transistor 63c are turned on at different timing, and thus, the charges generated in the photoelectric conversion portion 62b and the charges generated in the photoelectric conversion portion 62c are separately output. Namely, the left opening signal and the right opening signal are sequentially output.

On the other hand, in a case where the phase difference pixel 2P outputs the image signal, the MOS transistor 63b and the MOS transistor 63c are simultaneously turned on, and thus, the charges generated in the photoelectric conversion portion 62b and the charges generated in the photoelectric conversion portion 62c are combined by the charge combining portion 64, so that the combined charges are output.

When the reset transistor 65 is turned on by a reset signal RST, the charge retained in the charge combining portion 64 are discharged to the constant voltage source VDD, the reset transistor resets the potential of the charge combining portion 64.

The amplification transistor 66 outputs a pixel signal according to the potential of the charge combining portion 64. Namely, the amplification transistor 66 constitutes a load MOS (not illustrated) as a constant current source and a source follower circuit, and a signal indicating a level according to the charges retained in the charge combining portion 64 is output from the amplification transistor 66 through the selection transistor 67 to the column signal processing circuit 5 (FIG. 1). The load MOS is provided, for example, inside the column signal processing circuit 5.

When the phase difference pixel 2P is selected by the select signal SEL, the selection transistor 67 is turned on to output the signal of the phase difference pixel 2P through the vertical signal line 9 to the column signal processing circuit 5. The control signals TRXb and TRXc, the reset signal RST, and the select signal SEL are controlled by, for example, the vertical driver circuit 4.

The above description is the description of the case of acquiring the phase difference signal and the image signal in a time division manner. However, the driving of the image signal acquisition period is performed one time, and by the subsequent-stage output circuit 7 or an image signal processor (ISP) or the like as a subsequent stage of the solid-state imaging device 1, the left opening signal and the right opening signal may be directly used as the phase difference signal, and the addition signal of the left opening signal and the right opening signal may be used as the image signal.

6. Fifth Configuration Example of Pixel 6.1 Cross-Sectional Structure Diagram of Pixel Next, a fifth configuration example of the pixel 2 of the solid-state imaging device 1 according to the first embodiment will be described with reference to FIG. 19.

Figure 19:
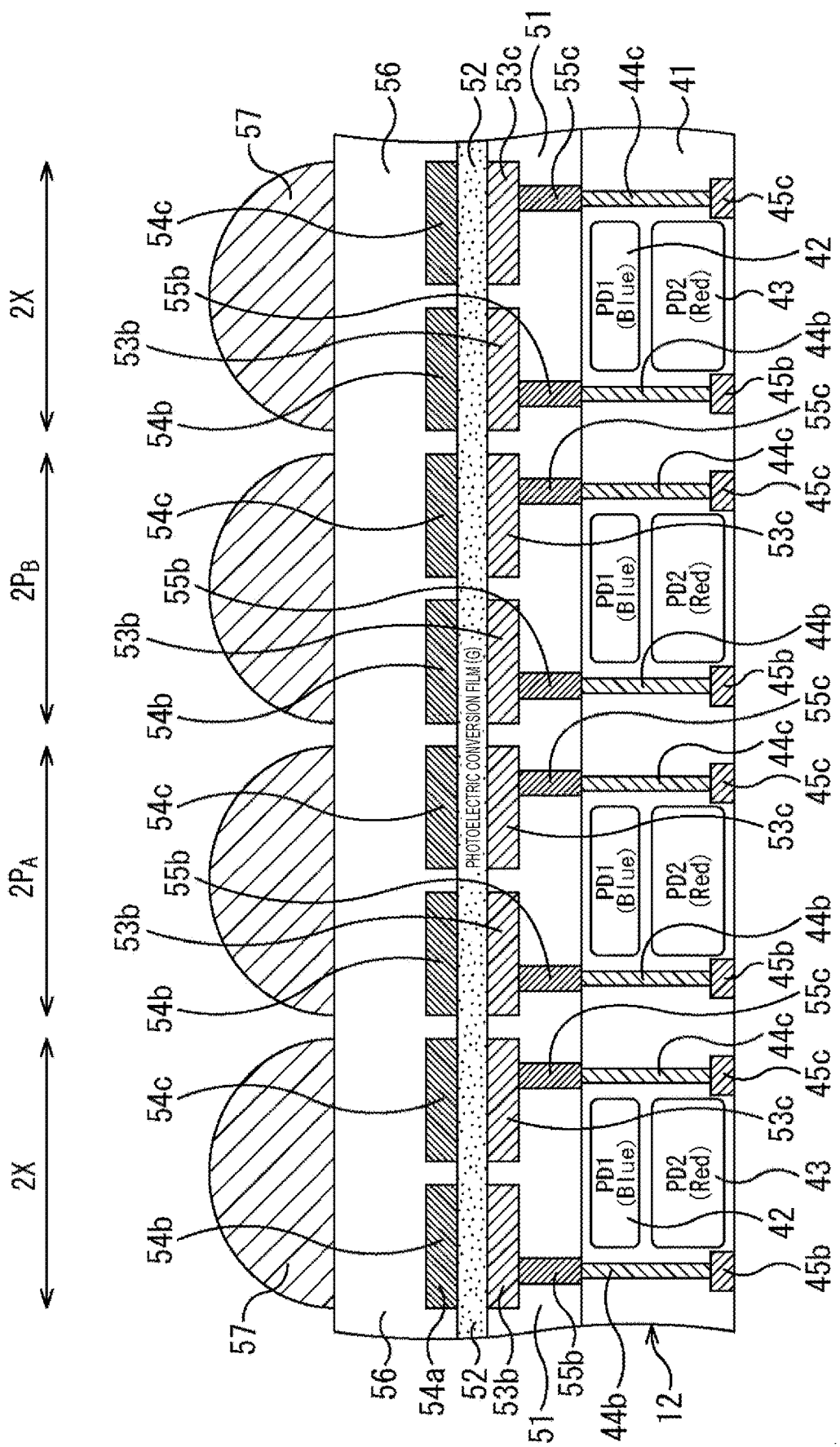
FIG. 19 is a cross-sectional structure diagram illustrating a fifth configuration example of a pixel in the first embodiment.

FIG. 19 illustrates a cross-sectional structure of the pixel 2 in the fifth configuration example.

In the fifth configuration example, in any one of the phase difference pixel 2P and the normal pixel 2X, the upper electrode 54 is formed to be divided into two regions of a first upper electrode 54b and a second upper electrode 54c. In addition, the lower electrode 53 is also formed to be divided into two regions of a first lower electrode 53b and a second lower electrode 53c facing the first upper electrode 54b and the second upper electrode 54c.

In addition, the metal wire line 55, the conductive plug 44, and the charge retaining portion 45 of the normal pixel 2X are also formed to correspond to each of the first lower electrode 53b and the second lower electrode 53c. Namely, the first lower electrode 53b is provided with a metal wire line 55b, a conductive plug 44b, and a charge retaining portion 45b, and the second lower electrode 53c is provided with a metal wire line 55c, a conductive plug 44c, and a charge retaining portion 45c.

Namely, in the fifth configuration example, in the entire pixels, there are two divided photoelectric conversion regions by the photoelectric conversion films 52.

In this manner, the lower electrodes 53 and the upper electrodes 54 of the entire pixels in the pixel array portion 3 are formed to be divided, and thus, the continuity of pixel patterns is increased, so that it is possible to increase the uniformity in the processing steps after the formation of the lower electrodes 53.

6.2 First Driving Method in Phase Difference Signal Acquisition Period

Next, a first driving method of acquiring the phase difference signal in the pixel 2 according to the fifth configuration example will be described with reference to FIG. 20.

Figure 20:
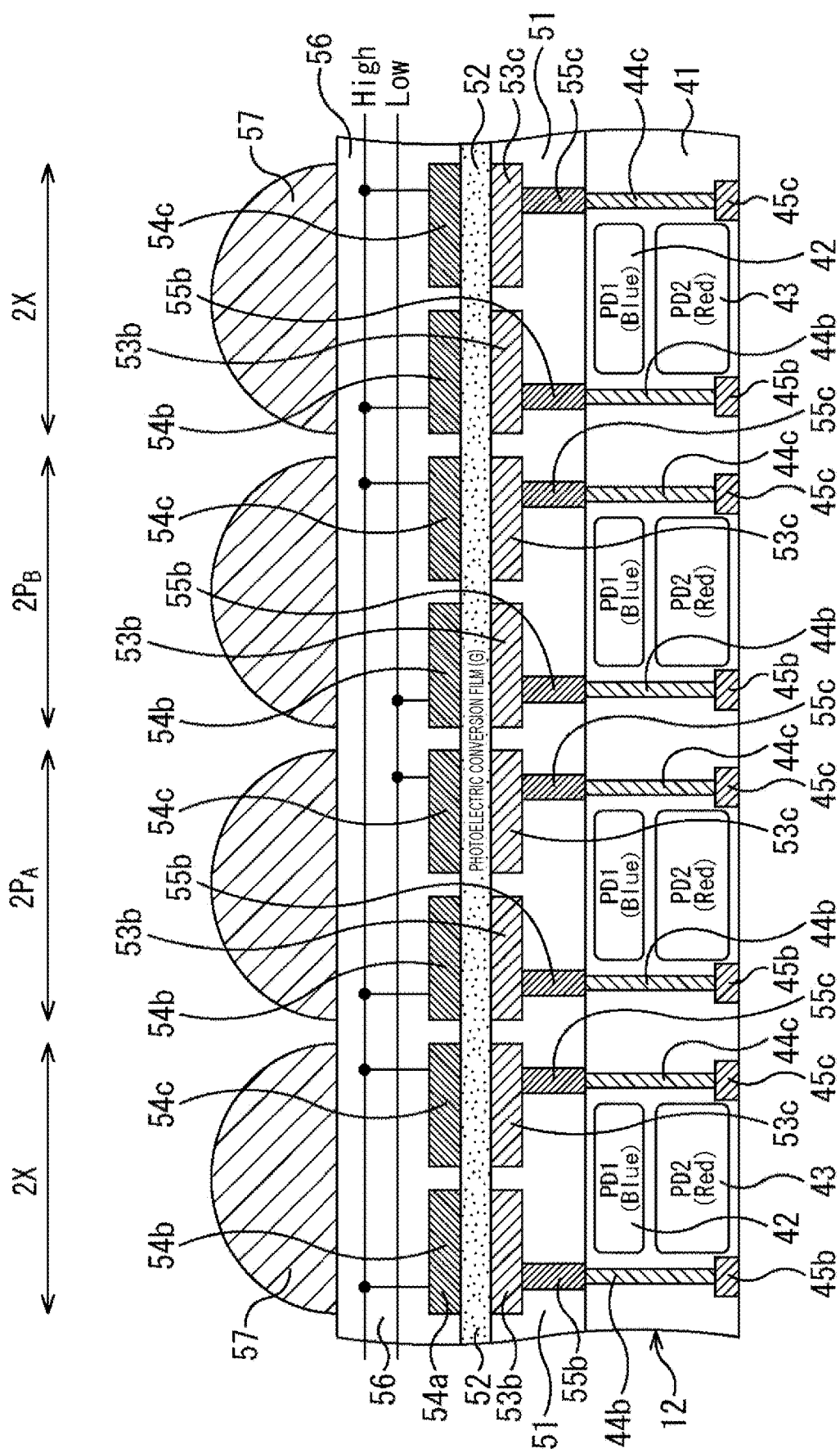
FIG. 20 is a diagram describing a first driving method of acquiring a phase difference signal in the fifth configuration example.

FIG. 20 is a diagram illustrating a method of setting a bias voltage to the upper electrode 54 of each pixel 2 in the case of acquiring the phase difference signal.

In the case of acquiring the phase difference signal, as illustrated in FIG. 20, in the phase difference pixel 2PA of the phase difference pixels 2PA and 2PB constituting a pair of pixels, a high bias voltage is applied to the first upper electrode 54*b*, and a low bias voltage is applied to the second upper electrode 54*c*.

On the other hand, in the phase difference pixel 2PB of the phase difference pixels 2PA and 2PB constituting a pair of pixels, a low bias voltage is applied to the first upper electrode 54*b*, and a high bias voltage is applied to the second upper electrode 54*c*.

A high bias voltage is also applied to the first upper electrode 54*b* and the second upper electrode 54*c* in the normal pixel 2X. However, in the case of acquiring the phase difference signal, since the signal of the normal pixel 2X is not used, a low bias voltage may be applied to the first upper electrode 54*b* and the second upper electrode 54*c* in the normal pixel 2X.

By doing so, in the phase difference pixel 2PA, the left opening signal can be acquired, and in the phase difference pixel 2PB, the right opening signal can be acquired. Therefore, in the phase difference pixels 2PA and 2PB constituting a pair of pixels, one set of phase difference signals of the photoelectric conversion regions having a position relationship of being symmetric with respect to the optical axis can be acquired, so that it is possible to achieve auto-focusing.

In addition, in the fifth configuration example, the phase difference pixel 2P and the normal pixel 2X have the same pixel structure. Therefore, in the description of FIG. 20, for the convenience, the phase difference pixel 2P and the normal pixel 2X are described separately, but the phase difference signal can be acquired by using any pixel 2 inside the pixel array portion 3 as the phase difference pixel 2P. In other words, among the entire pixels in the pixel array portion 3, like the phase difference pixels 2PA and 2PB of FIG. 20, the pixels 2 which controls the bias voltage become the phase difference pixels 2P.

6.3 Driving Method in Image Signal Acquisition Period

Next, a driving method of acquiring the image signal in the pixel 2 according to the fifth configuration example will be described with reference to FIG. 21.

Figure 21:
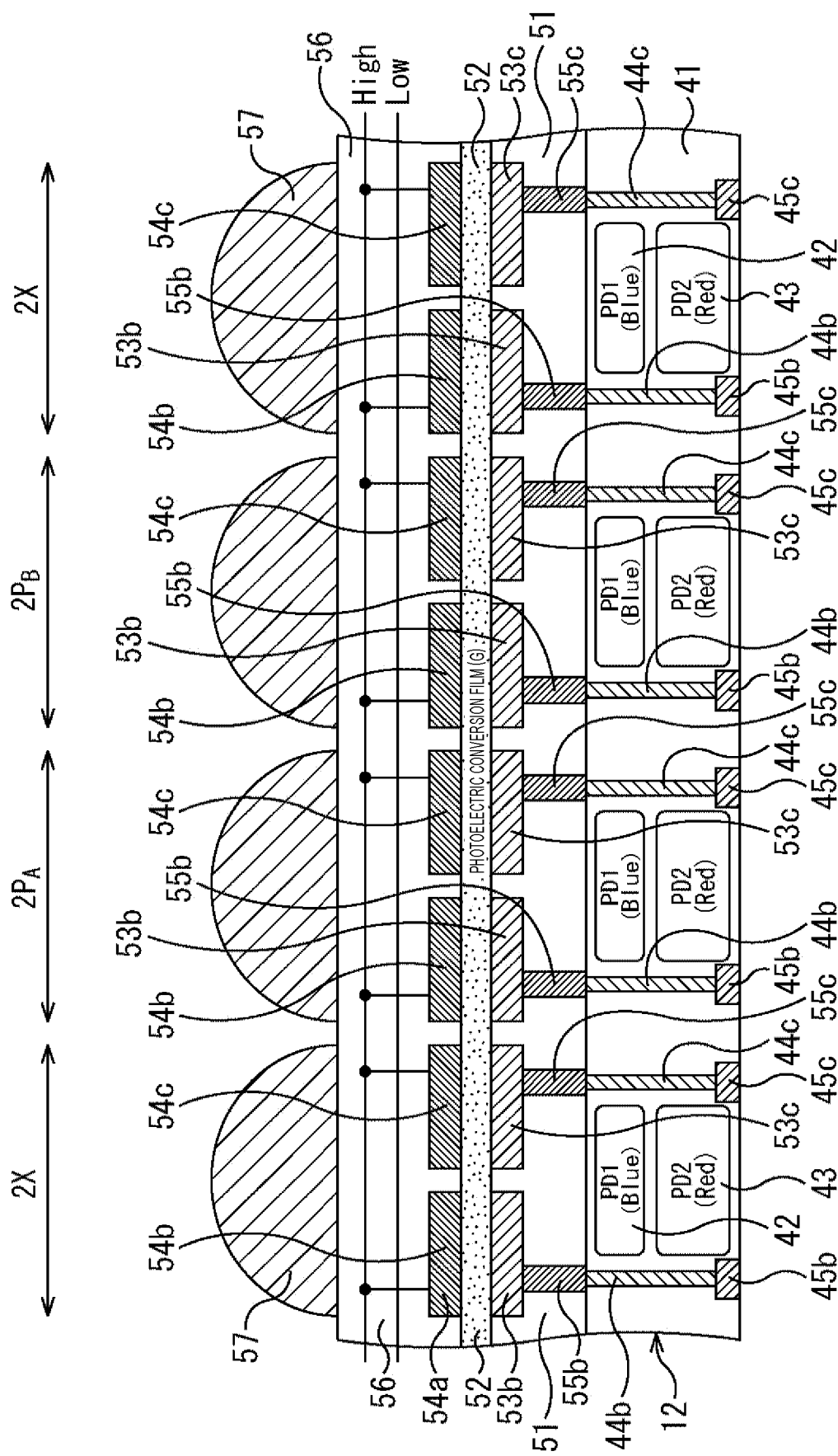
FIG. 21 is a diagram describing a driving method of acquiring an image signal in the fifth configuration example.

FIG. 21 is a diagram illustrating a method of setting a bias voltage to the upper electrode 54 of each pixel 2 in the case of acquiring the image signal.

In the case of acquiring the image signal, as illustrated in FIG. 21, a high bias voltage is applied to the upper electrodes 54 of the entire pixels in the pixel array portion 3. In each of the phase difference pixel 2P and the normal pixel 2X, the image signal is generated by the charge combining portion 64, the output circuit 7, or the like adding (combining) the signals, that is, the right opening signal and the left opening signal obtained in the two divided photoelectric conversion regions in the pixel. As a result, in the entire pixels of the phase difference pixel 2P and the normal pixel 2X in the pixel array portion 3, the image signal can be generated and output.

Therefore, according to the fifth configuration example, it is possible to acquire the phase difference signal from an arbitrary pixel 2. In addition, since the number of pixels used for phase difference detection can be increased, it is possible to perform auto-focusing at a higher accuracy.

In addition, according to the pixel structure of the fifth configuration example, the lower electrode 54 of each pixel 2 is divided into a first lower electrode 53*b* and a second lower electrode 53*c* corresponding to the first upper electrode 54*b* and the second upper electrode 54*c*. By doing so, in the phase difference signal acquisition period, when different bias voltages are applied to the first upper electrode 54*b* and the second upper electrode 54*c* in the phase difference pixel 2, it is possible to completely suppress the leak current flowing between the upper electrode 54 and the lower electrode 53 of the side where the low bias voltage is applied.

6.4 Second Driving Method in Phase Difference Signal Acquisition Period

Next, a second driving method of acquiring the phase difference signal in the pixel 2 according to the fifth configuration example will be described with reference to FIGS. 22 and 23.

Figure 22:
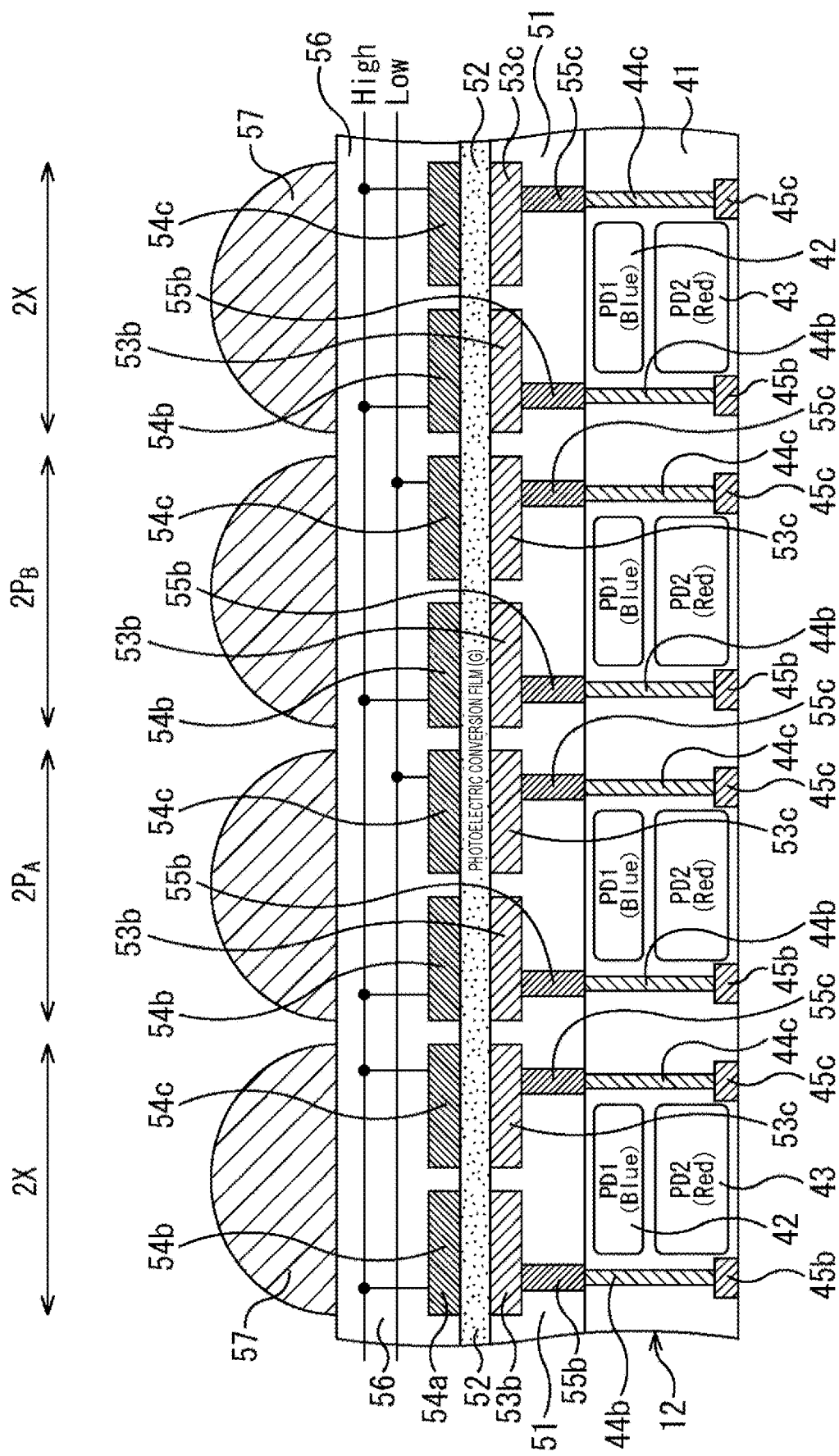
FIG. 22 is a diagram describing a second driving method of acquiring a phase difference signal in the fifth configuration example.
Figure 23:
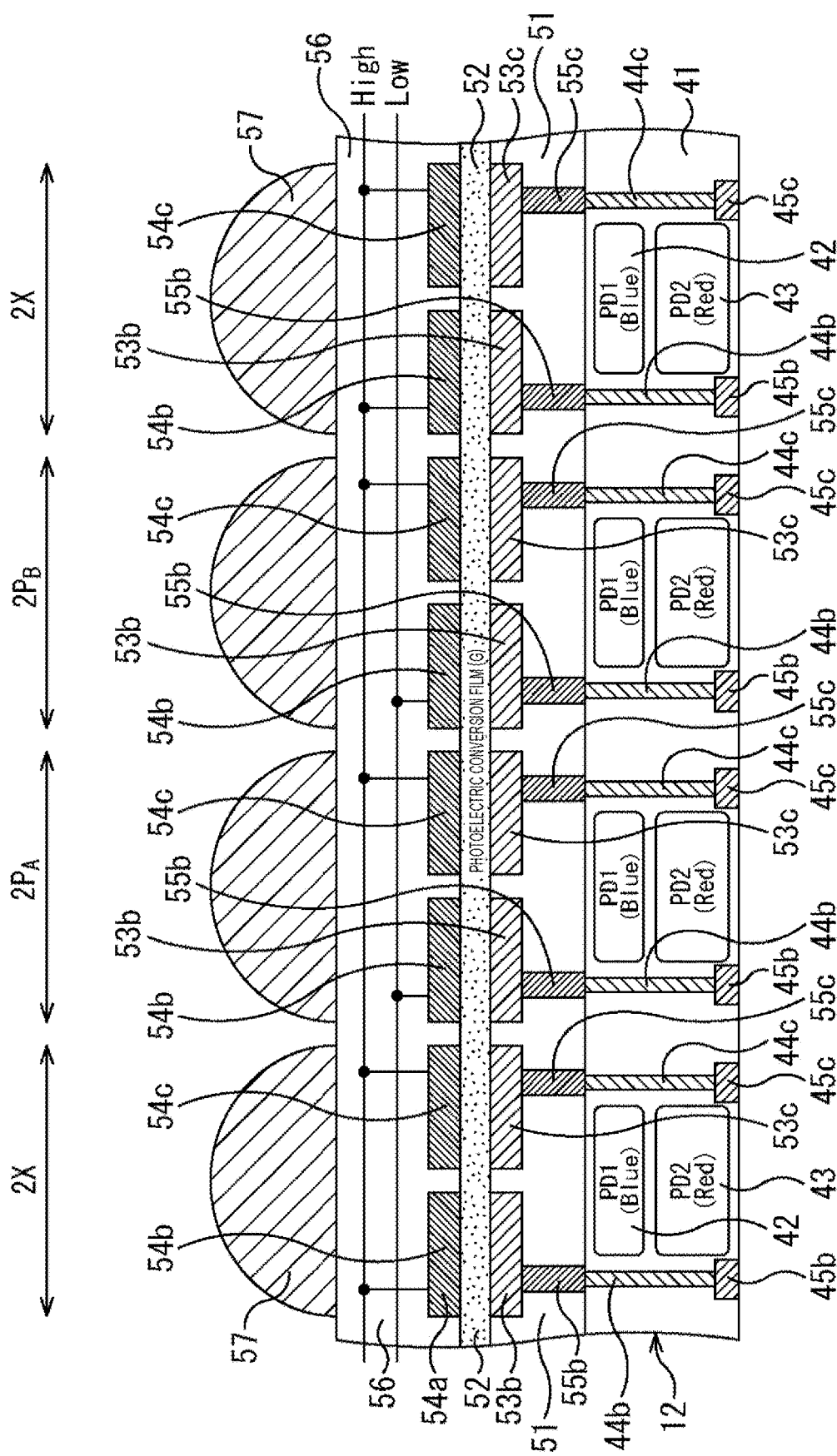
FIG. 23 is a diagram describing a second driving method of acquiring a phase difference signal in the fifth configuration example.

FIGS. 22 and 23 are diagrams illustrating a method of setting a bias voltage to the upper electrode 54 of each pixel 2 in the case of acquiring the phase difference signal.

The second driving method is similar to the second driving method in the first configuration example described with reference to FIGS. 8 and 9.

Namely, for example, in the first read operation for the phase difference signal, as illustrated in FIG. 22, in each of the phase difference pixels 2PA and 2PB, a high bias voltage is applied to the first upper electrode 54*b*, and a low bias voltage is applied to the second upper electrode 54*c*. By doing so, in the first read operation for the phase difference signal, the left opening signal is acquired from each of the phase difference pixels 2PA and 2PB.

In addition, in the second read operation for the phase difference signal, as illustrated in FIG. 23, in each of the phase difference pixels 2PA and 2PB, a low bias voltage is applied to the first upper electrode 54*b*, and a high bias voltage is applied to the second upper electrode 54*c*. By doing so, in the second read operation for the phase difference signal, the right opening signal is acquired from each of the phase difference pixels 2PA and 2PB.

In addition, as another order of acquisition, in the first read operation for the phase difference signal, the right opening signal may be acquired from each of the phase difference pixels 2PA and 2PB, and in the second read operation for the phase difference signal, the left opening signal may be acquired from each of the phase difference pixels 2PA and 2PB. Namely, the order of acquisition of the right opening signal and the left opening signal is arbitrary.

In addition, in the example of FIGS. 22 and 23, a high bias voltage is also applied to the first upper electrode 54*b* and the second upper electrode 54*c* in the normal pixel 2X, and the signal can also be acquired from the normal pixel 2X. However, the signal of the normal pixel 2X is not used. Therefore, in the case of acquiring the phase difference signal, a low bias voltage may be applied to the first upper electrode 54b and the second upper electrode 54c in the normal pixel 2X.

By the driving described above, in each of the phase difference pixels 2PA and 2PB, one set of phase difference signals of the photoelectric conversion regions having a position relationship of being symmetric with respect to the optical axis can be acquired. As a result, in the second driving method, since the number of pixels used for the phase difference detection can be increased in comparison with the first driving method, it is possible to perform auto-focusing at a higher accuracy.

In addition, in the above description, similarly to the other embodiments, the phase difference signal and the image signal are acquired in a time division manner. However, the driving of the image signal acquisition period is performed one time, and by the subsequent-stage output circuit 7 or an image signal processor (ISP) or the like as a subsequent stage of the solid-state imaging device 1, the left opening signal and the right opening signal may be directly used as the phase difference signal, and the addition signal of the left opening signal and the right opening signal may be used as the image signal.

In the second to fifth configuration examples, as described with reference to FIGS. 3 to 5, the arrangement and shape of the first upper electrode 54b and the second upper electrode 54c are arbitrary. In addition, in the above-described example, described is the example where the regions of first upper electrode 54b and the second upper electrode 54c are pupil-divided equally. However, if the first upper electrode 54b and the second upper electrode 54c acquiring one set of phase difference signals are asymmetric with respect to the optical axis of the incident light and are arranged to be symmetric with each other, the regions may be pupil-divided with an arbitrary division ratio.

7. Sixth Configuration Example of Pixel 7.1 Cross-Sectional Structure Diagram of Pixel In the above-described first to fifth configuration examples, each pixel 2 includes the first photoelectric conversion portion photoelectrically converting G (green) light outside the semiconductor substrate 12 and includes the second photoelectric conversion portion photoelectrically converting B (blue) light and the third photoelectric conversion portion photoelectrically converting R (red) light inside the substrate, and the solid-state imaging device 1 is configured to detect the phase difference by using the signal of G.

The phase difference detection method according to the present disclosure using the photoelectric conversion portion configured with the photoelectric conversion film 52 interposed between the lower electrode 53 and the upper electrode 54 may also be applied to the pixel structure other than the above-described vertical spectroscopic pixel structure.

Therefore, as an example of the pixel structure other than the vertical spectroscopic pixel structure, the sixth configuration example of the pixel 2 will be described with reference to FIG. 24.

Figure 24:
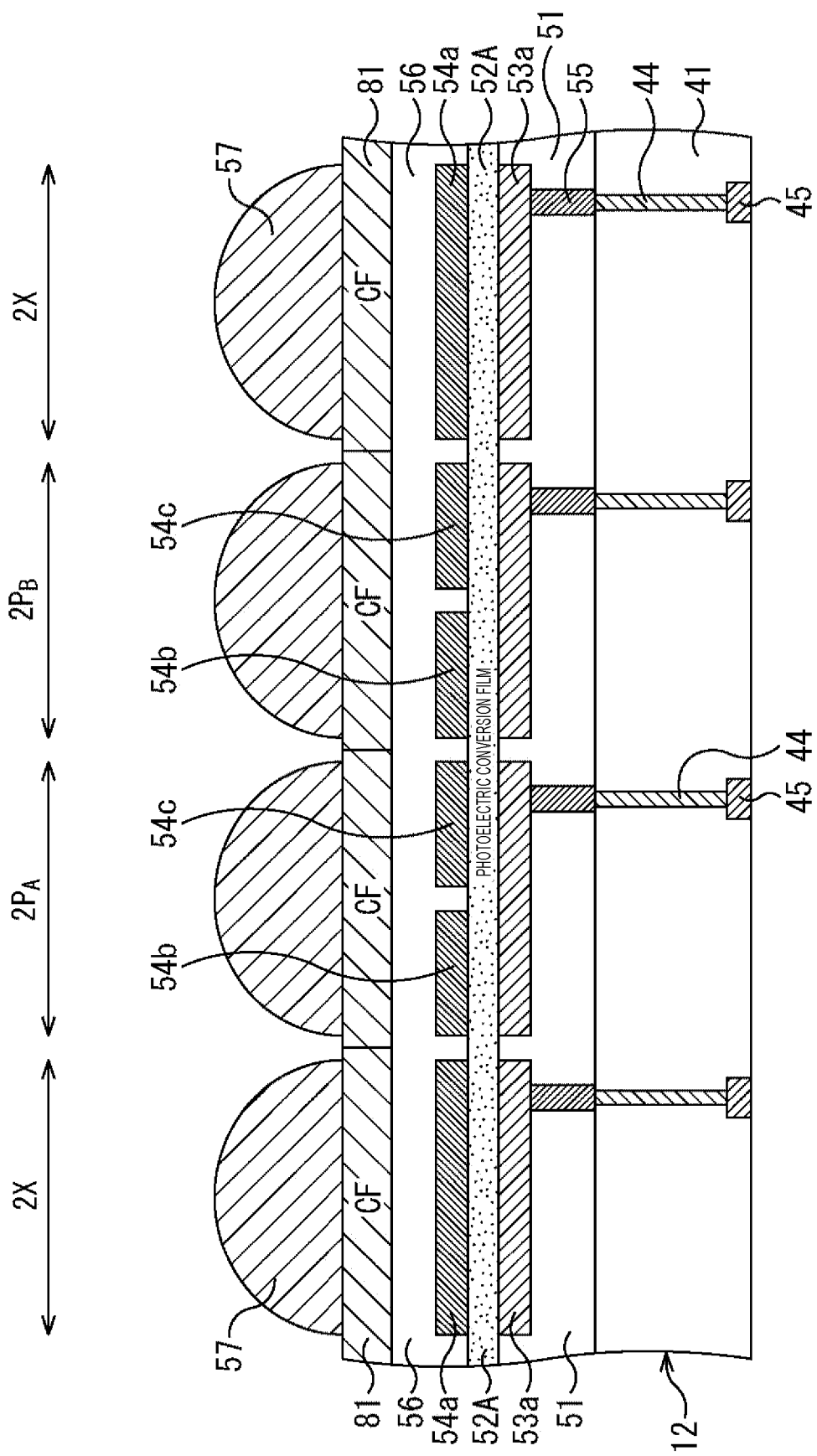
FIG. 24 is a cross-sectional structure diagram illustrating a sixth configuration example of a pixel in the first embodiment.

FIG. 24 illustrates a cross-sectional structure of the pixel 2 in the sixth configuration example.

In comparison of the pixel structure of the sixth configuration example with the pixel structure of the first configuration example illustrated in FIG. 2, in the sixth configuration example, the photodiodes PD1 and PD2 are not formed in the semiconductor substrate 12. In addition, in contrast with the first configuration example where the photoelectric conversion film 52 is formed with a material of photoelectrically converting the green wavelength light, in the sixth configuration example, a photoelectric conversion film 52A, so-called a panchromatic film photoelectrically converting light in the entire wavelength range of visible light is formed, and a color filter 81 is formed between the on-chip lens 57 and the photoelectric conversion film 52A.

The color filters 81 are formed so that, for example, the colors of R (red), G (green), and B (blue) are in a Bayer arrangement. By doing so, the photoelectric conversion film 52A photoelectrically converts light having a predetermined wavelength (color) which passes through the color filter 81. For example, the color filter 81 of the phase difference pixel 2P is associated with G (green) color, and the left opening signal and the right opening signal detecting the phase difference are set to the signal for the same color.

In addition, the color filters 81 may be configured so that, a combination of the colors of R (red), G (green), B (blue), and W (white) may be regularly arranged. The color filter 81 for W (white) is a film which transmits light in the entire wavelength range of visible light.

Even in the pixel structure, the acquisition of the phase difference signal according to the first driving method described with reference to FIG. 6, the acquisition of the image signal according to the driving method described with reference to FIG. 7, and the acquisition of the phase difference signal according to the second driving method described with reference to FIGS. 8 and 9 can be performed.

Therefore, the phase difference can be detected at a high sensitivity by using the photoelectric conversion film 52A (photoelectric conversion portion) provided outside the semiconductor substrate 12, it is possible to improve auto-focusing accuracy.

In addition, it is possible to obtain the phase difference signal by only controlling the bias voltage applied to the upper electrode 54, and in the case of acquiring an image signal, an image signal similar to a normal pixel 2X can be generated from the phase difference pixel 2P. In other words, the phase difference pixel 2P does not become a defective pixel, and an image signal can also be acquired from the phase difference pixel 2P.

In addition, in FIG. 24, although the above-described first configuration example is applied to the configurations of the lower electrode 53 and the upper electrode 54, needless to say, the other configurations of the second to fifth configuration examples may be similarly applied.

8. Example of Application to Electronic Device

The above-described solid-state imaging device 1 can be applied to various types of electronic devices, for example, imaging devices such as a digital still camera or a digital video camera, mobile phones having an imaging function, or an audio player having an imaging function.

Figure 25:
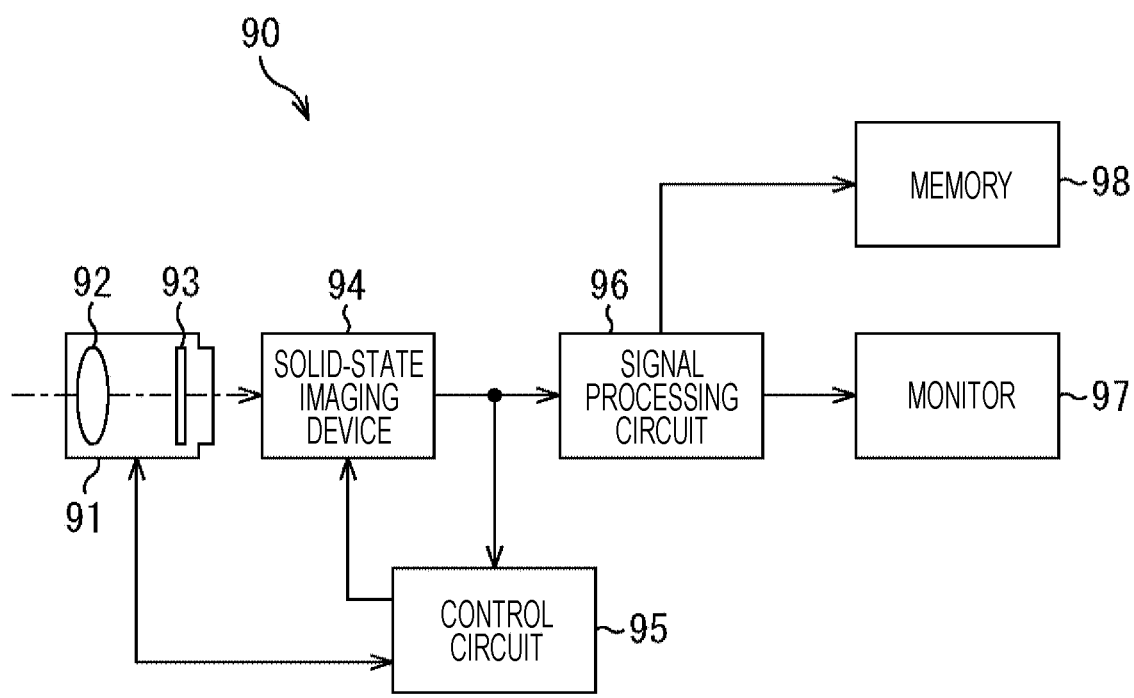
FIG. 25 is a block diagram illustrating a configuration example of an imaging device as an electronic device according to the present disclosure.

FIG. 25 is a block diagram illustrating a configuration example of an imaging device as an electronic device according to the present disclosure.

An imaging device 90 illustrated in FIG. 25 is configured to include an optical unit 91, a solid-state imaging device 94, a control circuit 95, a signal processing circuit 96, a monitor 97, and a memory 98 to be capable of capturing a still image and a moving picture.

The optical unit 91 is configured to include one or a plurality of image forming lenses 92, an aperture 93, and the like to guide light (incident light) from a subject to the solid-state imaging device 94 and to focus the light on a light reception plane of the solid-state imaging device 94.

The solid-state imaging device 94 is configured with the above-described solid-state imaging device 1. The solid-state imaging device 94 stores signal charges in a certain time interval according to the light focused on the light reception plane through the image forming lens 92 or the aperture 93. The signal charges stored in the solid-state imaging device 94 are transferred according to a driving timing (timing signal) supplied from the control circuit 95. The solid-state imaging device 94 may be configured as one chip by itself or may be configured as a portion of a camera module where the solid-state imaging device together with the optical unit 91, the signal processing circuit 96, or the like is packaged.

The control circuit 95 outputs a driving signal of controlling a transfer operation and a shutter operation of the solid-state imaging device 94 to drive the solid-state imaging device 94. In addition, the control circuit 95 adjusts the image forming lens 92 or the aperture 93 of the optical unit 91 on the basis of the pixel signal (phase difference signal or image signal) obtained from the solid-state imaging device 94.

The signal processing circuit 96 applies various types of signal processes on the pixel signal output from the solid-state imaging device 94. The image (image data) obtained by signal processing circuit 96 applying the signal processes is supplied to the monitor 97 to be displayed or is supplied to the memory 98 to be stored (recorded).

As described above, by using the solid-state imaging device 1 according to each embodiment as the solid-state imaging device 94, since the phase difference can be detected at a high sensitivity, it is possible to improve auto-focusing accuracy. Therefore, with respect to the imaging device 90 such as a video camera, a digital still camera, and a camera module for a mobile device such as a mobile phone, it is possible to obtain a captured image with a high image quality.

9. Second Embodiment of Solid-State Imaging Device

In recent years, interchangeable-lens digital cameras have rapidly spread. The interchangeable-lens digital camera is a camera of which the optical unit 91 can be changed by a user in the imaging device 90 illustrated in FIG. 25. In this case, the control circuit 95 can detect lens ID identifying the mounted optical unit 91 (image forming lens 92 thereof) from the optical unit 91.

The solid-state imaging device 1 used for the interchangeable-lens camera needs to cope with various types of lenses ranging from the image forming lens 92 having a short exit pupil distance to the image forming lens 92 having a long exit pupil distance.

However, in order to obtain phase difference auto-focusing performance with a high degree of light separation up to a high image height, the number of times of pupil division corresponding to the number of lens types is needed, and thus, the number of arranged phase difference pixels becomes large. In a case where the phase difference pixel cannot output an image signal like the normal pixel, the pixel becomes a defective pixel, the image signal needs to be obtained by interpolation or the like from the adjacent pixels. Therefore, it is desirable that the number of phase difference pixels arranged in the pixel array portion is small.

Therefore, hereinafter, as a second embodiment of the solid-state imaging device 1, a pixel structure capable of reducing the number of phase difference pixels arranged in the pixel array portion 3 will be described.

Figure 26:
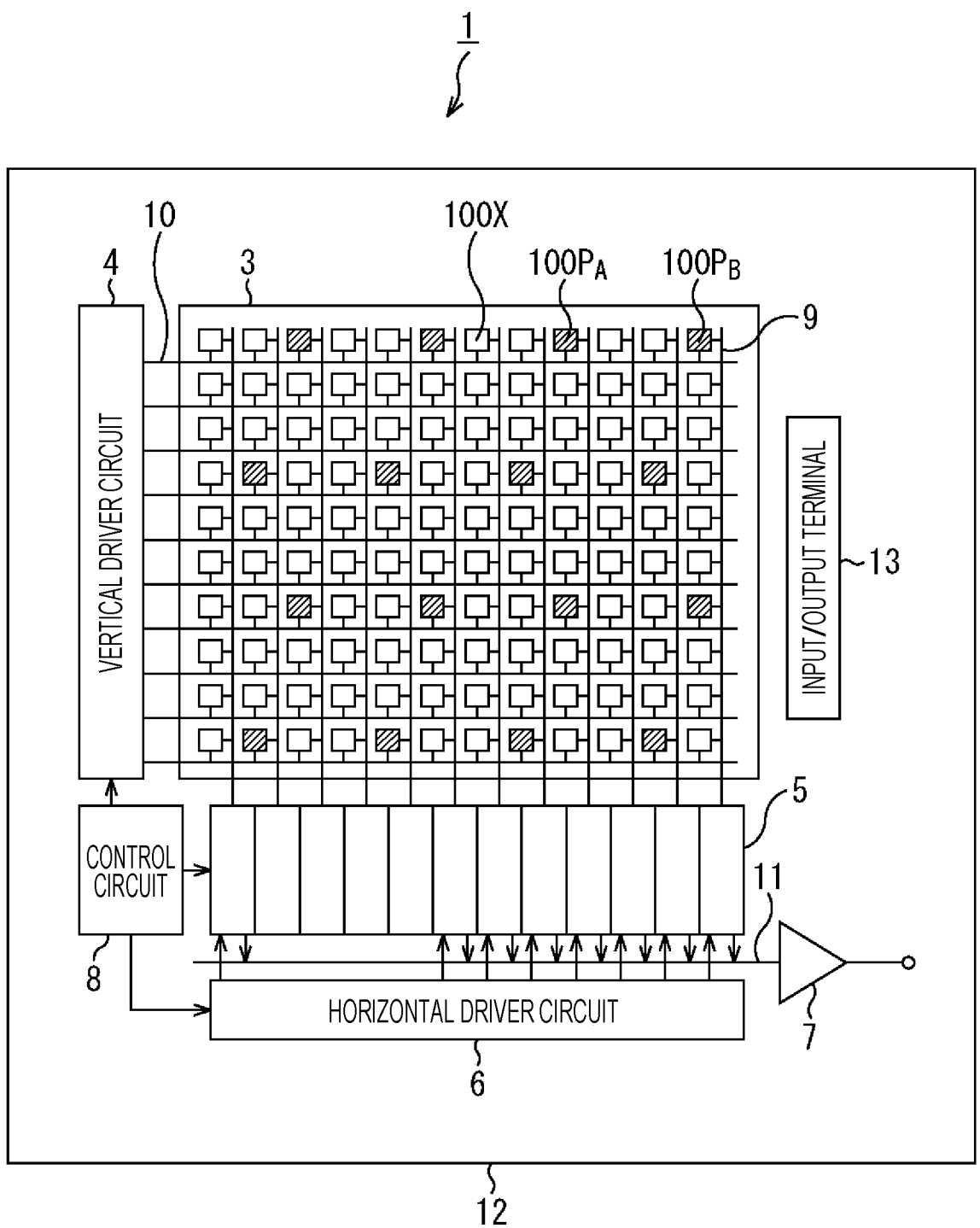
FIG. 26 is a block diagram illustrating a second embodiment of a solid-state imaging device according to the present disclosure.

FIG. 26 is a block diagram illustrating a second embodiment of a solid-state imaging device according to the present disclosure.

In the FIG. 26, portions corresponding to those of the first embodiment illustrated in FIG. 1 are denoted by the same reference numerals, and the description thereof is appropriately omitted.

In the second embodiment of the solid-state imaging device 1, in the pixel array portion 3, pixels 100 are two-dimensionally arranged in a matrix shape. The pixels 100 include normal pixels 100X generating a signal for image generation and phase difference pixels 100P generating a signal for focus detection. The phase difference pixels 100P include phase difference pixels 100PA and 100PB of which charge generation regions have a position relationship of being symmetric with respect to the optical axis.

In the above-described first embodiment of the solid-state imaging device 1, similarly to the normal pixel 2X, the phase difference pixel 2P can also output the signal for image generation (image signal) by controlling the bias voltage applied to the upper electrode 54.

However, in the second embodiment, the phase difference pixel 100P cannot output the signal for image generation (image signal) like the normal pixel 100X, but the number of phase difference pixels 100P arranged in the pixel array portion 3 can be reduced from the related art.

In the second embodiment, for example, as illustrated in FIG. 26, with respect to the normal pixels 100X arranged in a matrix shape in the pixel array portion 3, a portion of or the entire normal pixels 100X in a predetermined pixel row are configured to be replaced by the phase difference pixels 100P. The configurations other than that of the solid-state imaging device 1 in the second embodiment are similar to those of the above-described first embodiment, and thus, the description thereof is omitted.

10. First Configuration Example of Pixel 10.1 Cross-Sectional Structure Diagram of Pixel A first configuration example of the pixel 100 of the solid-state imaging device 1 according to the second embodiment will be described with reference to FIG. 27.

Figure 27:
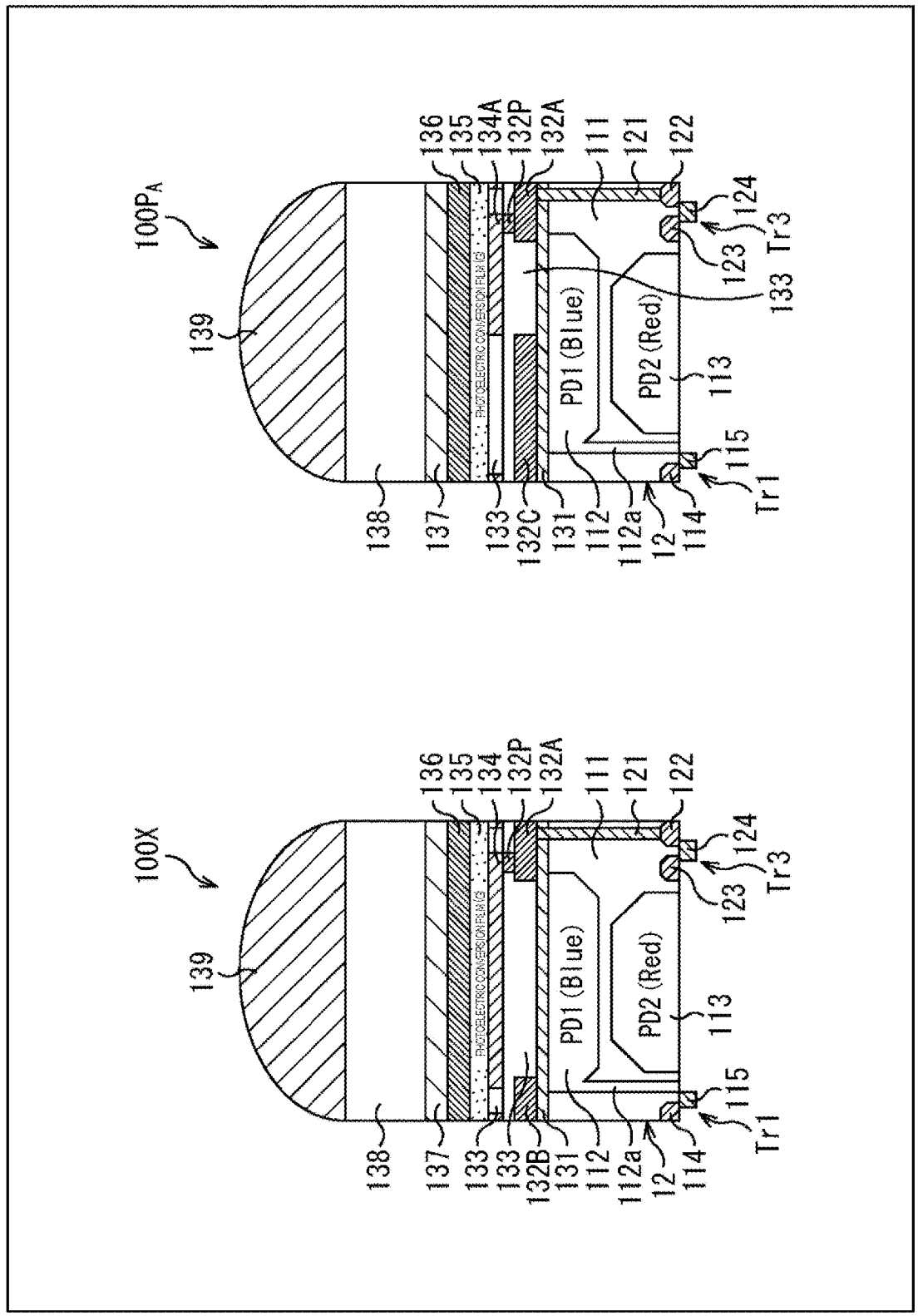
FIG. 27 is a cross-sectional structure diagram illustrating a first configuration example of a pixel in the second embodiment.

FIG. 27 illustrates a cross-sectional structure of a normal pixel 100X and a phase difference pixel 100PA.

In the description of FIG. 27, first, the pixel structure of the normal pixel 100X will be described, and after that, with respect to the phase difference pixel 100PA, only the portions different from those of the normal pixel 100X will be described.

The pixel structure of the normal pixel 100X is described.

By stacking second conductive type (for example, N type) semiconductor regions 112 and 113 in the depth direction in a first conductive type (for example, p type) semiconductor region 111 of the semiconductor substrate 12, photodiodes PD1 and PD2 are formed in the depth direction by PN junction. The photodiode PD1 having the semiconductor region 112 as a charge storage region is a photoelectric conversion portion which receives and photoelectrically converts blue light and, and the photodiode PD2 having the semiconductor region 113 as a charge storage region is a photoelectric conversion portion which receives and photoelectrically converts red light.

A portion of the semiconductor region 112 of the photodiode PD1 includes an extension portion 112a formed by extending to reach the front surface side of the semiconductor substrate 12. The semiconductor region 112 of the photodiode PD1 also serves as one of source/drain regions of the pixel transistor Tr1 for reading the charges stored therein. The pixel transistor Tr1 is configured to include a semiconductor region 112 which is one of the source/drain regions, a second conductive type semiconductor region 114 which is the other of the source/drain regions, and a gate electrode 115. With respect to the semiconductor region 113 of the photodiode PD2, a pixel transistor for reading charges stored in the semiconductor region 113 is also formed, but omitted in illustration.

In addition, in the semiconductor substrate 12, conductive plugs 121 for extracting charges photoelectrically converted by the later-described photoelectric conversion film 135 to the substrate front surface side (lower side in the figure) are formed to penetrate the semiconductor substrate 12 (semiconductor region 41 thereof). In addition, although not illustrated, outer circumferences of the conductive plug 121 are insulated by an insulating film of SiO2, SiN, or the like.

The conductive plug 121 is connected to a charge retaining portion 122 which is formed as the second conductive type (for example, N type) semiconductor region inside the semiconductor region 111. The charge retaining portion 122 temporarily retains the charges photoelectrically converted by the photoelectric conversion film 135 until the charges are read. The charges retained in the charge retaining portion 122 are read by the pixel transistor Tr3. The pixel transistor Tr3 is configured to include a gate electrode 124, a second conductive type semiconductor region 123 as a source/drain region, and a charge retaining portion 122.

On the interface of the back surface side (upper side in the figure) of the semiconductor substrate 12, an anti-reflective film 131 is formed, and in the pixel boundary portion on the anti-reflective film 131, light shielding films 132A and 132B are formed with a conductive material such as tungsten (W), aluminum (Al), or copper (Cu). The light shielding film 132A is connected through a contact portion 132P formed with the same material to the lower electrode 134 and is also connected to the conductive plug 121. By doing so, the light shielding film 132A has a function of transferring the charges generated in the photoelectric conversion film 135 to the conductive plug 121. In addition, the light shielding film 132A and the light shielding film 132B are electrically separated from each other.

The upper sides of the light shielding films 132A and 132B and the upper side of the anti-reflective film 131 are planarized by an insulating film 133, and on the insulating film 133, a lower electrode 134, a photoelectric conversion film 135, and an upper electrode 136 are formed in this order.

The photoelectric conversion film 135, the lower electrode 134 under the photoelectric conversion film, and the upper electrode 136 on the photoelectric conversion film constitute a photoelectric conversion portion photoelectrically converting green wavelength light.

On the upper electrode 136, a passivation film 137 is formed, and on the passivation film 137, a high refractive index layer 138 and an on-chip lens 139 are formed. The high refractive index layer 138 and the on-chip lens 139 may be formed with the same material.

The semiconductor regions 111 to 113 of the normal pixel 100X correspond to the semiconductor regions 41 to 43 of the normal pixel 2X according to the first embodiment, respectively, and the lower electrode 134, the photoelectric conversion film 135, and the upper electrode 136 of the normal pixel 100X correspond to the lower electrode 53a, the photoelectric conversion film 52, and the upper electrode 54a of the normal pixel 2X according to the first embodiment, respectively. As a material of each film, a similar material to that of the above-described first embodiment may be used.

Therefore, similarly to the normal pixel 2X of the first embodiment, the pixel structure of the normal pixel 100X is also a vertical spectroscopic pixel structure where the green light is photoelectrically converted by the photoelectric conversion film 135 formed outside the semiconductor substrate (silicon layer) 12, and the blue light and the red light are photoelectrically converted by the photodiodes PD1 and PD2 in the semiconductor substrate 12.

However, in the normal pixels 2X according to the first embodiment, the upper electrodes 54a are formed to be separated in unit of a pixel, and on the contrary, in the normal pixels 100X according to the second embodiment, the upper electrodes 136 are formed to be continuous over the entire surface of the pixel array portion 3.

Next, the pixel structure of the phase difference pixel 100PA will be described. In addition, in the description of the pixel structure of the phase difference pixel 100PA, only the portions different from those of the normal pixel 100X will be described.

In the phase difference pixel 100PA, the light shielding film 132B formed in the pixel boundary portion in the normal pixel 100X is replaced by a light shielding film 132C. The light shielding film 132C is formed to cover the one-side half (left half in FIG. 27) of the light reception region of the photodiodes PD1 and PD2. The light reception region of the photodiodes PD1 and PD2 in the planar direction becomes the right-half region of the semiconductor regions 112 and 113.

In addition, in the phase difference pixel 100PA, the lower electrode 134A is formed only in the region corresponding to the right half of the lower electrode 134 of the normal pixel 100X. In other words, the lower electrode 134A is formed only in the upper side of the opening region of the light shielding films 132A and 132C. In the region where the lower electrode 134A corresponding to the left half of the lower electrode 134 of the normal pixel 100X is not formed, an insulating film 133 is buried.

The other structures of the phase difference pixel 100PA are similar to those of the normal pixel 100X.

The phase difference pixel 100PA having the above-described configuration is configured so that the photoelectric conversion region of the three-layered photoelectric conversion portion photoelectrically converting the incident light of R, G, and B is a planar region being asymmetric with respect to the optical axis of the incident light. More specifically, the region of the photoelectric conversion film 135 interposed by the upper electrode 136 and the lower electrode 134A is a right-half region of the pixel. In addition, the light reception regions of the photodiodes PD1 and PD2 as the opening portions of the light shielding films 132A and 132C are right-half regions of the pixel.

In addition, although not illustrated, the phase difference pixel 100PB which together with the phase difference pixel 100PA constitutes a pair of pixels is configured to be a left-half region of the pixel where the photoelectric conversion region of the three-layered photoelectric conversion portion photoelectrically converting incident light of R, G, and B and the phase difference pixel 100PA have a position relationship of being symmetric with respect to the optical axis.

Therefore, in the phase difference pixel 100PA, the right opening signal can be acquired, and in the phase difference pixel 100PB, the left opening signal can be acquired. Accordingly, in the phase difference pixels 100PA and 100PB constituting a pair of pixels, one set of phase difference signals of the photoelectric conversion regions having a position relationship of being symmetric with respect to the optical axis can be acquired. By using the phase difference signal, it is possible to achieve auto-focusing.

In addition, in the above-described example, described is the example where, in the phase difference pixels 100PA and 100PB constituting a pair of pixels, the charge generation regions of the three-layered photoelectric conversion portion where the charges are generated are formed to be symmetric in the horizontal direction (left-right direction of the paper). However, similarly to the first embodiment, the structure where the charge generation regions are formed to be symmetric in the vertical direction (up-down direction of the paper) or the diagonal direction (oblique direction of the paper) may be used as a matter of course.

10.2 Light Reception Angle Distribution Characteristics

Light reception angle distribution characteristics of the normal pixel 100X and the phase difference pixel 100PA will be described with reference to FIG. 28.

Figure 28:
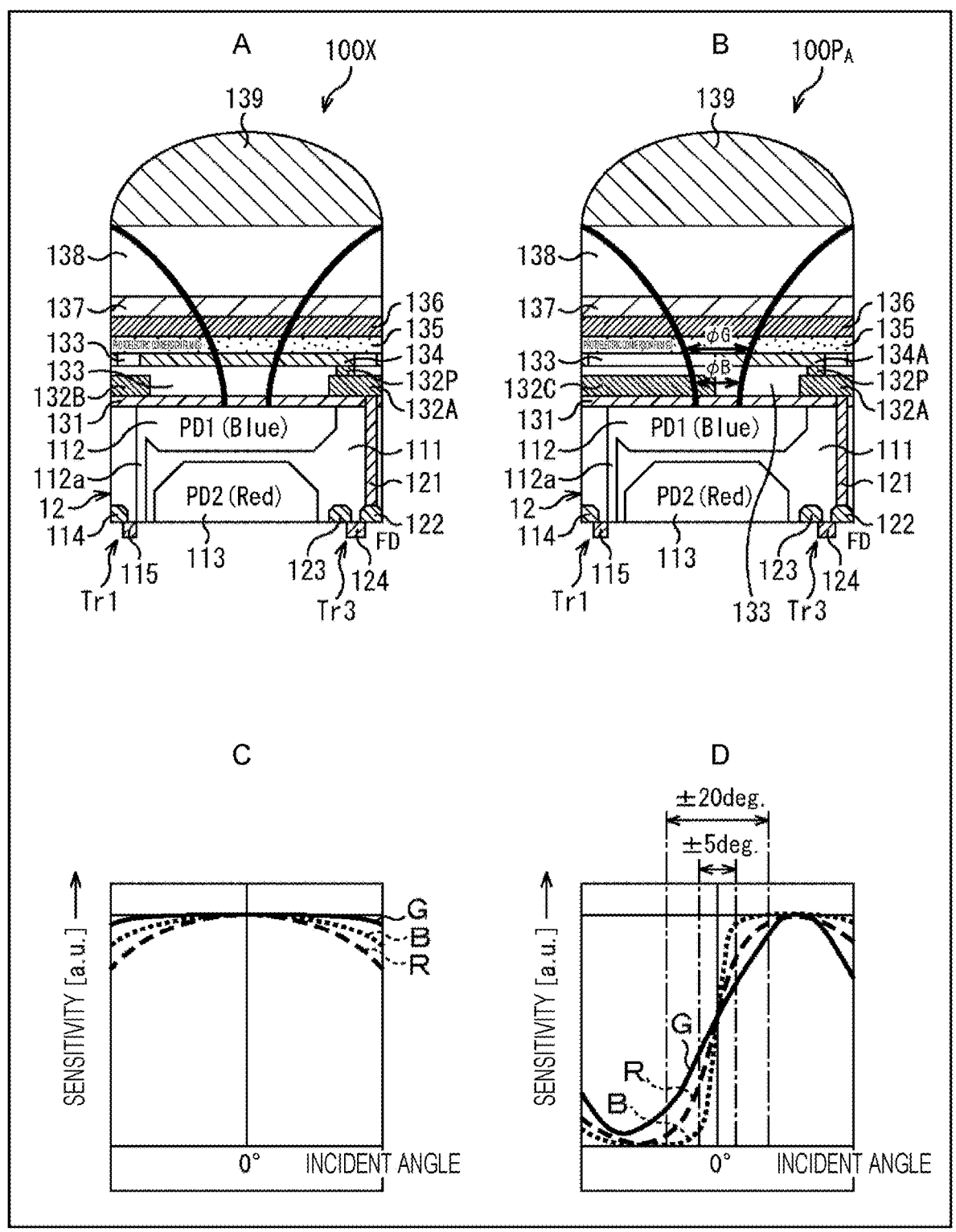
FIG. 28 is a diagram describing light reception angle distribution characteristics.

In A of FIG. 28 and B of FIG. 28, a light-condensed state of the incident light in the normal pixel 100X and the phase difference pixel 100PA is indicated by bold solid lines.

C of FIG. 28 illustrates light reception angle distributions of incident light of R, G, and B in the normal pixel 100X, and D of FIG. 28 illustrates light reception angle distributions of incident light of R, G, and B in the phase difference pixel 100PA. The horizontal axis of the light reception angle distribution denotes an incident angle of light, and the vertical axis denotes sensitivity (output value) of the pixel according to the incident light.

In the normal pixel 100X, as illustrated in C of FIG. 28, the photoelectric conversion portions of R, G, and B have a sufficient sensitivity of light reception over a wide range of the incident angle.

On the contrary, since only the right-half region of the pixel becomes a charge generation region, as illustrated in D of FIG. 28, the phase difference pixel 100PA has light reception sensitivity characteristics where the sensitivity in the right side from the incident angle of 0° is high, the sensitivity in the left side from the incident angle of 0° is low, and the sensitivity is linearly changed in the vicinity of the incident angle of 0°.

In addition, with respect to the slope of the sensitivity change in the vicinity of the incident angle of 0° as a region where the sensitivity is linearly changed, the slope of the B signal is steepest, and the slop of the G signal is gentlest. This is because, as illustrated in B of FIG. 28, the positions of the three-layered photoelectric conversion portion of R, G, and B in the height direction (depth direction) are different from each other, and the light-condensed spot diameter G of the incident light in the G photoelectric conversion portion and the light-condensed spot diameter B of the incident light in the B photoelectric conversion portion are different from each other.

The slope of the sensitivity change of the B signal having a small light-condensed spot diameter of the incident light becomes steep, and thus, the light separation performance (degree of light separation) is high. The slope of the sensitivity change of the G signal having a large light-condensed spot diameter of the incident light becomes gentle, and thus, the light separation performance (degree of light separation) is lower than that of the B light.

However, in the range of the incident angle where the sensitivity is linearly changed, the light separation performance is good, and thus, the signal can be used as a signal for focus detection.

The range of the incident angle where the sensitivity is linearly changed is, for example, about ±5° (degrees) for the B signal having high light separation performance, and about ±20° (degrees) for the G signal having low light separation performance. Therefore, the G signal can cope with a wider range of the incident angle than the B signal can.

In the second embodiment of the solid-state imaging device 1, in one phase difference pixel 100P, by acquiring plural types (two or more types) of the phase difference signals by using a plurality of the photoelectric conversion portions of which the light-condensed spot diameters are different, it is possible to cope with a wide range of types of lenses ranging from the image forming lens 92 having a short exit pupil distance to the image forming lens 92 having a long exit pupil distance. In addition, since one phase difference pixel 100P can cope with a wide range of types of lenses, it is possible to reduce the number of phase difference pixels 100P arranged in the pixel array portion 3, and it is possible to reduce the number of pixels which are treated as defective pixels.

In addition, one phase difference pixel 100P can cope with a wide range of types of lenses, and thus, the number of types of pupil division can be reduced, so that it is possible to alleviate problems of an increase in load due to complicated signal processes, a loss of a degree of freedom in adding or culling of a moving picture, and a deterioration in image quality due to correction marks.

In addition, in the second embodiment of the solid-state imaging device 1, in one phase difference pixel 100P, two phase difference signals of the G signal and the B signal are configured to be detected. However, only the G signal as the phase difference signal may be configured to be detected. Even in this case, the G photoelectric conversion portion is formed in the layer closer to the on-chip lens 139 than to the semiconductor substrate 12, and thus, the light-condensed spot diameter G of incident light in the G photoelectric conversion portion is increased, so that it is possible to cope with a wide range of types of lenses.

11. Second Configuration Example of Pixel

A second configuration example of the pixel 100 of the solid-state imaging device 1 according to the second embodiment will be described with reference to FIG. 29.

Figure 29:
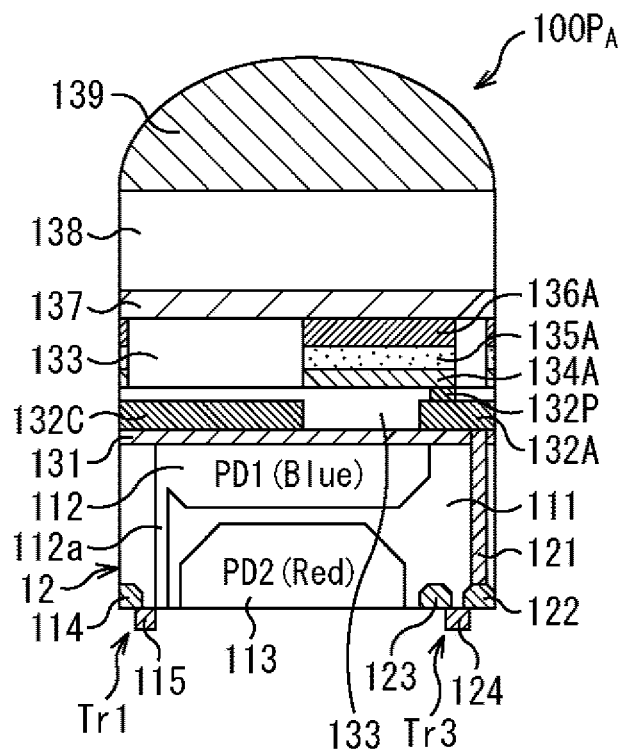
FIG. 29 is a cross-sectional structure diagram illustrating a second configuration example of a pixel in the second embodiment.

FIG. 29 illustrates a cross-sectional structure of a phase difference pixel 100PA in the second configuration example.

In addition, in the second to fifth configuration examples described hereinafter, only the portions different from those of the first configuration example illustrated in FIG. 27 will be described. In addition, in the second to fifth configuration examples, the configuration of the normal pixel 100X is the same as that of the first configuration example illustrated in FIG. 27, an thus, the description thereof is omitted.

In the second configuration example, a photoelectric conversion film 135A and an upper electrode 136A constituting a portion of the photoelectric conversion portion photoelectrically converting green light are changed from the photoelectric conversion film 135 and the upper electrode 136 in the first configuration example. Namely, in the second configuration example, the photoelectric conversion film 135A and the upper electrode 136A are also formed only in the region corresponding to the right half as a region facing the lower electrode 134A. In the portion where the photoelectric conversion film 135A and the upper electrode 136A on the light shielding films 132C and 132A are removed, an insulating film 133 is buried.

In the second configuration example of the phase difference pixel 100PA described above, in one phase difference pixel 100P, by acquiring plural types (two or more types) of the phase difference signals by using a plurality of the photoelectric conversion portions of which the light-condensed spot diameters are different, it is possible to cope with a wide range of types of lenses ranging from the image forming lens 92 having a short exit pupil distance to the image forming lens 92 having a long exit pupil distance. In addition, since one phase difference pixel 100P can cope with a wide range of types of lenses, it is possible to reduce the number of phase difference pixels 100P arranged in the pixel array portion 3, and it is possible to reduce the number of pixels which are treated as defective pixels.

12. Third Configuration Example of Pixel

A third configuration example of the pixel 100 of the solid-state imaging device 1 according to the second embodiment will be described with reference to FIG. 30.

Figure 30:
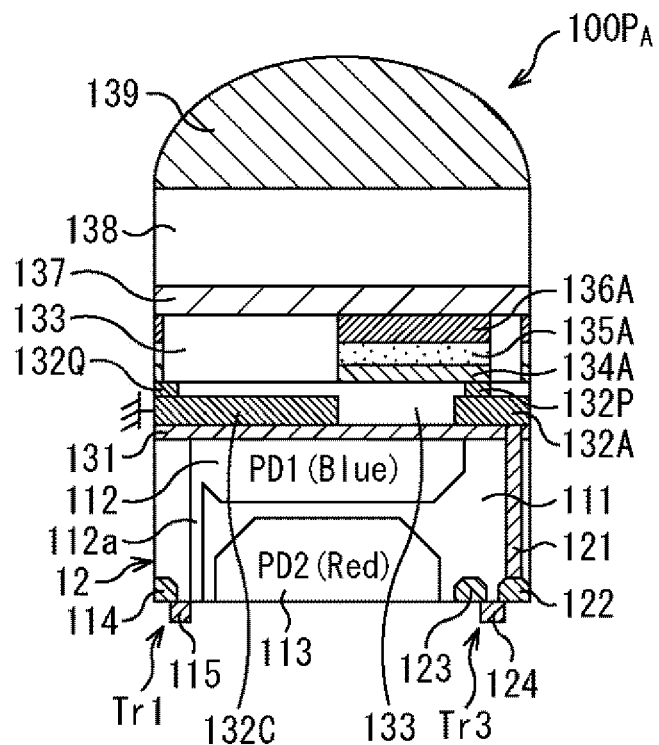
FIG. 30 is a cross-sectional structure diagram illustrating a third configuration example of a pixel in the second embodiment.

FIG. 30 illustrates a cross-sectional structure of a phase difference pixel 100PA in the third configuration example.

In the third configuration example, similarly to the second configuration example illustrated in FIG. 29, the photoelectric conversion film 135A and the upper electrode 136A are formed only in the region corresponding to the right half corresponding to the lower electrode 134A. In the portion where the photoelectric conversion film 135A and the upper electrode 136A on the light shielding films 132C and 132A are removed, an insulating film 133 is buried.

Therefore, in the third configuration example, in one phase difference pixel 100P, by acquiring plural types (two or more types) of the phase difference signals by using a plurality of the photoelectric conversion portions of which the light-condensed spot diameter are different, it is possible to cope with a wide range of types of lenses ranging from the image forming lens 92 having a short exit pupil distance to the image forming lens 92 having a long exit pupil distance. In addition, since one phase difference pixel 100P can cope with a wide range of types of lenses, it is possible to reduce the number of phase difference pixels 100P arranged in the pixel array portion 3, and it is possible to reduce the number of pixels which are treated as defective pixels.

In addition, in the third configuration example, the light shielding film 132C shielding the left halves of the photodiodes PD1 and PD2 is connected to GND and is also connected through a contact portion 132Q formed with the same material as the light shielding film 132C to the lower electrode 134 on the contact portion.

By doing so, the unnecessary charges which are generated in the portions other than the G photoelectric conversion portion configured with the lower electrode 134A, the photoelectric conversion film 135A, and the upper electrode 136A and are not used as the phase difference signal may be discharged to GND.

13. Fourth Configuration Example of Pixel

A fourth configuration example of the pixel 100 of the solid-state imaging device 1 according to the second embodiment will be described with reference to FIG. 31.

Figure 31:
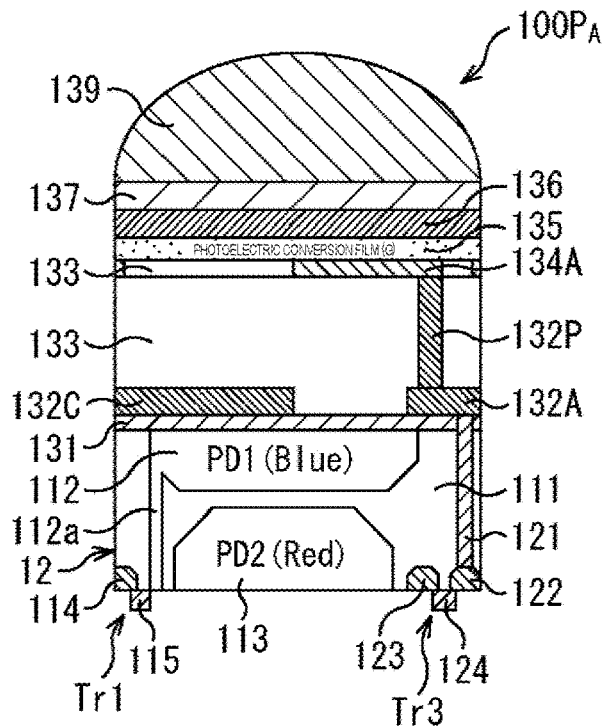
FIG. 31 is a cross-sectional structure diagram illustrating a fourth configuration example of a pixel in the second embodiment.

FIG. 31 illustrates a cross-sectional structure of a phase difference pixel 100PA in the fourth configuration example.

In the fourth configuration example, the high refractive index layer 138 under the on-chip lens 139 is omitted or formed to be thin (omitted in FIG. 31), and the insulating film 133 on the light shielding films 132A and 132C is formed to be thick. By doing so, in the fourth configuration example, in comparison with the first configuration example, the layer position of the G photoelectric conversion portion including the photoelectric conversion film 135, the lower electrode 134A, and the upper electrode 136 is moved to the position close to the on-chip lens 139. As a result, the light-condensed spot diameter G of incident light in the G photoelectric conversion portion is increased in comparison with the first configuration example, the configuration example copes with a wider range of incident angle.

In this manner, by adjusting the layer position of the G photoelectric conversion portion, the lens coverage of the G phase difference signal and the B phase difference signal (or R phase difference signal) can be adjusted.

14. Fifth Configuration Example of Pixel

A fifth configuration example of the pixel 100 of the solid-state imaging device 1 according to the second embodiment will be described with reference to FIG. 32.

Figure 32:
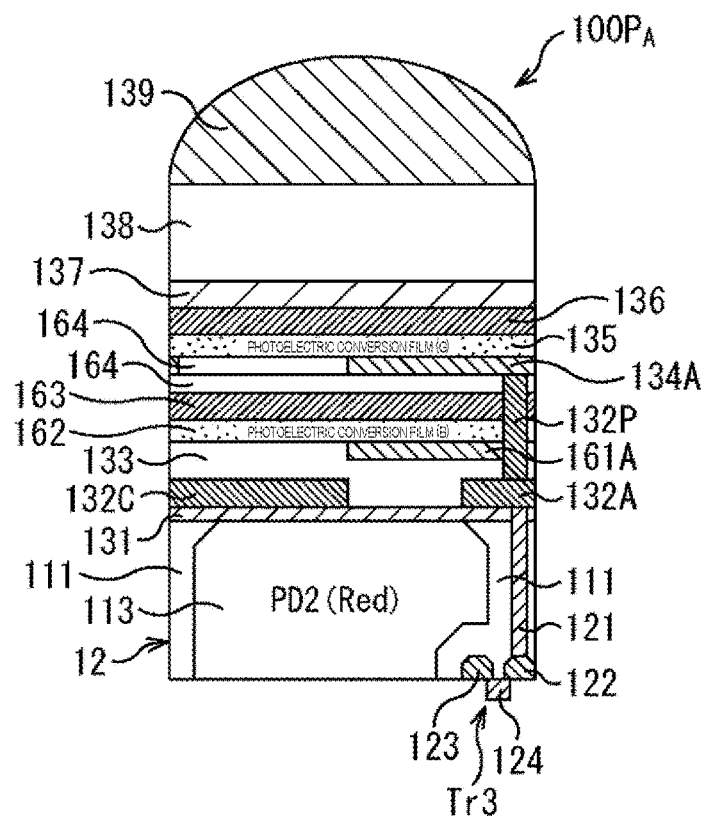
FIG. 32 is a cross-sectional structure diagram illustrating a fifth configuration example of a pixel in the second embodiment.

FIG. 32 illustrates a cross-sectional structure of a phase difference pixel 100PA in the fifth configuration example.

In the fifth configuration example, two photoelectric conversion portions photoelectrically converting G light and B light are formed outside the semiconductor substrate 12, and a photoelectric conversion portion photoelectrically converting R light is formed inside the semiconductor substrate 12.

Specifically, a first photoelectric conversion portion photoelectrically converting G light is formed by a photoelectric conversion film 135, a lower electrode 134A under the photoelectric conversion film, and an upper electrode 136 on the photoelectric conversion film, and below the photoelectric conversion portion, and a second photoelectric conversion portion photoelectrically converting B light is formed by a photoelectric conversion film 162, a lower electrode 161A under the photoelectric conversion film, and an upper electrode 163 on the photoelectric conversion film. The upper electrode 163, the lower electrode 134A of the first photoelectric conversion portion and the upper electrode 163 of the second photoelectric conversion portion are separated from each other by the insulating film 164. The lower electrode 134A and the lower electrode 161A are formed only in the region corresponding to the right half of the lower electrode 134 of the normal pixel 100X.

Similarly to the contact portion 132P, the light shielding film 132A, and the conductive plug 121 in the first photoelectric conversion portion, the charges generated in the second photoelectric conversion portion are transferred to the front surface side (lower side in the figure) of the semiconductor substrate 12.

As a material of the photoelectric conversion film 135 photoelectrically converting G light, as described above, for example, an organic photoelectric conversion material including a rhodamine based dye, a melacyanine based dye, quinacridone, and the like may be used. As a material of the photoelectric conversion film 162 photoelectrically converting B light, as described above, for example, an organic photoelectric conversion material including coumarin based dye, tris-8-hydrioxyquinoline Al (Alq3), a melacyanine based dye, and the like may be used.

In addition, in the first conductive type (for example, P type) semiconductor region 111 in the semiconductor substrate 12, the semiconductor region 112 corresponding to the photodiode PD1 of the first configuration example is omitted, and the semiconductor region 113 corresponding to the photodiode PD2 is formed in the depth direction from the interface of the anti-reflective film 131 of the semiconductor substrate 12. The light reception region of the photodiode PD2 in the planar direction becomes the right-half region of the semiconductor region 112 by the light shielding film 132C.

In the fifth configuration example, in comparison of the sizes of the light-condensed spot diameter among the three layers of the photoelectric conversion portions for R, G, and B light, the positions thereof in the height direction (depth direction) are different, and thus, the light-condensed spot diameter is increased in the order of the G photoelectric conversion portion, the B photoelectric conversion portion, and the R photoelectric conversion portion. By doing so, since degrees of light separation are classified into three steps, by appropriately selecting the phase difference signal obtained from each of the photoelectric conversion portions, it is possible to cope with a wide range of types of lenses ranging from the image forming lens 92 having a short exit pupil distance to the image forming lens 92 having a long exit pupil distance.

15. Example of Arrangement of Phase Difference Pixels

According to the pixel structure of the phase difference pixel 100P employed as the second embodiment of the solid-state imaging device 1, one pixel is provided with a plurality of the photoelectric conversion portions of which the light-condensed spot diameters are different, and it is possible to cope with a wide range of types of lenses ranging from the image forming lens 92 having a short exit pupil distance to the image forming lens 92 having a long exit pupil distance. This point will be described in detail with reference to figures.

Figure 33:
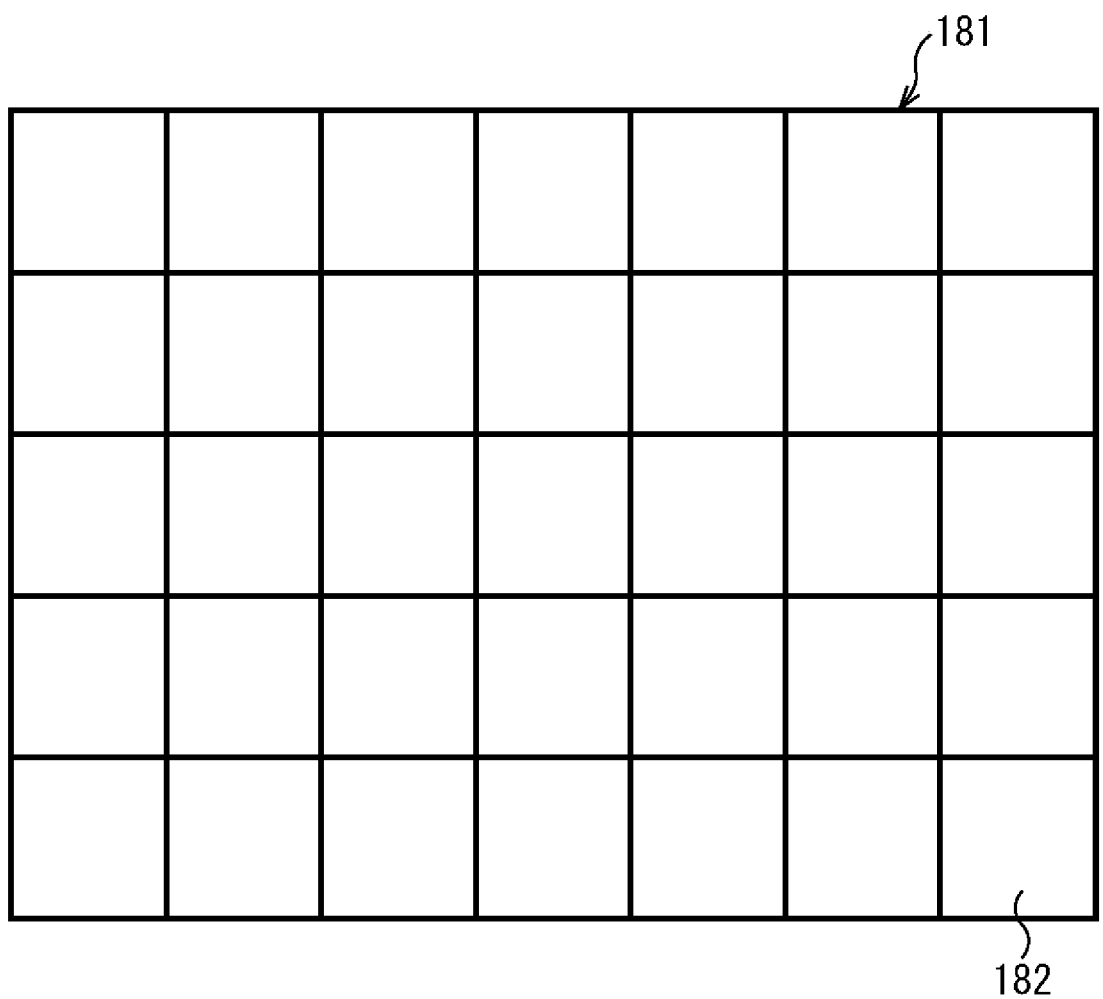
FIG. 33 is a diagram describing an example of arrangement of a phase difference pixel.

For example, as illustrated in FIG. 33, the imaging region 181 corresponding to the pixel array portion 3 is divided into a plurality of auto-focusing (AF) areas 182. The AF area 182 is a unit of calculation of a defocus amount in the case of performing auto-focusing. For example, while attending to the defocus amount of one or more AF areas 182 in the imaging region 181, the position of the image forming lens 92 can be controlled.

Figure 34:
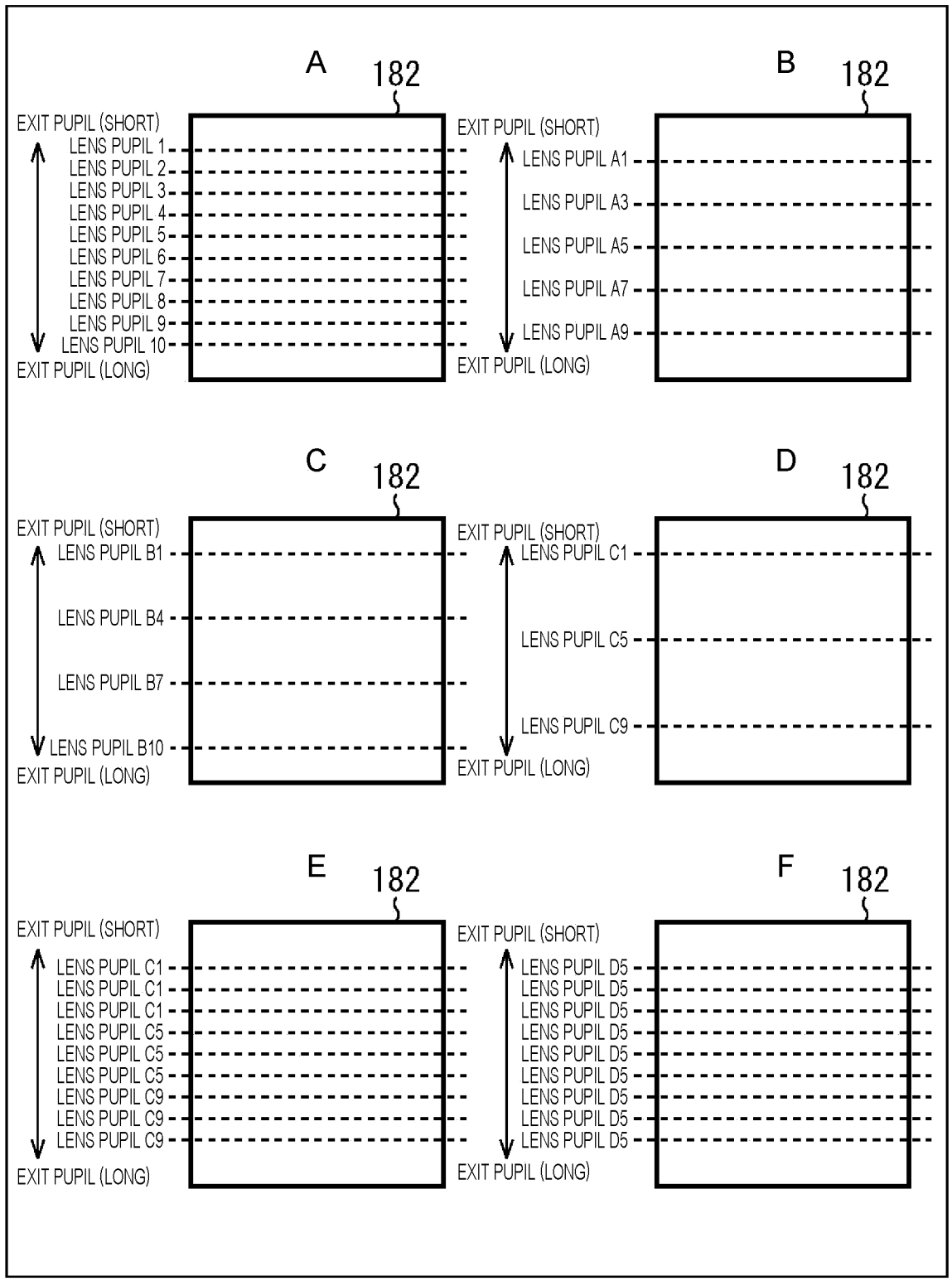
FIG. 34 is a diagram describing an example of arrangement of a phase difference pixel.

FIG. 34 illustrates an example of arrangement of phase difference pixels 100P included in one AF area 182 inside the imaging region 181.

In A of FIG. 34 to F of FIG. 34, a plurality of pixels 100 are two-dimensionally arranged in one AF area 182 in a matrix shape, and among the plurality of the pixels 100 arranged in a matrix shape, the row of pixels where the phase difference pixels 100P (any one of 100PA and 100PB) are arranged is indicated by a broken line. In addition, the entire pixels of the row of pixels indicated by the broken line may be the phase difference pixels 100P, or an arrangement method where the phase difference pixels 100P are arranged every several pixels in the row of pixels indicated by the broken line may be used.

The phase difference pixel 100P according to the present disclosure is compared with, for example, a phase difference pixel (hereinafter, referred to as a reference phase difference pixel) in a structure where the right or left half of a light reception region of a photodiode PD formed in the silicon layer is shielded by a light shielding film.

In the case of employing the reference phase difference pixel as a structure of the phase difference pixel, for example, as illustrated in A of FIG. 34, there has been need to classify the lens types of the interchangeable-lens camera into ten steps ranging from "lens pupil 1" to "lens pupil 10" and to arrange the phase difference pixels where pupil division is performed so as to correspond to each lens type in one AF area 182. With respect to the "lens pupil 1" to "lens pupil 10", as the lens type goes in the order of "lens pupil 1", "lens pupil 2", "lens pupil 3", . . . , the exit pupil distance of the image forming lens is increased.

On the contrary, by employing the phase difference pixel 100P according to the present disclosure as the structure of the phase difference pixel, for example, as illustrated in B of FIG. 34, the lens types of the interchangeable-lens camera may be classified into five steps of "lens pupil A1", "lens pupil A3", "lens pupil A5", "lens pupil A7", and "lens pupil A9", and the phase difference pixels 100P where pupil division is performed so as to correspond to each of the image forming lenses are arranged in one AF area 182.

Herein, the "lens pupil A1" is a lens type which covers for example, the "lens pupil 1" and the "lens pupil 2" in A of FIG. 34, the lens pupil A3" is a lens type which covers for example, the "lens pupil 3" and the "lens pupil 4" in A of FIG. 34, the lens pupil A5" is a lens type which covers for example, the "lens pupil 5" and the "lens pupil 6" in A of FIG. 34, the lens pupil A7" is a lens type which covers for example, the "lens pupil 7" and the "lens pupil 8" in A of FIG. 34, and the lens pupil A9" is a lens type which covers for example, the "lens pupil 9" and the "lens pupil 10" in A of FIG. 34.

Therefore, in this example, in comparison with the case of employing the reference phase difference pixel, since the phase difference pixels 100P includes a plurality of the photoelectric conversion portions of which the light-condensed spot diameters are different, the number of arranged phase difference pixels 100P can be reduced to ½.

In addition, since the light-condensed spot diameter of the G photoelectric conversion portion in the phase difference pixel 100P is increased, namely, since the range of the incident angle where the sensitivity is linearly changed is increased, for example, as illustrated in C of FIG. 34, the lens types of the interchangeable-lens camera may be classified into four steps of "lens pupil B1", "lens pupil B4", "lens pupil B7", and "lens pupil B10", or as illustrated in D of FIG. 34, the lens types of the interchangeable-lens camera may be classified into three steps of "lens pupil C1", "lens pupil C5", and "lens pupil C9".

As illustrated in C of FIG. 34, in a case where the lens types are classified into four steps of "lens pupil B1", "lens pupil B4", "lens pupil B7", and "lens pupil B10", in comparison with the case of employing the reference phase difference pixel, the number of arranged phase difference pixels 100P can be reduced to ⅖. In addition, as illustrated in D of FIG. 34, in a case where the lens types of the interchangeable-lens camera are classified into three steps of "lens pupil C1", "lens pupil C5", and "lens pupil C9", in comparison with the case of employing the reference phase difference pixel, the number of arranged phase difference pixels 100P can be reduced to ³⁄₁₀.

However, as the range of incident angle where the sensitivity is linearly changed is widened and the slope of the sensitivity change is gentle, the light separation performance is deteriorated. Therefore, as illustrated in, for example, E of FIG. 34 and F of FIG. 34, a plurality of rows of the phase difference pixels 100P corresponding to the same lens type are arranged, and addition signals of the plurality of rows of the phase difference pixels 100P corresponding to the same lens type are used for detection of the phase difference, so that it is also possible to improve focus detection accuracy.

E of FIG. 34 illustrates an example where the lens types are classified into three steps of "lens pupil C1", "lens pupil C5", and "lens pupil C9" and the number of arranged phase difference pixels 100P corresponding to one lens type is increased three times.

of FIG. 34 illustrates an example where the lens type is configured with only one type ("lens pupil D5") capable of coping with all the image forming lenses 92 and the number of arranged phase difference pixels 100P is increased ten times.

16. Focus Control Process

Figure 35:
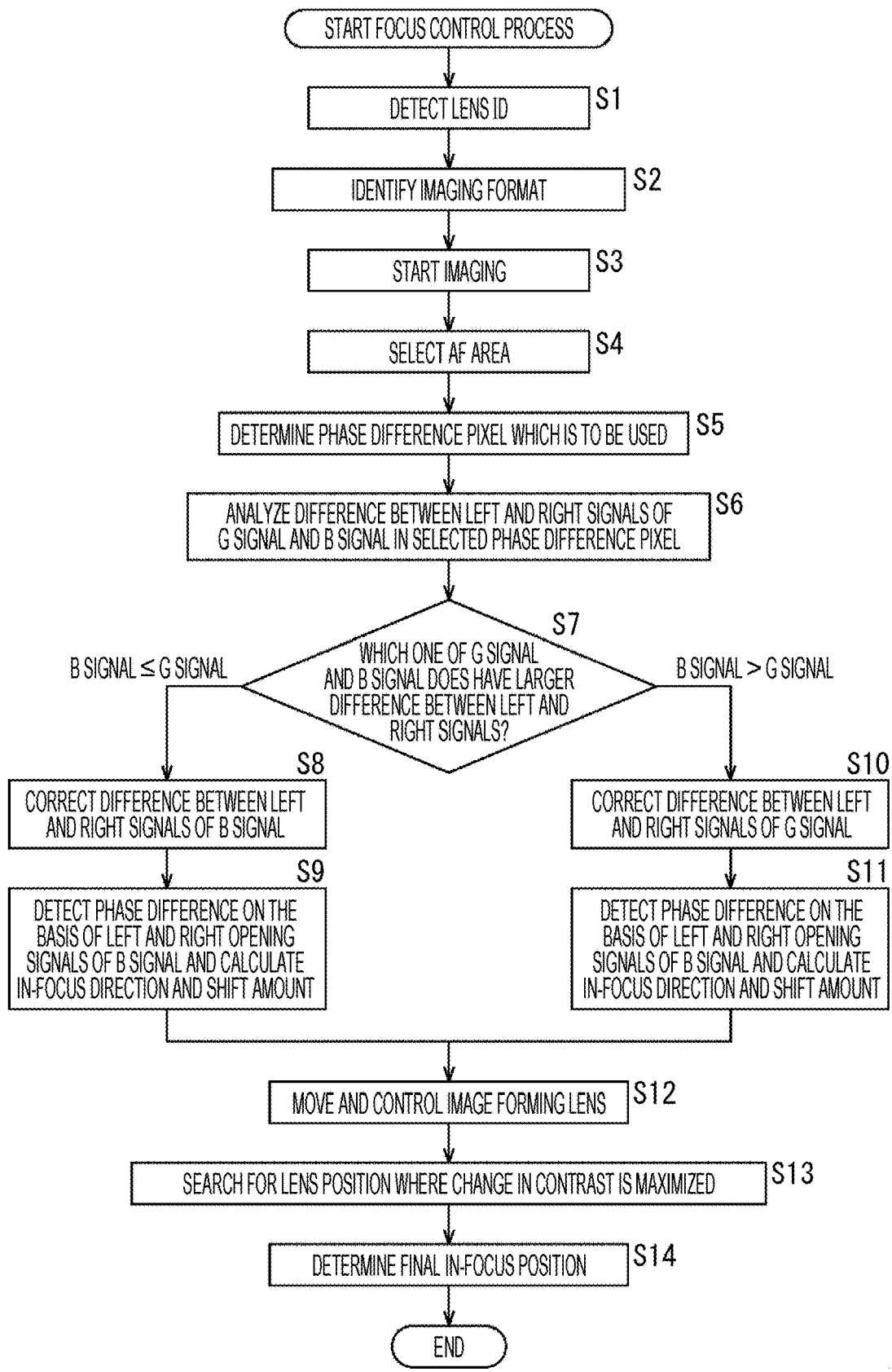
FIG. 35 is a flowchart describing a focus control process.

A focus control process performed by the imaging device 90 where the solid-state imaging device 1 according to the second embodiment is mounted as the solid-state imaging device 94 of FIG. 25 will be described with reference to a flowchart of FIG. 35.

First, in step S1, the control circuit 95 detects lens ID identifying the mounted optical unit 91 (image forming lens 92 thereof) from the optical unit 91.

In step S2, the control circuit 95 identifies an imaging format set by a user. The user can set the imaging format by selecting, for example, a high-resolution 4K format where the number of pixels is about 4000×about 2000 (horizontal direction×vertical direction), an HD format where the number of pixels is about 2000×about 1000 (horizontal direction×vertical direction), or the like.

In step S3, the control circuit 95 drives the solid-state imaging device 94 to start imaging.

In step S4, the control circuit 95 selects a predetermined AF area from the AF areas 182 obtained by dividing the imaging region 181 (FIG. 33) by a predetermined number. For example, the AF area may be selected on the basis of the AF area indicated by the user or may be selected on the basis of features of the captured image such as an AF area including a face. In addition, all AF areas 182 corresponding to the entire imaging region 181 may also be selected.

In step S5, the control circuit 95 determines the phase difference pixel 100P which is to be used for focus detection on the basis of the detected lens ID and the selected AF area. For example, in a case where the phase difference pixels 100P of three types of pupil division of the "lens pupil C1", the "lens pupil C5", and the "lens pupil C9" illustrated in D of FIG. 34 corresponding to the detected lens ID are arranged in the selected AF area 182, the control circuit 95 determines the phase difference pixel 100P of any one of the "lens pupil C1", the "lens pupil C5", and the "lens pupil C9" as the phase difference pixel 100P used for focus detection on the basis of the detected lens ID.

In step S6, the control circuit 95 analyzes the difference between the left and right signals of the G signal and the B signal in the selected phase difference pixel 100P. Namely, the control circuit 95 acquires the left opening signal and the right opening signal in the two phase difference pixels 100PA and 100PB constituting a pair of pixels with respect to the G signal having a large light-condensed spot diameter of incident light and the B signal having a small light-condensed spot diameter of incident light and calculates a signal difference (level difference) between the left opening signal and the right opening signal.

In step S7, since the signal having a smaller difference between the left and right signals among the G signal and the B signal is used for detecting the phase difference, the control circuit 95 determines which one of the G signal and B signal has a larger difference between the left and right signals.

In a case where it is determined in step S7 that the difference between the left and right signals of the B signal is equal to or smaller than the difference between the left and right signals of the G signal, the process proceeds to step S8, and the control circuit 95 corrects the difference between the left and right signals of the B signal so that the difference between the left and right signals of the B signal is at the same level.

In step S9, the control circuit 95 detects the phase difference on the basis of the left and right opening signals of the B signal of which difference between the left and right signals is corrected and calculates an in-focus direction and a shift amount. As illustrated in E of FIG. 34 or F of FIG. 34, in a case where plural rows of the lens types corresponding to the detected lens ID are arranged, the control circuit 95 detects the phase difference on the basis of the left and right opening signals obtained by adding the plural rows of signals with respect to the left opening signal and the right opening signal. By doing so, it is possible to improve phase difference detection accuracy.

On the other hand, in a case where it is determined in step S7 that the difference between the left and right signals of the B signal is larger than the difference between the left and right signals of the G signal, the process proceeds to step S10, and the control circuit 95 corrects the difference between the left and right signals of the G signal so that the difference between the left and right signals of the G signal is at the same level.

In step 511, the control circuit 95 detects the phase difference on the basis of the left and right opening signals of the G signal of which difference between the left and right signals is corrected and calculates an in-focus direction and a shift amount. As illustrated in E of FIG. 34 or F of FIG. 34, in a case where plural rows of the lens types corresponding to the detected lens ID are arranged, the control circuit 95 detects the phase difference on the basis of the left and right opening signals obtained by adding the plural rows of signals with respect to the left opening signal and the right opening signal. By doing so, it is possible to improve phase difference detection accuracy.

After step S9 or step S11, in step S12, the control circuit 95 controls the movement of the image forming lens 92 on the basis of the calculated in-focus direction and shift amount. Namely, the control circuit 95 moves the image forming lens 92 by the calculated shift amount in the calculated in-focus direction.

In the case of performing auto-focusing according to a contrast method in addition to the phase difference auto-focusing, as step S13, the control circuit 95 searches for the lens position where the change in contrast of the captured image is maximized by slightly moving the image forming lens 92 forward and backward with reference to the lens position after the adjustment by the phase difference detection. In a case where the auto-focusing according to the contrast method is not performed, the process of step S13 is omitted.

Then, in step S14, the control circuit 95 determines a final in-focus position and ends the process. In a case where the auto-focusing according to the contrast method is performed, the lens position where the change in contrast of the captured image is maximized is determined as the final in-focus position. In a case where the auto-focusing according to the contrast method is not performed, the lens position to which the image forming lens 92 is moved by the process of step S12 is determined as the final in-focus position.

As described above, according to the focus control process, since the solid-state imaging device 94 (solid-state imaging device 1 according to the second embodiment) of the imaging device 90 can acquire plural types of phase difference signals (G signals and B signals) of which spot diameters are different, the phase difference can be detected by selecting an optimal phase difference signal among the phase difference signals.

In addition, according to the above-described focus control process, described is the example where the signal having a smaller difference between the left and right signals among the G signal and the B signal is used as the phase difference detection signal. However, the region in the vicinity of the center of the imaging region 181, in other words, the region which is close to the center of the optical axis and where the image height is low is not easily influenced by the difference of the image forming lens 92. Therefore, in a case where the selected AF area corresponds to the center region of the imaging region 181, the B signal having a high degree of light separation may be always allowed to be used, and in a case where the selected AF area corresponds to the peripheral region of the imaging region 181, the signal having a smaller difference between the left and right signals among the G signal and the B signal may be allowed to be used as the phase difference detection signal.

In addition, instead of using only one signal of the G signal and the B signal, a signal obtained by combining the G signal and a B signal at a predetermined ratio may be used as the phase difference detection signal. In this case, the combining ratio may be, for example, a value predefined for every selected AF area, a value according to the distance from the center of the imaging region 181 to the phase difference pixel 100P, or the like.

17. Substrate Configuration Example of Solid-State Imaging Device

Figure 36:
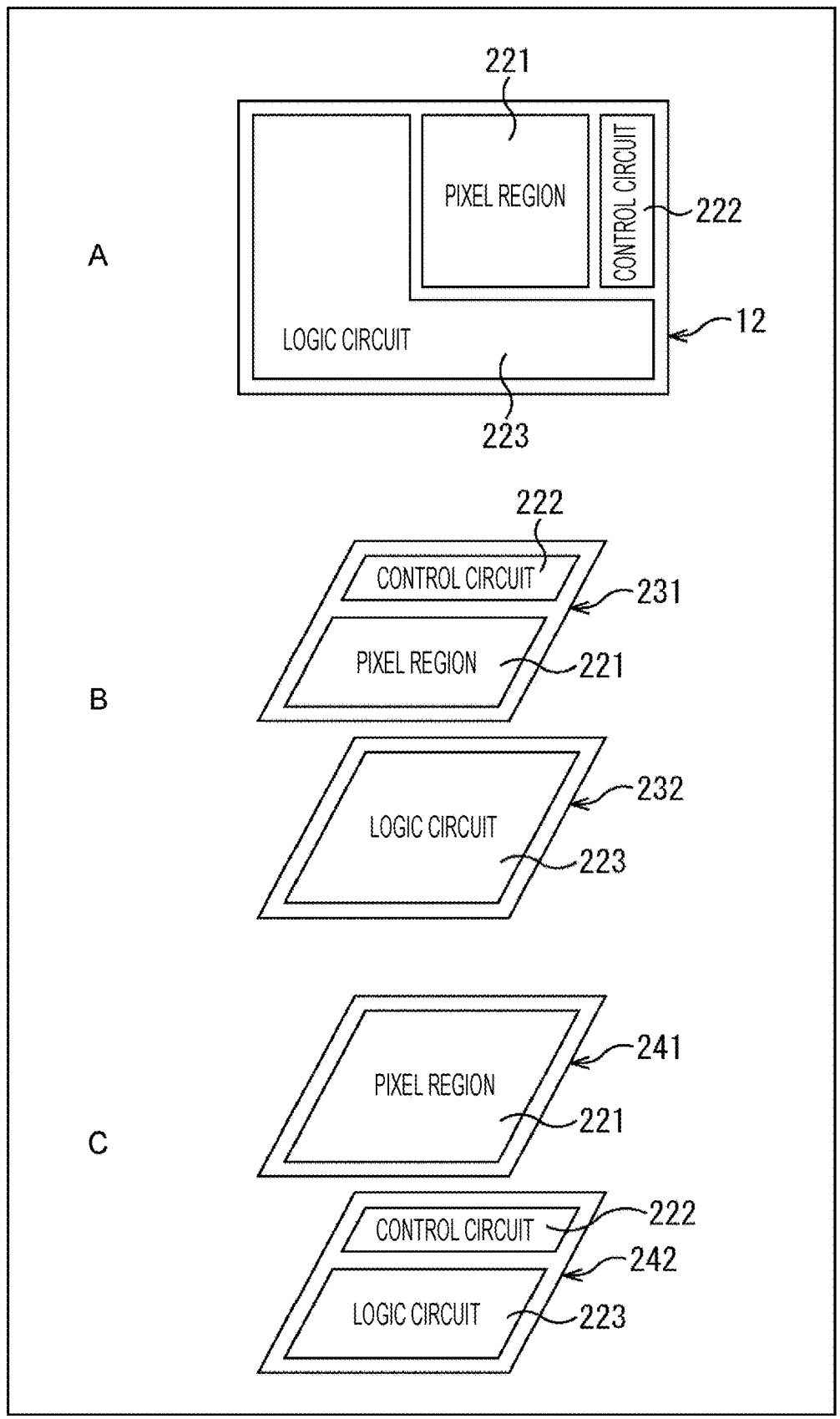
FIG. 36 is a diagram describing a substrate configuration example of a solid-state imaging device.

As illustrated in A of FIG. 36, the solid-state imaging device 1 of FIGS. 1 and 26 is configured so that a pixel region 221 where a plurality of pixels 2 or pixels 100 are arranged, a control circuit 222 which controls the pixels 2 or the pixels 100, and a logic circuit 223 which includes a signal processing circuit for pixel signals are formed on one semiconductor substrate 12.

However, as illustrated in B of FIG. 36, the solid-state imaging device 1 may be formed in a stacked structure where a first semiconductor substrate 231 where a pixel region 221 and a control circuit 222 are formed and a second semiconductor substrate 232 where a logic circuit 223 is formed are stacked. The first semiconductor substrate 231 and the second semiconductor substrate 232 are electrically connected to each other, for example, by a through-via or metal bonding of Cu—Cu.

In addition, as illustrated in C of FIG. 36, the solid-state imaging device 1 may be formed in a stacked structure where a first semiconductor substrate 241 where only a pixel region 221 is formed and a second semiconductor substrate 242 where a control circuit 222 and a logic circuit 223 are formed are stacked. The first semiconductor substrate 241 and the second semiconductor substrate 242 are electrically connected to each other, for example, by a through-via or metal bonding of Cu—Cu.

In any substrate configuration of A of FIG. 36 to C of FIG. 36, by using the configuration according to each embodiment as the solid-state imaging device 1, it is possible to improve phase difference detection accuracy. Therefore, with respect to the imaging device 90 such as a video camera, a digital still camera, and a camera module for a mobile device such as a mobile phone, it is possible to obtain a captured image with a high image quality.

In the above-described examples, the solid-state imaging devices where the first conductive type is set as a P type, the second conductive type is set as an N type, and electrons are set as signal charges are described. However, the technique according to the present disclosure may be applied to solid-state imaging device where holes are set as signal charges. Namely, by setting the first conductive type as an N type and setting the second conductive type as a P type, the above-described semiconductor regions may be configured as the semiconductor regions having the opposite conductive types.

The embodiments according to the present disclosure are not limited to the above-described embodiments, but various changes are available within the scope without departing from the spirit of the present disclosure.

For example, a mode as a combination of a portion of or all the plurality of the embodiments described above may be employed.

In addition, the effects disclosed in the specification are exemplary but not limitative, and thus, there may be effects other than the effects disclosed in the specification.

In addition, the present disclosure may have the following configurations.

(1) A solid-state imaging device including a pixel including a photoelectric conversion portion having a structure where a photoelectric conversion film is interposed by an upper electrode on the photoelectric conversion film and a lower electrode under the photoelectric conversion film,
wherein the upper electrode is divided into a first upper electrode and a second upper electrode.

(2) The solid-state imaging device according to (1), wherein different voltages are applied to the first upper electrode and the second upper electrode.

(3) The solid-state imaging device according to (2), wherein the different voltages are a first voltage allowing charges to be generated in the photoelectric conversion film and a second voltage allowing charges not to be generated in the photoelectric conversion film.

(4) The solid-state imaging device according to (3), wherein, after the first voltage is applied to the first upper electrode and the second voltage is applied to the second upper electrode, the first voltage is applied to the second upper electrode and the second voltage is applied to the first upper electrode.

(5) The solid-state imaging device according to (3), wherein the second voltage is controlled so that a potential difference with respect to the lower electrode is constant.

(6) The solid-state imaging device according to any of (1) to (5),
wherein a voltage for allowing charges to be generated in the photoelectric conversion film is applied to the first upper electrode and the second upper electrode, and
signals are output from the photoelectric conversion portions interposed by the first upper electrode and the lower electrode and by the second upper electrode and the lower electrode.

(7) The solid-state imaging device according to (6), wherein at least one of a first signal output from the photoelectric conversion portion interposed by the first upper electrode and the lower electrode and a second signal output from the photoelectric conversion portion interposed by the second upper electrode and the lower electrode is used as a phase difference signal.

(8) The solid-state imaging device according to any of (1) to (7), wherein the pixel is a portion of pixels which are two-dimensionally arranged in a pixel array portion in a matrix shape.

(9) The solid-state imaging device according to any of (1) to (8), wherein the pixels are the entire pixels which are two-dimensionally arranged in a pixel array portion in a matrix shape.

(10) The solid-state imaging device according to any of (1) to (9), wherein the lower electrode also faces the first upper electrode and the second upper electrode and is divided into a first lower electrode and a second lower electrode.

(11) The solid-state imaging device according to (10), wherein the pixel includes a first charge retaining portion connected to the first lower electrode and a second charge retaining portion connected to the second lower electrode.

(12) The solid-state imaging device according to (11), wherein the pixel includes a charge combining portion which combines charges retained in the first charge retaining portion and charges retained in the second charge retaining portion.

(13) The solid-state imaging device according to (12), wherein the pixel includes switch elements between the first charge retaining portion and the charge combining portion and between the second charge retaining portion and the charge combining portion.

(14) The solid-state imaging device according to any of (1) to (8), wherein any one of the first upper electrode and the second upper electrode is formed so as to extend over an adjacent pixel.

(15) The solid-state imaging device according to any of (1) to (14), wherein the photoelectric conversion portion photoelectrically converts predetermined color light.

(16) The solid-state imaging device according to (15), wherein the photoelectric conversion portion is formed outside the semiconductor substrate, and another photoelectric conversion portion photoelectrically converting light of color different from color which the photoelectric conversion portion photoelectrically converts is further included inside the semiconductor substrate.

(17) The solid-state imaging device according to any of (1) to (16), wherein the photoelectric conversion portion photoelectrically converts light which passes through a color filter.

(18) The solid-state imaging device according to any of (1) to (17), wherein the first upper electrode and the second upper electrode are formed so as to be symmetric with respect to an optical axis.

(19) A method for driving a solid-state imaging device including a pixel including a photoelectric conversion portion having a structure where a photoelectric conversion film is interposed by an upper electrode on the photoelectric conversion film and a lower electrode under the photoelectric conversion film, the upper electrode being divided into a first upper electrode and a second upper electrode, the solid-state imaging device applying different voltages to the first upper electrode and the second upper electrode.

(20) An electronic device including a solid-state imaging device including a pixel including a photoelectric conversion portion having a structure where a photoelectric conversion film is interposed by an upper electrode on the photoelectric conversion film and a lower electrode under the photoelectric conversion film, the upper electrode being divided into a first upper electrode and a second upper electrode.

(B1) A solid-state imaging device including a first photoelectric conversion portion and a second photoelectric conversion portion of which positions in a height direction in a pixel are different,
wherein at least one of the first photoelectric conversion portion and the second photoelectric conversion portion is formed outside a semiconductor substrate, and
each of the first photoelectric conversion portion and the second photoelectric conversion portion outputs a phase difference signal.

(B2) The solid-state imaging device according to (B1), wherein the first photoelectric conversion portion and the second photoelectric conversion portion are different in light-condensed spot diameter of incident light.

(B3) The solid-state imaging device according to (B1) or (B2), wherein the first photoelectric conversion portion and the second photoelectric conversion portion are different in a degree of separation of incident light.

(B4) The solid-state imaging device according to any one of (B1) to (B3), wherein the first photoelectric conversion portion is formed outside the semiconductor substrate by a structure where a photoelectric conversion film is interposed by an upper electrode on the photoelectric conversion film and a lower electrode under the photoelectric conversion film.

(B5) The solid-state imaging device according to (B4), wherein an electrode film which is formed in the same layer as that of the lower electrode of the first photoelectric conversion portion and which does not output the phase difference signal is connected to GND.

(B6) The solid-state imaging device according to any one of (B1) to (B3), wherein the first photoelectric conversion portion and the second photoelectric conversion portion are formed outside the semiconductor substrate by a structure where a photoelectric conversion film is interposed by an upper electrode on the photoelectric conversion film and a lower electrode under the photoelectric conversion film.

(B7) The solid-state imaging device according to (B4) or (B6), wherein the lower electrode is formed in a region which is asymmetric with respect to an optical axis of the incident light.

(B8) The solid-state imaging device according to (B7), wherein the upper electrode is formed in a region facing the lower electrode.

(B9) The solid-state imaging device according to (B7) or (B8), wherein the photoelectric conversion film is formed in a region facing the lower electrode.

(B10) The solid-state imaging device according to (B4) or (B5), wherein the second photoelectric conversion portion is formed in the semiconductor substrate.

(B11) The solid-state imaging device according to (B10), wherein a charge generation region of the second photoelectric conversion portion becomes a region which is asymmetric with respect to an optical axis of the incident light by a light shielding film.

(B12) The solid-state imaging device according to any one of (B1) to (B11), further including a third photoelectric conversion portion in the pixel.

(B13) A signal processing method for a solid-state imaging device including a first photoelectric conversion portion and a second photoelectric conversion portion of which positions in a height direction in a pixel are different, at least one of the first photoelectric conversion portion and the second photoelectric conversion portion being formed outside a semiconductor substrate, the signal processing method including selecting at least one of phase difference signals output from the first photoelectric conversion portion and the second photoelectric conversion portion and detecting a phase difference.

(B14) An electronic device including a solid-state imaging device,
wherein the solid-state imaging device includes a first photoelectric conversion portion and a second photoelectric conversion portion of which positions in a height direction in a pixel are different,
at least one of the first photoelectric conversion portion and the second photoelectric conversion portion is formed outside a semiconductor substrate, and each of the first photoelectric conversion portion and the second photoelectric conversion portion outputs a phase difference signal.

REFERENCE SIGNS LIST

1 Solid-state imaging device
2 Pixel
2X Normal pixel
2P Phase difference pixel
3 Pixel array portion
4 Vertical driver circuit
5 Column signal processing circuit
7 Output circuit
12 Semiconductor substrate
45b, 45c Charge retaining portion
52, 52A Photoelectric conversion film
53 (53a to 53c) Lower electrode
54 (54a to 54d) Upper electrode
61 Control wire line
63b, 63c MOS transistor
64 Charge combining portion
81 Color filter
90 Imaging device
91 Optical unit
92 Image forming lens
94 Solid-state imaging device
95 Control circuit
96 Signal processing circuit
100 Pixel
100X Normal pixel
100P Phase difference pixel
111 Semiconductor region
112, 113 Semiconductor region
PD1, PD2 Photodiode
134, 134A Lower electrode
135, 135A Photoelectric conversion film
136, 136A Upper electrode
132C, 132Q Light shielding film
161A Lower electrode
162 Photoelectric conversion film
163 Upper electrode

The invention claimed is:

1. A light detecting device, comprising:
a first photoelectric conversion portion and a second photoelectric conversion portion of which positions in a height direction in a pixel are different,
wherein at least one of the first photoelectric conversion portion and the second photoelectric conversion portion is formed outside a semiconductor substrate,
wherein each of the first photoelectric conversion portion and the second photoelectric conversion portion outputs a phase difference signal,
wherein the first photoelectric conversion portion is formed outside the semiconductor substrate by a structure where a photoelectric conversion film is interposed by an upper electrode on the photoelectric conversion film and a lower electrode under the photoelectric conversion film, and
wherein an electrode film which is formed in the same layer as that of the lower electrode of the first photoelectric conversion portion and which does not output the phase difference signal is connected to ground.

2. The light detecting device according to claim 1, wherein the first photoelectric conversion portion and the second photoelectric conversion portion are different in light-condensed spot diameter of incident light.

3. The light detecting device according to claim 1, wherein the first photoelectric conversion portion and the second photoelectric conversion portion are different in a degree of separation of incident light.

4. The light detecting device according to claim 1, wherein the first photoelectric conversion portion and the second photoelectric conversion portion are formed outside the semiconductor substrate by a structure where a photoelectric conversion film is interposed by an upper electrode on the photoelectric conversion film and a lower electrode under the photoelectric conversion film.

5. The light detecting device according to claim 1, wherein the second photoelectric conversion portion is formed in the semiconductor substrate.

6. The light detecting device according to claim 5, wherein a charge generation region of the second photoelectric conversion portion becomes a region which is asymmetric with respect to an optical axis of the incident light by a light shielding film.

7. The light detecting device according to claim 1, further comprising a third photoelectric conversion portion in the pixel.

8. A light detecting device, comprising:
a first photoelectric conversion portion and a second photoelectric conversion portion of which positions in a height direction in a pixel are different,
wherein at least one of the first photoelectric conversion portion and the second photoelectric conversion portion is formed outside a semiconductor substrate,
wherein each of the first photoelectric conversion portion and the second photoelectric conversion portion outputs a phase difference signal,
wherein the first photoelectric conversion portion is formed outside the semiconductor substrate by a structure where a photoelectric conversion film is interposed by an upper electrode on the photoelectric conversion film and a lower electrode under the photoelectric conversion film, and
wherein the lower electrode is formed in a region which is asymmetric with respect to an optical axis of the incident light.

9. The light detecting device according to claim 8, wherein the upper electrode is formed in a region facing the lower electrode.

10. The light detecting device according to claim 8, wherein the photoelectric conversion film is formed in a region facing the lower electrode.

11. The light detecting device according to claim 8, wherein the first photoelectric conversion portion and the second photoelectric conversion portion are different in light-condensed spot diameter of incident light.

12. The light detecting device according to claim 8, wherein the first photoelectric conversion portion and the second photoelectric conversion portion are different in a degree of separation of incident light.

13. A signal processing method for a light detecting device including a first photoelectric conversion portion and a second photoelectric conversion portion of which positions in a height direction in a pixel are different,
wherein at least one of the first photoelectric conversion portion and the second photoelectric conversion portion being formed outside a semiconductor substrate,
wherein the first photoelectric conversion portion is formed outside the semiconductor substrate by a structure where a photoelectric conversion film is interposed by an upper electrode on the photoelectric conversion film and a lower electrode under the photoelectric conversion film, wherein an electrode film which is formed in the same layer as that of the lower electrode of the first photoelectric conversion portion and which does not output a phase difference signal is connected to ground, and wherein the signal processing method comprising:

selecting at least one of phase difference signal output from the first photoelectric conversion portion and the second photoelectric conversion portion and detecting a phase difference.

14. An electronic device, comprising:
a light detecting device, comprising:
a first photoelectric conversion portion and a second photoelectric conversion portion of which positions in a height direction in a pixel are different,
wherein at least one of the first photoelectric conversion portion and the second photoelectric conversion portion is formed outside a semiconductor substrate,
wherein each of the first photoelectric conversion portion and the second photoelectric conversion portion outputs a phase difference signal,
wherein the first photoelectric conversion portion is formed outside the semiconductor substrate by a structure where a photoelectric conversion film is interposed by an upper electrode on the photoelectric conversion film and a lower electrode under the photoelectric conversion film, and
wherein an electrode film which is formed in the same layer as that of the lower electrode of the first photoelectric conversion portion and which does not output the phase difference signal is connected to ground.

15. The electronic device according to claim 14, wherein the first photoelectric conversion portion and the second photoelectric conversion portion are different in light-condensed spot diameter of incident light.

16. The electronic device according to claim 14, wherein the first photoelectric conversion portion and the second photoelectric conversion portion are different in a degree of separation of incident light.

17. The electronic device according to claim 14, wherein the first photoelectric conversion portion and the second photoelectric conversion portion are formed outside the semiconductor substrate by a structure where a photoelectric conversion film is interposed by an upper electrode on the photoelectric conversion film and a lower electrode under the photoelectric conversion film.

18. An electronic device, comprising:
a light detecting device, comprising:
a first photoelectric conversion portion and a second photoelectric conversion portion of which positions in a height direction in a pixel are different,
wherein at least one of the first photoelectric conversion portion and the second photoelectric conversion portion is formed outside a semiconductor substrate,
wherein each of the first photoelectric conversion portion and the second photoelectric conversion portion outputs a phase difference signal,
wherein the first photoelectric conversion portion is formed outside the semiconductor substrate by a structure where a photoelectric conversion film is interposed by an upper electrode on the photoelectric conversion film and a lower electrode under the photoelectric conversion film, and wherein the lower electrode is formed in a region which is asymmetric with respect to an optical axis of the incident light.

19. The electronic device according to claim 18, wherein the first photoelectric conversion portion and the second photoelectric conversion portion are different in light-condensed spot diameter of incident light.

20. The electronic device according to claim 18, wherein the first photoelectric conversion portion and the second photoelectric conversion portion are different in a degree of separation of incident light.

* * * * *